United States Patent
Kawabata et al.

(10) Patent No.: US 10,205,894 B2
(45) Date of Patent: Feb. 12, 2019

(54) IMAGING DEVICE AND IMAGING SYSTEM

(71) Applicant: CANON KABUSHIKI KAISHA, Tokyo (JP)

(72) Inventors: Kazunari Kawabata, Kawasaki (JP); Takeshi Ichikawa, Hachioji (JP); Masahiro Kobayashi, Tokyo (JP); Yusuke Onuki, Fujisawa (JP); Hiroshi Sekine, Kawagoe (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 51 days.

(21) Appl. No.: 15/226,651

(22) Filed: Aug. 2, 2016

(65) Prior Publication Data

US 2017/0078557 A1 Mar. 16, 2017

(30) Foreign Application Priority Data

Sep. 11, 2015 (JP) .................. 2015-179221
Sep. 11, 2015 (JP) .................. 2015-179224

(51) Int. Cl.
 *H04N 5/355* (2011.01)
 *H04N 5/235* (2006.01)
 (Continued)

(52) U.S. Cl.
 CPC ... *H04N 5/35581* (2013.01); *H01L 27/14643* (2013.01); *H04N 5/2353* (2013.01);
 (Continued)

(58) Field of Classification Search
 CPC .............................. H04N 5/355–5/3559; H01L 27/14609–27/14616
 See application file for complete search history.

(56) References Cited

U.S. PATENT DOCUMENTS 7,271,835 B2  9/2007  Iizuka et al.
7,436,343 B2  10/2008  Ichikawa
(Continued)

FOREIGN PATENT DOCUMENTS

JP  2004-111590  4/2004
JP  2006-246450  9/2006

OTHER PUBLICATIONS

U.S. Appl. No. 15/136,017, filed Apr. 22, 2016.
(Continued)

*Primary Examiner* — Paul M Berardesca
(74) *Attorney, Agent, or Firm* — Venable, LLP

(57) ABSTRACT

An imaging device includes pixels including a photoelectric conversion unit, a holding unit holding charge transferred from the photoelectric conversion unit, and an amplifier unit outputting signal based on the charge. The pixels output a first signal based on charge generated in a first exposure period and a second signal based on charge generated in a second exposure period of different length. In the first exposure period, the photoelectric conversion unit accumulates the generated charge, and charge held by the holding unit is transferred to the amplifier unit. The second exposure period includes a period of accumulating the generated charge only in the photoelectric conversion unit and a period of holding the generated charge in the photoelectric conversion unit and the holding unit. In the period of accumulating the generated charge only in the photoelectric conversion unit, the charge held by the holding unit is transferred to the amplifier unit.

9 Claims, 33 Drawing Sheets

(51) Int. Cl.
  *H01L 27/146* (2006.01)
  *H04N 5/3745* (2011.01)
  *H04N 5/232* (2006.01)

(52) U.S. Cl.
  CPC ....... *H04N 5/23212* (2013.01); *H04N 5/3559* (2013.01); *H04N 5/37457* (2013.01)

(56) References Cited

U.S. PATENT DOCUMENTS

| | | | |
|---|---|---|---|
| 7,462,810 | B2 | 12/2008 | Kobayashi |
| 7,687,299 | B2 | 3/2010 | Ichikawa |
| 7,928,477 | B2 | 4/2011 | Kobayashi |
| 7,935,995 | B2 | 5/2011 | Watanabe |
| 7,968,922 | B2 | 6/2011 | Ichikawa |
| 8,045,034 | B2 | 10/2011 | Shibata |
| 8,063,351 | B2 | 11/2011 | Kobayashi |
| 8,115,848 | B2 | 2/2012 | Onuki |
| 8,174,604 | B2 | 5/2012 | Shibata |
| 8,222,682 | B2 | 7/2012 | Watanabe |
| 8,259,206 | B1 | 9/2012 | Shibata |
| 8,289,432 | B2 | 10/2012 | Shibata |
| 8,357,956 | B2 | 1/2013 | Kobayashi |
| 8,427,564 | B2 | 4/2013 | Yamashita |
| 8,456,559 | B2 | 6/2013 | Yamashita |
| 8,552,353 | B2 | 10/2013 | Kobayashi |
| 8,723,232 | B2 | 5/2014 | Kobayashi |
| 8,736,734 | B2 | 5/2014 | Onuki |
| 8,779,544 | B2 | 7/2014 | Yamashita |
| 8,884,391 | B2 | 11/2014 | Fudaba |
| 9,147,708 | B2 | 9/2015 | Okita |
| 9,153,610 | B2 | 10/2015 | Kobayashi |
| 9,276,027 | B2 | 3/2016 | Okita |
| 9,344,653 | B2 | 5/2016 | Shimotsusa |
| 9,419,038 | B2 | 8/2016 | Kobayashi |
| 9,445,026 | B2 | 9/2016 | Kobayashi |
| 2011/0136291 | A1 | 6/2011 | Iwata |
| 2011/0205416 | A1* | 8/2011 | Nishihara ......... H01L 27/14609 348/300 |
| 2013/0206965 | A1 | 8/2013 | Yamashita |
| 2014/0061436 | A1 | 3/2014 | Kobayashi |
| 2015/0222836 | A1 | 8/2015 | Wada |
| 2015/0264283 | A1 | 9/2015 | Kobayashi |
| 2015/0281614 | A1 | 10/2015 | Yoshida |
| 2016/0027825 | A1 | 1/2016 | Moriyama |
| 2016/0071896 | A1 | 3/2016 | Kawabata |
| 2016/0071902 | A1 | 3/2016 | Okita |
| 2016/0155774 | A1 | 6/2016 | Hasegawa |
| 2016/0227139 | A1 | 8/2016 | Shimotsusa |

OTHER PUBLICATIONS

U.S. Appl. No. 15/137,474, filed Apr. 25, 2016.
U.S. Appl. No. 15/163,986, filed May 25, 2016.
U.S. Appl. No. 15/251,341, filed Aug. 30, 2016.
U.S. Appl. No. 15/207,289, filed Jul. 11, 2016.
U.S. Appl. No. 15/237,255, filed Aug. 15, 2016.
U.S. Appl. No. 15/237,272, filed Aug. 15, 2016.

* cited by examiner

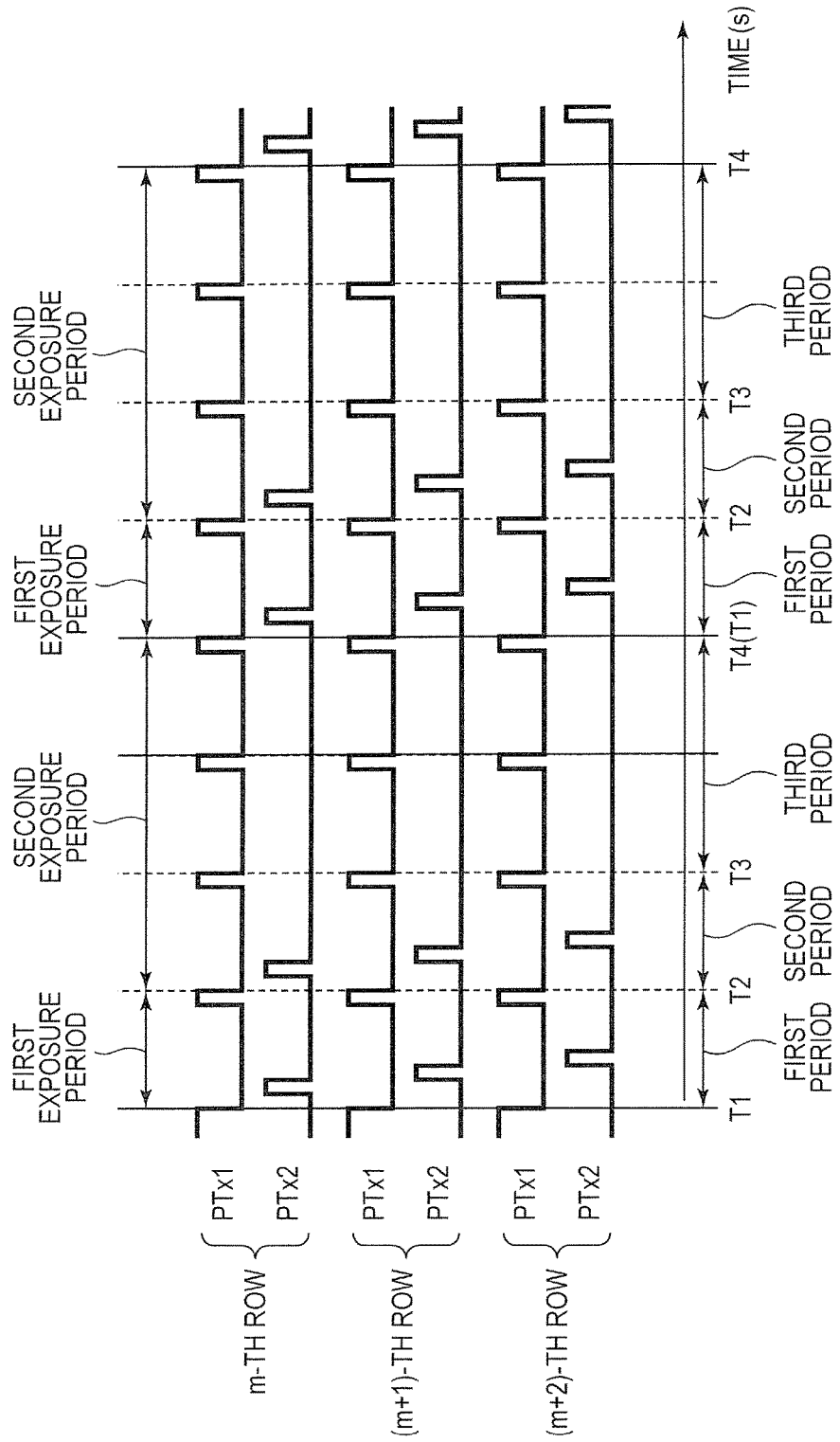

IMAGING DEVICE AND IMAGING SYSTEM

BACKGROUND OF THE INVENTION

Field of the Invention

The present invention relates to an imaging device and an imaging system.

Description of the Related Art

In a CMOS image sensor, imaging by using a global electronic shutter operation is proposed in recent years. An imaging device with a global electronic shutter function is described in Japanese Patent Application Laid-Open No. 2004-111590 and Japanese Patent Application Laid-Open No. 2006-246450. The imaging device with a global electronic shutter function has an advantage that a subject image is unlikely to be distorted even when a subject moving at a high speed is photographed.

More enhanced functions are demanded in the imaging device with a global electronic shutter function, such as an extension of a dynamic range by multiple exposures and an increase in the speed of focus detection on an imaging surface. However, a configuration or a driving method of the imaging device suitable for the enhanced functions is not examined in the conventional imaging device.

In photographing of moving images using the imaging device with the global electronic shutter function, a function of taking images by changing an exposure period in each frame is demanded in some cases in order to handle a change in the luminance of a photographing scene. In such a case, intervals between centers of the exposure periods of the frames are not constant, and an image quality degradation called jerkiness with unnatural motion of a moving subject may occur.

SUMMARY OF THE INVENTION

An object of the present invention is to provide an imaging device and an imaging system that can realize an extension of a dynamic range and an increase in the speed of focus detection in imaging using a function of global electronic shutter. Another object of the present invention is to provide an imaging device and an imaging system that can photograph moving images with excellent quality even when an exposure time is changed in each frame in imaging using a global electronic shutter function.

According to an aspect of the present invention, there is provided an imaging device including a plurality of pixels, each of the plurality of pixels including a photoelectric conversion unit that generates charge by photoelectric conversion, a holding unit that holds the charge transferred from the photoelectric conversion unit, and an amplifier unit that outputs a signal based on the charge transferred from the holding unit, wherein the plurality of pixels is configured to output a first signal based on charge generated in a first exposure period and a second signal based on charge generated in a second exposure period with a length different from the first exposure period, in the first exposure period, the photoelectric conversion unit accumulates the generated charge, and charge held by the holding unit is transferred from the holding unit to the amplifier unit, the second exposure period includes a period of accumulating the generated charge only in the photoelectric conversion unit and a period of holding the generated charge in the photoelectric conversion unit and the holding unit, and in the period of accumulating the generated charge only in the photoelectric conversion unit in the second exposure period, the charge held by the holding unit is transferred from the holding unit to the amplifier unit.

According to another aspect of the present invention, there is provided an imaging device including a plurality of pixels, each of the plurality of pixels including a photoelectric conversion unit that generates charge according to incident light, a holding unit that holds the charge, an amplifier transistor that outputs a signal based on the charge, a first transfer transistor that transfers the charge from the photoelectric conversion unit to the holding unit, and a second transfer transistor that transfers the charge from the holding unit to the amplifier transistor, wherein in a first frame period among a plurality of frame periods of acquiring a plurality of images included in a moving image, charge generated in a first exposure period is accumulated, in a second frame period following the first frame period, charge generated in a second exposure period with a length of a period different from the first exposure period is accumulated, and an interval between a temporal center of the first exposure period and a temporal center of the second exposure period is equal to an interval between a temporal center of the first frame period and a temporal center of the second frame period.

According to further another aspect of the present invention, there is provided an imaging device including a plurality of pixels, each of the plurality of pixels including a photoelectric conversion unit that generates charge according to incident light, a holding unit that holds the charge, an amplifier transistor that outputs a signal based on the charge, a first transfer transistor that transfers the charge from the photoelectric conversion unit to the holding unit, and a second transfer transistor that transfers the charge from the holding unit to the amplifier transistor, wherein in a first frame period among a plurality of frame periods of acquiring a plurality of images included in a moving image, charge generated in a first exposure period is accumulated, a plurality of accumulation operations of accumulating charge generated in respective predetermined periods is performed, the plurality of accumulation operations includes at least a first accumulation operation and a second accumulation operation in which the predetermined periods are different, and temporal centers of the predetermined periods are at constant intervals in the plurality of accumulation operations.

Further features of the present invention will become apparent from the following description of exemplary embodiments with reference to the attached drawings.

BRIEF DESCRIPTION OF THE DRAWINGS

FIG. 4 is a timing chart illustrating the operation of the imaging device according to the first embodiment of the present invention.

DESCRIPTION OF THE EMBODIMENTS

Hereinafter, embodiments of the present invention will be described with reference to the drawings. Obviously, the embodiments according to the present invention are not limited only to the embodiments described below. For example, an example in which part of a configuration of one of the embodiments is added to another embodiment and an example in which part of a configuration of one of the embodiments is replaced by part of a configuration of another embodiment are also embodiments of the present invention.

First Embodiment

Figure 1:
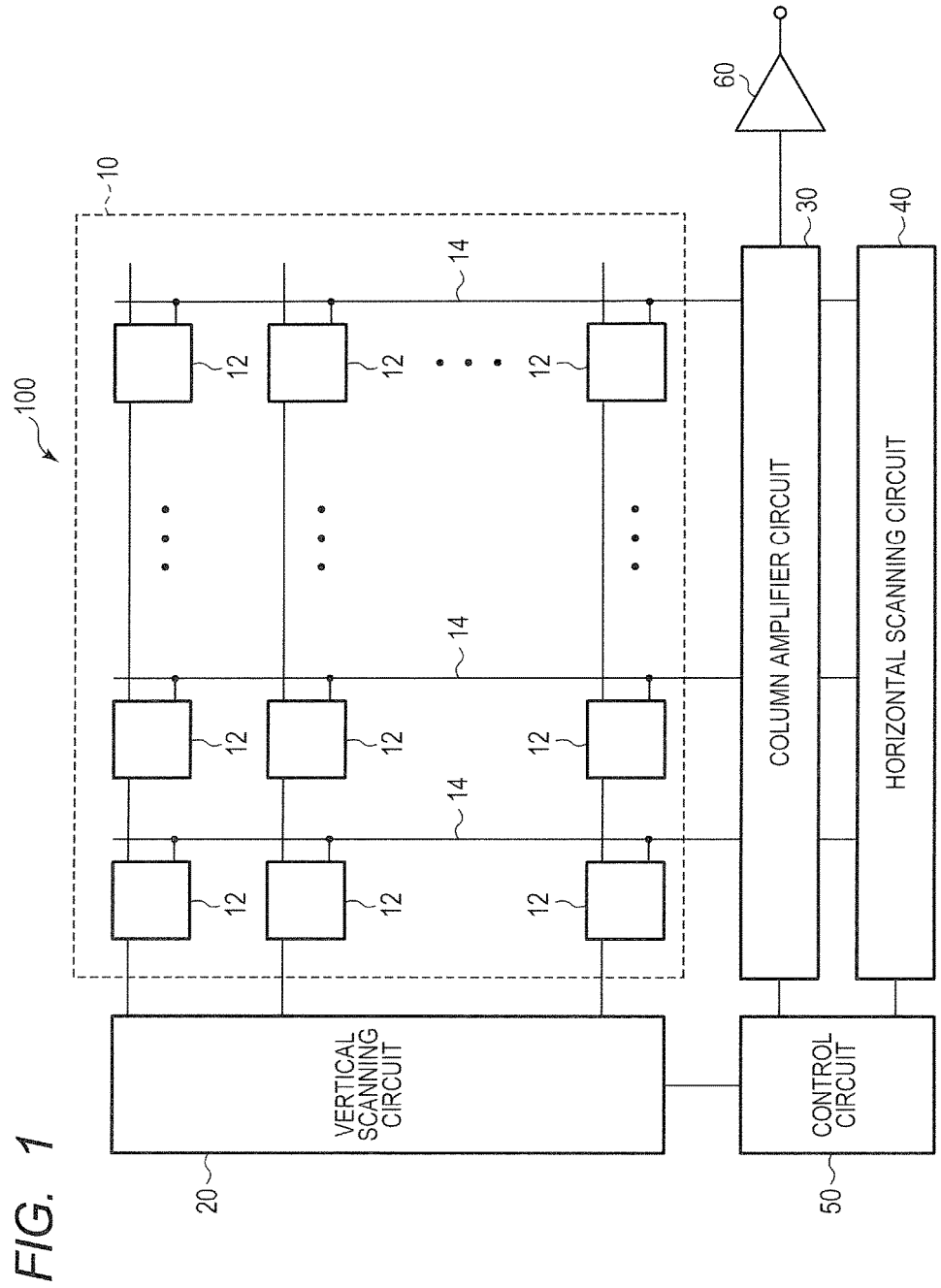
FIG. 1 is a block diagram illustrating a schematic configuration of an imaging device according to a first embodiment of the present invention.
Figure 2:
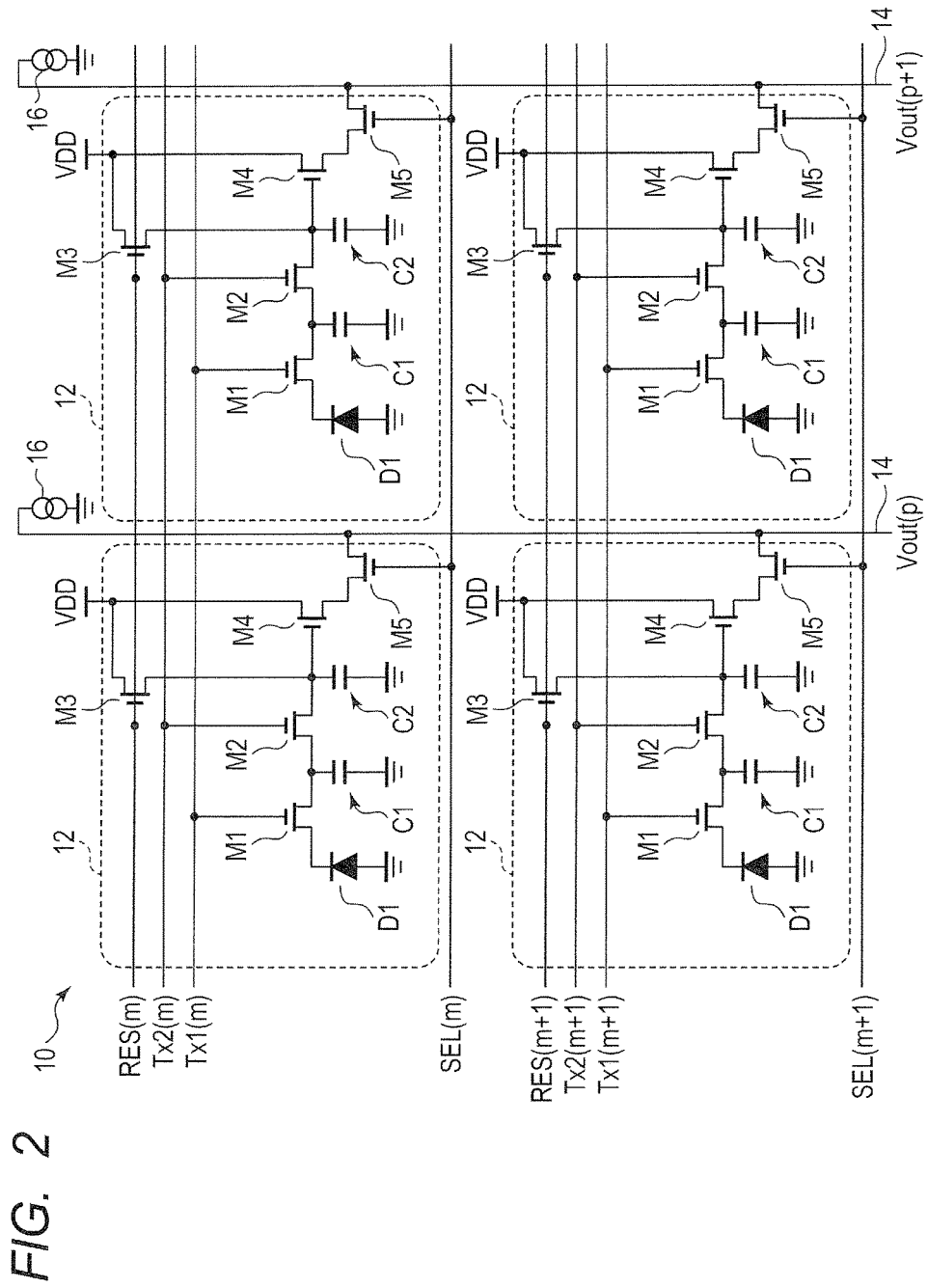
FIG. 2 is a diagram illustrating an example of configuration of a pixel circuit of the imaging device according to the first embodiment of the present invention.
Figure 3:
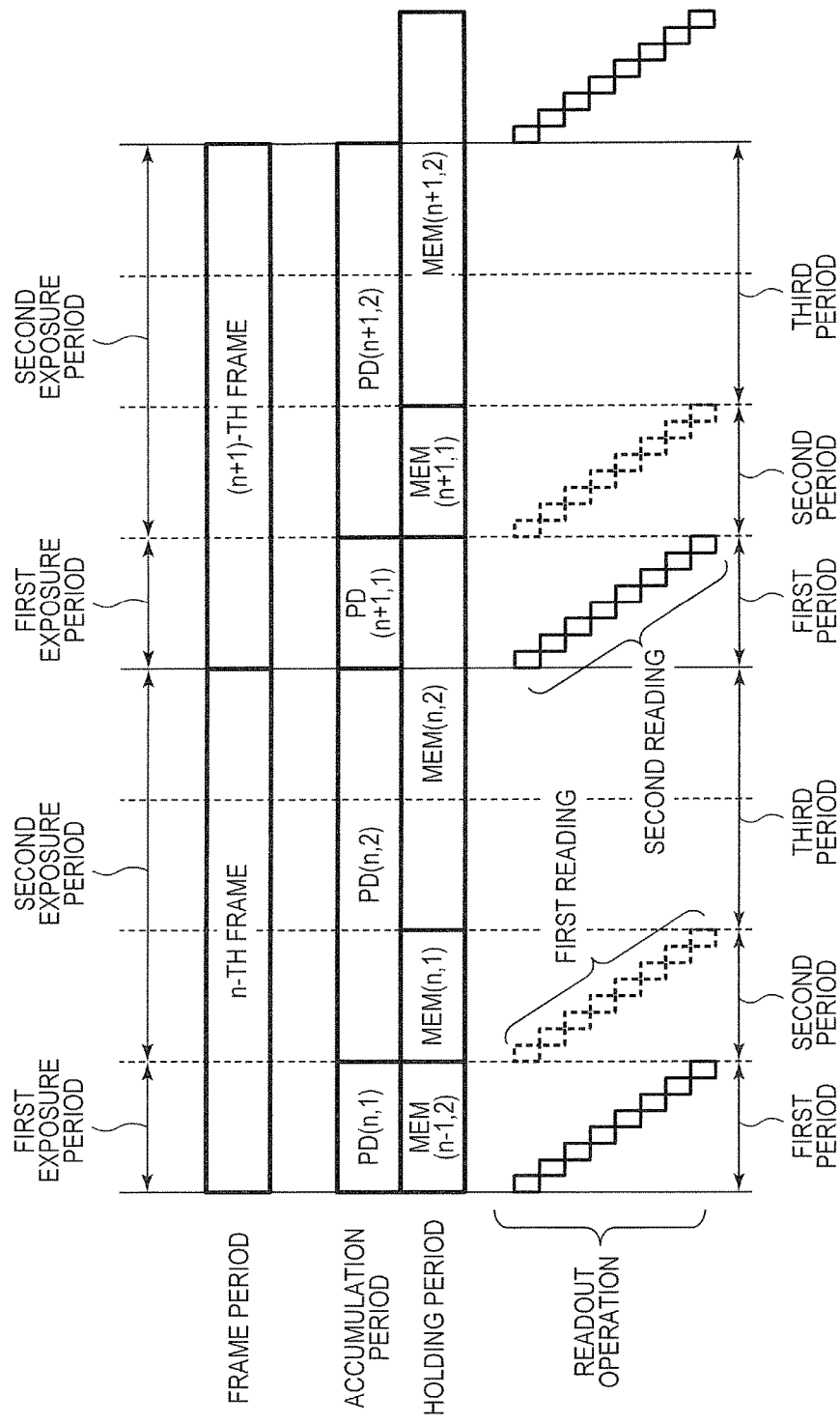
FIG. 3 is a schematic diagram illustrating an operation of the imaging device according to the first embodiment of the present invention.
Figure 5A:
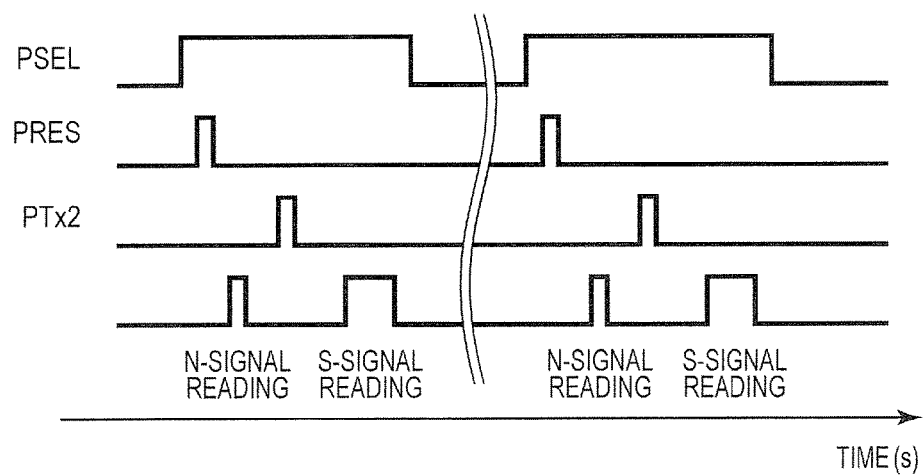
FIGS. 5A and 5B are timing charts illustrating the operation of the imaging device according to the first embodiment of the present invention.
Figure 5B:
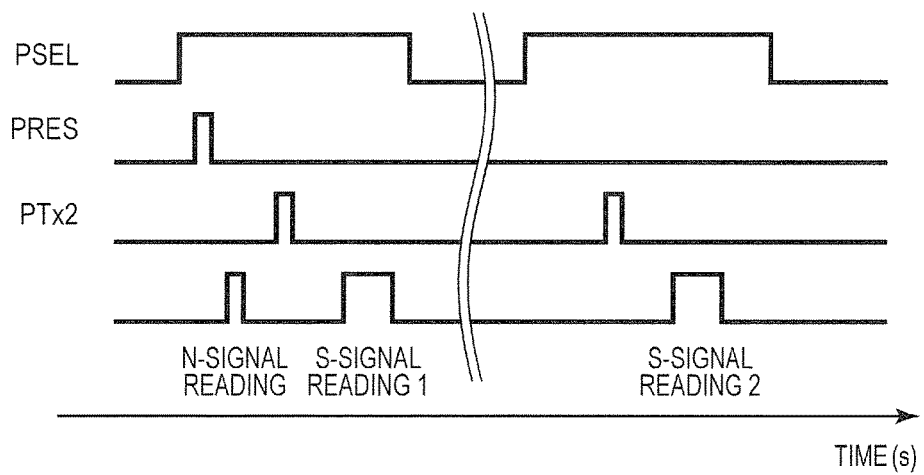

An imaging device according to a first embodiment of the present invention will be described with reference to FIGS. 1 to 5B. FIG. 1 is a block diagram illustrating a schematic configuration of the imaging device according to the present embodiment. FIG. 2 is a circuit diagram illustrating an example of configuration of a pixel circuit of the imaging device according to the present embodiment. FIG. 3 is a schematic diagram illustrating an operation of the imaging device according to the present embodiment. FIGS. 4 to 5B are timing charts illustrating an operation of the imaging device according to the present embodiment.

First, a configuration of the imaging device according to the present embodiment will be described with an example of a CMOS sensor, with reference to FIGS. 1 and 2.

An imaging device 100 according to the present embodiment includes a pixel array unit 10, a vertical scanning circuit 20, a column amplifier circuit 30, a horizontal scanning circuit 40, a control circuit 50 and an output circuit 60 as illustrated in FIG. 1.

The pixel array unit 10 is provided with a plurality of pixels 12 arranged throughout a plurality of rows and a plurality of columns. Each of the pixels 12 includes a photoelectric conversion element that converts incident light to electric charge according to the amount of light.

The vertical scanning circuit 20 supplies control signals for driving a readout circuit in the pixel 12 when a signal is to be read out from each of the pixels 12. The column amplifier circuit 30 is a circuit unit that performs predetermined signal processing, such as amplification process and AD conversion process as necessary, to the signals read out from the pixels 12. The horizontal scanning circuit 40 sequentially transfers, to the output circuit 60, the signals of each column processed by the column amplifier circuit 30. The control circuit 50 controls operations and timings of the operations of the vertical scanning circuit 20, the column amplifier circuit 30 and the horizontal scanning circuit 40. The output circuit 60 is a circuit that outputs the signals read out from the pixels 12 to the outside.

FIG. 2 is a circuit diagram illustrating an example of a pixel circuit included in the pixel array unit 10. Although FIG. 2 illustrates four pixels 12 arranged in two rows and two columns as the pixels 12 included in the pixel array unit 10, the pixel array unit 10 actually includes more pixels 12.

Each pixel 12 includes a photoelectric conversion unit D1, a transfer transistor M1, a transfer transistor M2, a reset transistor M3, an amplifier transistor M4 and a select transistor M5. An anode of a photodiode forming the photoelectric conversion unit D1 is connected to a ground voltage line, and a cathode thereof is connected to a source of the transfer transistor M1. A drain of the transfer transistor M1 is connected to a source of the transfer transistor M2. A connection node of the drain of the transfer transistor M1 and the source of the transfer transistor M2 forms a charge holding unit C1. The holding unit C1 is indicated by a capacitor in FIG. 2. A drain of the transfer transistor M2 is connected to a source of the reset transistor M3 and a gate of the amplifier transistor M4. A connection node of the drain of the transfer transistor M2, the source of the reset transistor M3, and the gate of the amplifier transistor M4 forms a charge holding unit C2. The holding unit C2 is indicated by a capacitor in FIG. 2. The holding unit C2 is a so-called floating diffusion (FD). A drain of the reset transistor M3 and a drain of the amplifier transistor M4 are connected to a power supply voltage line (VDD). A source of the amplifier transistor M4 is connected to a drain of the select transistor M5.

A control line Tx1, a control line Tx2, a control line RES, and a control line SEL extending in a row direction (horizontal direction in FIG. 2) are arranged on each row of a pixel array of the pixel array unit 10. Each of the control lines Tx1 is connected to gates of the transfer transistors M1 of the pixels 12 lined up in the row direction and forms a signal line common to the pixels 12. Each of the control lines Tx2 is connected to gates of the transfer transistors M2 of the pixels 12 lined up in the row direction and forms a signal line common to the pixels 12. Each of the control lines RES is connected to gates of the reset transistors M3 of the pixels 12 lined up in the row direction and forms a signal line common to the pixels 12. Each of the control lines SEL is connected to gates of the select transistors M5 of the pixels 12 lined up in the row direction and forms a signal line common to the pixels 12. In FIG. 2, corresponding row numbers are added to the names of the control lines (for example, Tx1(m), Tx1(m+1)).

The control line Tx1, the control line Tx2, the control line RES and the control line SEL are connected to the vertical scanning circuit 20. The vertical scanning circuit 20 outputs, to the control line Tx1, a control signal PTx1 that is a drive pulse for controlling the transfer transistor M1. The vertical scanning circuit 20 outputs, to the control line Tx2, a control signal PTx2 that is a drive pulse for controlling the transfer transistor M2. The vertical scanning circuit 20 outputs, to the control line RES, a control signal PRES that is a drive pulse for controlling the reset transistor M3. The vertical scanning circuit 20 outputs, to the control lie SEL, a control signal PSEL that is a drive pulse for controlling the select transistor M5. In a typical example, when the vertical scanning circuit 20 outputs a high-level control signal, the corresponding transistors are turned on. When the vertical scanning circuit 20 outputs a low-level control signal, the corresponding transistors are turned off. The vertical scanning circuit 20 supplies the control signals according to a predetermined timing signal from the control circuit 50. A logic circuit, such as a shift register and an address decoder, is used as the vertical scanning circuit 20.

An output line 14 extending in a column direction (vertical direction in FIG. 2) is arranged on each column of the pixel array of the pixel array unit 10. Each of the output lines 14 is connected to sources of the select transistors M5 of the pixels 12 lined up in the column direction and forms signal line common to the pixels 12. Note that the select transistors M5 of the pixels 12 may not be included. In this case, the output lines 14 are connected to the sources of the amplifier transistors M4. Current sources 16 are respectively connected to the output lines 14.

The photoelectric conversion unit D1 converts (photoelectrically converts) incident light to electric charge according to the amount of light and accumulates the charge generated by the photoelectric conversion. The transfer transistor M1 transfers the charge held by the photoelectric conversion unit D1 to the holding unit C1. The holding unit C1 holds the charge generated by the photoelectric conversion unit D1 at a location different from the photoelectric conversion unit D1. The transfer transistor M2 transfers the charge held by the holding unit C1 to the holding unit C2. The holding unit C2 holds the charge transferred from the holding unit C1 and sets a voltage of an input node of an amplifier unit (gate of the amplifier transistor M4) to a voltage according to the capacitance thereof and the amount of transferred charge. The reset transistor M3 resets the voltage of the holding unit C2. The select transistor M5 selects the pixel 12 that output signal to the output line 14. A power supply voltage is supplied to the drain of the amplifier transistor M4, and a bias current is supplied to the source of the amplifier transistor M4 from the current source 16 via the select transistor M5. The amplifier transistor M4 thus forms an amplifier unit (source follower circuit) in which the gate serves as an input node. In this way, the amplifier transistor M4 outputs a signal Vout based on the charge generated by the incident light to the output line 14. In FIG. 2, corresponding column numbers are added to the signals Vout (Vout(p), Vout(p+1)).

According to the configuration, the charge generated by the photoelectric conversion unit D1 while the holding unit C1 holds the charge can be accumulated in the photoelectric conversion unit D1. This allows performing an imaging operation, or a so-called global electronic shutter operation, in which periods of the photoelectric conversion coincide in the plurality of pixels 12. Note that the electronic shutter electrically controls the accumulation of the charge generated by the incident light.

Next, a method of driving the imaging device according to the present embodiment will be described with reference to FIGS. 3 to 5B. Although an imaging operation for photographing moving images will be described here, still images can also be photographed in the same way.

FIG. 3 is a schematic diagram illustrating a transition in an operation state of the imaging device 100 with time, and a direction from left to right in FIG. 3 corresponds to a time axis. FIG. 3 illustrates an imaging operation in an n-th frame and an (n+1)-th frame.

For the convenience of the description, times T1, T2, T3 and T4 are sequentially defined in the time axis direction in one frame period. The time T1 is a start time of a frame, and the time T4 is an end time of the frame. In two consecutive frames, the time T4 of the previous frame and the time T1 of the subsequent frame coincide. A period between the time T1 and the time T2 is defined as a first period. A period between the time T2 and the time T3 is defined as a second period. A period between the time T3 and the time T4 is defined as a third period.

The imaging operation in one frame period includes a first exposure period and a second exposure period as illustrated in FIG. 3. In the present embodiment, the first exposure period corresponds to the first period and is a relatively short exposure period. The second exposure period corresponds to a period of a sum of the second period and the third period and is an exposure period longer than the first exposure period. The second exposure period is started after the first exposure period.

The imaging operation in one frame period includes accumulation periods PD (n, 1) and PD (n, 2). The accumulation period PD (n, 1) is a period in which the photoelectric conversion units D1 generate or accumulate the charge in the first exposure period. The accumulation period PD (n, 2) is a period in which the photoelectric conversion units D1 generate or accumulate the charge in the second exposure period.

The imaging operation in one frame period includes part of a holding period MEM (n−1, 2), a holding period MEM (n, 1), and part of a holding period MEM (n, 2). The holding period MEM (n−1, 2) is a period in which the holding units C1 hold the charge generated by the photoelectric conversion units D1 in the second exposure period of the previous frame ((n−1)-th frame not illustrated). The holding period MEM (n, 1) corresponds to the second period and is a period in which the holding units C1 hold the charge generated by the photoelectric conversion units D1 in the first exposure period of the frame (n-th frame). The holding period MEM (n, 2) is a period in which the holding units C1 hold the charge generated by the photoelectric conversion units D1 in the second exposure period of the frame. The holding period MEM (n, 2) corresponds to a period from the third period of the frame to the first period of the next frame ((n+1)-th frame).

The imaging operation in one frame period includes a first readout period and a second readout period. A period for carrying out a readout operation of signals based on the charge accumulated in the first exposure period is the first readout period, and a period for carrying out a readout operation of signals based on the charge accumulated in the second exposure period is the second readout period. The first readout period is performed in the second period of the frame, and the second readout period is performed in the first period of the next frame. In FIG. 3, one rectangle mark indicates a period for carrying out a series of readout operations from one row of pixels 12. Reading periods from different rows of pixels 12 are indicated at positions at different heights, thereby schematically illustrating that the readout operation is sequentially carried out row by row.

FIG. 3 illustrates an example of sequentially performing the readout operation from the pixels 12 of a first row. However, the order of performing the readout operation is not limited to this example. The reading may be performed at least once for each of the pixels 12 forming the image of one frame in the first period and the second period.

The charge held by the holding units C1 in the holding period MEM (n, 1) is transferred to the holding units C2 in the second period sequentially row by row, and the readout operation is sequentially carried out (first reading). The charge held by the holding units C1 in the holding period MEM (n, 2) is transferred to the holding units C2 in the first period of the next frame sequentially row by row, and the readout operation is sequentially carried out (second reading). The first reading and the second reading may not be carried out for all pixels 12 included in the pixel array unit 10, and the reading may be carried out for only part of the pixels 12.

In this way, the imaging operation in one frame period includes a relatively short accumulation period corresponding to the first exposure period and a relatively long accumulation period corresponding to the second exposure period. The short accumulation period is equivalent to the first period. The long accumulation period is equivalent to the period of the sum of the second period and the third period. Alternatively, the operation of resetting the input nodes of the amplifier units may not be performed after the reading of the signals of the first period, and the long accumulation period may be a period of a sum of the first period, the second period and the third period. That is, the charge generated in the first period and the charge generated in the second period and the third period are added on the input nodes of the amplifier units. The long accumulation period can be appropriately selected according to the usage or the situation of photographing.

The signals based on the charge accumulated in the second exposure period of the previous frame are read out in the first period. Therefore, the holding units C1 can hold new charge after the end of the first period. The signals based on the charge accumulated in the first exposure period are read out in the second period. Therefore, the holding units C1 can hold new charge after the end of the second period. Thus, the photoelectric conversion units D1 can accumulate at least the larger one of the charge generated in the first period and the charge generated in the second period. The amount of charge generated in the first period and the second period is usually smaller than the amount of charge generated in the exposure period of one frame, that is, the period of the sum of the first period, the second period and the third period. Therefore, the saturation charge amount of the photoelectric conversion units D1 can be reduced.

The third period in which the holding units C1 hold the charge is longer than the first period and the third period in the driving method of the present embodiment. Therefore, the saturation charge amount of the photoelectric conversion units D1 can be reduced. However, the first period, the second period and the third period may be equal, or the first period and the second period may be longer than the third period. Other arbitrary combinations of accumulation time are also possible.

In this way, the reading operation is performed in the first period and the second period in the driving method of the imaging device 100 according to the present embodiment. As a result, the signal based on the charge generated in the short accumulation period (signal of short accumulation period) and the signal based on the charge generated in the long accumulation period (signal of long accumulation period) can be read out from one pixel 12 in the readout operation of one frame. Of the signals with different accumulation time, the signal with a long accumulation time can correspond to a high-sensitivity signal, and the signal with a short accumulation time can correspond to the low-sensitivity signal, for example. Therefore, the signals can be combined to obtain a wide dynamic range image while performing the global electronic shutter.

In the readout operation of FIG. 3, the exposure of the next frame can be started just after the end of the exposure of one frame. Therefore, the period without information can be mostly eliminated, and the image quality can be improved.

The readout operation is performed for each of the plurality of pixels 12 in the first period and the second period in which the photoelectric conversion units D1 accumulate the charge. Therefore, the saturation charge amount of the pixels 12 can be increased even if the saturation charge amount of the photoelectric conversion units D1 is small. The saturation charge amount of the pixels 12 is a maximum value of the amount of charge that can be handled as a signal in the charge generated by one exposure. The saturation charge amount of the photoelectric conversion units D1 and the saturation charge amount of the holding units C1 are a maximum value of the amount of charge that can be accumulated by the photoelectric conversion units D1 and a maximum value of the amount of charge that can be held by the holding units C1, respectively.

A ratio of the period of the sum of the first period, the second period and the third period to each of the first period and the second period can be substantially equal to a ratio of the saturation charge amount of the holding units C1 to the saturation charge amount of the photoelectric conversion units D1. The period of the sum of the first period, the second period and the third period here is the exposure period of one frame. The period is also a sum of the exposure period corresponding to the low-sensitivity signal and the exposure period corresponding to the high-sensitivity signal.

In the present embodiment, the ratio of the exposure period of one frame to the first period is 4. The lengths of the first period and the second period are the same. Therefore, the first period is ¼ of the exposure period of one frame. For example, the first period is 1/240 seconds in photographing of moving images with 60 frames per second.

Therefore, the ratio of the saturation charge amount of the holding units C1 to the saturation charge amount of the photoelectric conversion units D1 can be close to 4. This is because while the holding units C1 hold the entire charge generated in one exposure period, the photoelectric conversion units D1 just need to hold ¼ of the entire charge. Setting such a ratio of the saturation charge amount can optimize the sizes of the photoelectric conversion units D1 and the holding units C1.

FIG. 4 schematically illustrates an example of drive pulses used to drive the imaging device according to the present embodiment. FIG. 4 illustrates the control signals PTx1 supplied to the control lines Tx1 of the transfer transistors M1 and the control signals PTx2 supplied to the control lines Tx2 of the transfer transistors M2 of the pixels 12 of m-th to (m+2)-th rows. When the control signal is in the high level, the corresponding transistors are on-state. When the control signal is in the low level, the corresponding transistors are off-state.

The exposure (second exposure period) of the previous frame is performed in the period until the time T1. The exposure denotes that the charge generated by the photoelectric conversion is accumulated or held as a signal. The charge of the previous frame generated before the time T1 is held by the photoelectric conversion units D1 and the holding units C1. The control signals PTx1 are switched to the high level to turn on the transfer transistors M1, and the charge generated in the second exposure period of the previous frame is all transferred to the holding units C1. The control signals PTx1 are switched to the low level at the time T1 to turn off the transfer transistors M1 at the same time in all pixels 12, and the second exposure period of the previous frame ends.

When all of the charge of the previous frame accumulated in the photoelectric conversion units D1 is transferred to the holding units C1, the photoelectric conversion units D1 enter the initial state. More specifically, the photoelectric conversion units D1 of the pixels 12 of all rows (pixels 12 of three rows in FIG. 4) newly start accumulating the charge at the same time at the time T1. In this way, the transfer transistors M1 are turned off, and the photoelectric conversion units D1 start accumulating the charge in the driving method of the present embodiment. The time T1 is the start time of the first exposure period.

The signals of the previous frame based on the charge transferred to the holding units C1 until the time T1 are sequentially read out after the time T1 (second reading of previous frame). More specifically, the control signal PTx2 is switched to the high level to turn on the transfer transistors M2, and the change held in the holding units C1 are transferred to the holding units C2. As a result, the voltage of the input nodes of the amplifier units (gates of the amplifier transistors M4) changes according to the capacitance of the holding units C2 and the amount of transferred charge, and signals based on the voltage of the input nodes are output to the output lines 14.

The operation is sequentially carried out for the pixels 12 to be read out row by row from the first row to the last row. The operation from the m-th row to the (m+2)-th row illustrated in FIG. 4 will be described. The transfer transistors M2 of the pixels 12 of the m-th row are first turned on, and the charge of the holding units C1 of the pixels 12 of the m-th row are transferred to the holding units C2. As a result, the voltage of the input nodes changes according to the capacitance of the holding units C2 and the amount of transferred charge, and the amplifier transistors M4 output the signals based on the voltage of the input nodes to the output lines 14. Similar operation is performed for the pixels 12 of the (m+1)-th row, and then similar operation is performed for the pixels 12 of the (m+2)-th row. After the pixels 12 to be read out are all read out, the transfer transistors M1 and M2 of the pixels 12 are turned off.

The number of signals output in the first period can be appropriately changed according to the format or the like of the image to be output. For example, in photographing of moving images, signals can be output from the pixels 12 of the rows corresponding to the number of horizontal lines used in one frame. In such an embodiment, the signals may not be output from all pixels 12 included in the imaging device 100.

The transfer transistors M1 are kept in off-state from the time T1 to at least the end of the second reading of the previous frame. Although the transfer transistors M1 of all pixels 12 are kept in off-state in the example illustrated in the present embodiment, the transfer transistor M1 of at least one pixel 12 may be kept in off-state. As a result, the charge generated in the period is accumulated in the photoelectric conversion units D1 in the pixel 12 in which the transfer transistor M1 is kept in off-state. The charge generated in the period is accumulated in the photoelectric conversion unit D1, and the holding unit C1 can hold the charge generated before the time T1 while the transfer transistor M1 is off-state.

Next, after the end of the second reading of the previous frame, the control signals PTx1 are switched to the high level to turn on the transfer transistors M1, and the charge generated by the photoelectric conversion units D1 after the time T1 is transferred to the holding units C1. The charge generated while the transfer transistors M1 are on-state are immediately transferred from the photoelectric conversion units D1 to the holding units C1. The present embodiment illustrates an example in which the transfer transistors M1 of all pixels 12 to be read out are turned on at the same time.

However, the timing of the switch may vary between the rows as long as the transfer transistors M1 are turned on before the time T2. For example, the transfer transistors M1 may be turned on in order of the pixels 12 of the rows finished with the second readout operation of the previous frame.

At the time T2, the control signal PTx1 is switched to the low level to turn off the transfer transistors M1 at the same time, and the first exposure period ends. The time T2 is the end time of the first exposure period. When all of the charge held by the photoelectric conversion units D1 is transferred to the holding units C1, the photoelectric conversion units D1 enter the initial state. More specifically, the photoelectric conversion units D1 of all pixels 12 newly start accumulating the charge at the same time at the time T2. The time T2 is the start time of the second exposure period. The period from the time T1 to the time T2 is the first period. The charge generated in the first exposure period is held by the holding units C1 after the time T2. The charge generated after the time T2 is accumulated in the photoelectric conversion unit D1, and the holding unit C1 can hold the charge generated in the first exposure period while the transfer transistor M1 is off-state.

The signals based on the charge transferred to the holding units C1 until the time T2 are sequentially read out (first reading) after the time T2. More specifically, as in the second reading of the previous frame, the control signal PTx2 is switched to the high level to turn on the transfer transistors M2, and the charge held by the holding units C1 are transferred to the holding units C2. As a result, the voltage of the input nodes of the amplifier units (gates of the amplifier transistors M4) changes according to the capacitance of the holding units C2 and the amount of transferred charge, and signals based on the voltage of the input nodes are output to the output lines 14.

The operation is sequentially executed for the pixels 12 to be read out row by row from the first row to the last row. The operation from the m-th row to the (m+2)-th row illustrated in FIG. 4 will be described. The transfer transistors M2 of the pixels 12 of the m-th row are first turned on, and the charge of the holding units C1 of the pixels 12 of the m-th row is transferred to the holding units C2. As a result, the voltage of the input nodes of the amplifier units (gates of the amplifier transistors M4) changes according to the capacitance of the holding units C2 and the amount of transferred charge, and the amplifier transistors M4 output the signals based on the voltage of the input nodes to the output lines 14. Similar operation is performed for the pixels 12 of the (m+1)-th row, and then similar operation is performed for the pixels 12 of the (m+2)-th row. After the pixels 12 to be read out are all read out, the transfer transistors M1 and M2 of the pixels 12 are turned off.

In this way, the signals based on the charge accumulated in the first exposure period can be output as signals of short accumulation period (low-sensitivity signals).

The transfer transistors M1 are kept in off-state from the time T2 to at least the end of the first reading. The charge generated by the photoelectric conversion units D1 in the period after the time T2 and before the transfer transistors M1 are first turned on is accumulated in the photoelectric conversion units D1.

After the end of the first reading, the control signals PTx1 are switched to the high level to turn on the transfer transistors M1, and the charge generated by the photoelectric conversion units D1 after the time T2 is transferred to the holding units C1. In the example of the present embodiment, the transfer transistors M1 are intermittently turned on three times after the end of the first reading as illustrated in FIG. 4. The timing of falls of the control signals PTx1 in the first intermittent drive is the time T3, and the timing of falls of the control signals PTx1 in the third intermittent drive is the time T4. The period from the time T2 to the time T3 is the second period, and the period from the time T3 to the time T4 is the third period. In this case, in the first intermittent drive, the charge accumulated in the photoelectric conversion units D1 in the second period is transferred to the holding units C1. The charge is similarly transferred from the photoelectric conversion units D1 to the holding units C1 in the subsequent intermittent drives, and all of the charge generated in the photoelectric conversion units D1 in the second period and the third period is transferred to the holding units C1 at the time T4 after the third intermittent drive.

The transfer transistors M1 are intermittently driven to transfer the charge generated in the second exposure period to the holding units C1 before the charge exceeds the saturation charge amount of the photoelectric conversion units D1. Intervals for performing the intermittent operations can be appropriately selected according to the saturation charge amount and the like of the photoelectric conversion units D1. In one embodiment, the intervals can be set to the same length as the first period or the second period. The intervals for performing the intermittent operations can be even.

Between the time T2 and the time T4, the period of transferring the charge from the photoelectric conversion units D1 to the holding units C1 can be freely set after the end of the first reading. For example, the number of times that the transfer transistors M1 are intermittently turned on is not limited to three, and the number can be any number. The transfer transistors M1 may be always kept in on-state in the third period. In that case, the charge generated in the third period is immediately transferred from the photoelectric conversion units D1 to the holding units C1. However, from the viewpoint of reducing the noise, an operation with a short period of turning on the transfer transistors M1, such as the intermittent operation, can be performed.

At the time T4, the control signals PTx1 of all rows are switched from the high level to the low level to control the transfer transistors M1 of the pixels 12 of all rows to turn off at the same time. As a result, the exposure period of one frame ends. The time T4 is the end time of the second exposure period.

In the first period of the next (n+1)-th frame, the signals based on the charge generated in the second exposure period of the n-th frame are read out as in the second reading of the previous frame (second reading).

In this way, the signals based on the charge accumulated in the second exposure period can be output as signals of long accumulation period (high-sensitivity signals).

In this way, the exposure periods coincide with each other in all pixels 12 in the method of driving the imaging device according to the present embodiment. More specifically, the exposure starts at the time T1, and the exposure ends at the time T4 in all pixels 12. The exposure of the next frame starts at the time T4, and hereafter, the operation from the time T1 to the time T4 is repeated.

The low-sensitivity signals and the high-sensitivity signals with different accumulation periods obtained in this way can be combined to extend the dynamic range. As a result, blocked up shadows and blown out highlights of a subject can be prevented in a photographed image, and a high-quality image can be obtained.

Next, a readout operation of signals from one pixel 12 will be described with reference to FIGS. 5A and 5B. FIGS. 5A and 5B schematically illustrate examples of drive pulses used to drive the imaging device 100 according to the present embodiment. FIGS. 5A and 5B illustrate the control signal PSEL supplied to the select transistor M5, the control signal PRES supplied to the reset transistor M3, and the control signal PTx2 supplied to the transfer transistor M2. When the control signal is in the high level, the corresponding transistors are on-state. When the control signal is in the low level, the corresponding transistors are off-state.

FIG. 5A is a timing chart for reading out signals corresponding to the accumulated charge of the second exposure period in the second reading. FIG. 5B is a timing chart for reading out signals corresponding to the accumulated charge of the first exposure period and the second exposure period in the second reading. In FIGS. 5A and 5B, the left side of a break line indicates the operation of the first reading, and the right side of the break line indicates the operation of the second reading.

In the first readout operation, selection of the pixel 12, reset, readout of noise signal (N-signal reading), transfer of charge, and readout of optical signal (S-signal reading) are performed according to the drive pulses illustrated in FIGS. 5A and 5B.

In the second readout operation illustrated in FIG. 5A, selection of the pixels 12, reset, readout of noise signal (N-signal reading), transfer of charge, and readout of optical signal (S-signal reading) are sequentially performed as in the first readout operation. In the operation of FIG. 5A, the reset (PRES) of the holding unit C2 is performed before the transfer of charge (PTx2), and the charge held by the holding unit C2 after the transfer of charge from the holding units C1 is only the charge generated in the second exposure period. Note that the description of FIG. 4 is based on the readout operation of FIG. 5A.

In the second readout operation illustrated in FIG. 5B, selection of the pixels 12, transfer of charge, and readout of optical signal (S-signal reading) are sequentially performed. Therefore, the holding unit C2 is not reset before the transfer of charge in the second reading. In the operation of FIG. 5B, the reset is not performed before the transfer of charge, and the charge generated in the first exposure period remains in the holding unit C2 before the transfer of charge from the holding unit C1. Therefore, when the charge generated in the second exposure period is transferred from the holding unit C1 to the holding unit C2 in this state, the charge generated in the first exposure period and the charge generated in the second exposure period are transferred to the holding unit C2. Thus, the second reading illustrated in FIG. 5B is equivalent to reading of signals corresponding to the accumulated charge in the first exposure period and the second exposure period.

AD conversion may be applied to the signals output from the pixel 12 inside of the imaging device 100 (by, e.g., the column amplifier circuit 30 with AD conversion function), or AD conversion may be applied to the signals outside of the imaging device 100 (by, e.g., a signal processing unit 208 described later).

As described, the method of driving the imaging device according to the present embodiment can be used to acquire signals with short accumulation time and signals with long accumulation time in the same frame period. Therefore, an image obtained from the signals can be used to obtain an image with an extended dynamic range.

The signals based on the accumulated charge of the first exposure period and the second exposure period are used as the signals with long accumulation time, and both of the exposure period of the signals with short accumulation time and the exposure period of the signals with long accumulation time are started at the time T1. The exposure periods also have an overlapping exposure period (first period). In this way, the start times of the exposure periods coincide, and an offset of the subject in combining the image based on the signals with short accumulation time and the image based on the signals with long accumulation time can be reduced. This allows obtaining a wide dynamic range image with a little offset of the subject and without blocked up shadows or blown out highlights.

The photoelectric conversion units D1 of the pixels 12 just need to be able to accumulate the charge generated in at least one of the first period and the second period. Therefore, the saturation charge amount of the pixels 12 can be maintained even if the saturation charge amount of the photoelectric conversion units D1 is small. Therefore, according to the configuration, a wide dynamic range image can be obtained while maintaining the saturation charge amount of the pixels 12 and performing the global electronic shutter. Note that the third period in which the holding units C1 of the pixels 12 hold the charge can be longer than the first period and the second period. In this way, the saturation charge amount of the photoelectric conversion units D1 can be further reduced.

In the example described in the present embodiment, imaging with a long accumulation period is performed after imaging with a short accumulation period in a predetermined frame. However, imaging with a short accumulation period may be performed after imaging with a long accumulation period in a predetermined frame.

The imaging device of the present embodiment may include an operation mode for performing a rolling shutter operation. In the operation mode for performing the rolling shutter operation, the photoelectric conversion units D1 of the plurality of pixels 12 sequentially start accumulating the charge. Subsequently, the transfer transistors M1 of the plurality of pixels 12 are sequentially controlled to turn on. The imaging device 100 of the present embodiment may include an operation mode for performing a global electronic shutter of another system. The global electronic shutter of another system is an operation in which the period that the photoelectric conversion units D1 accumulate the charge is equal to the exposure period.

In this way, according to the present embodiment, the global electronic shutter operation can be performed while suppressing the saturation of pixels. An image with an extended dynamic range can also be obtained.

Second Embodiment

Figure 6:
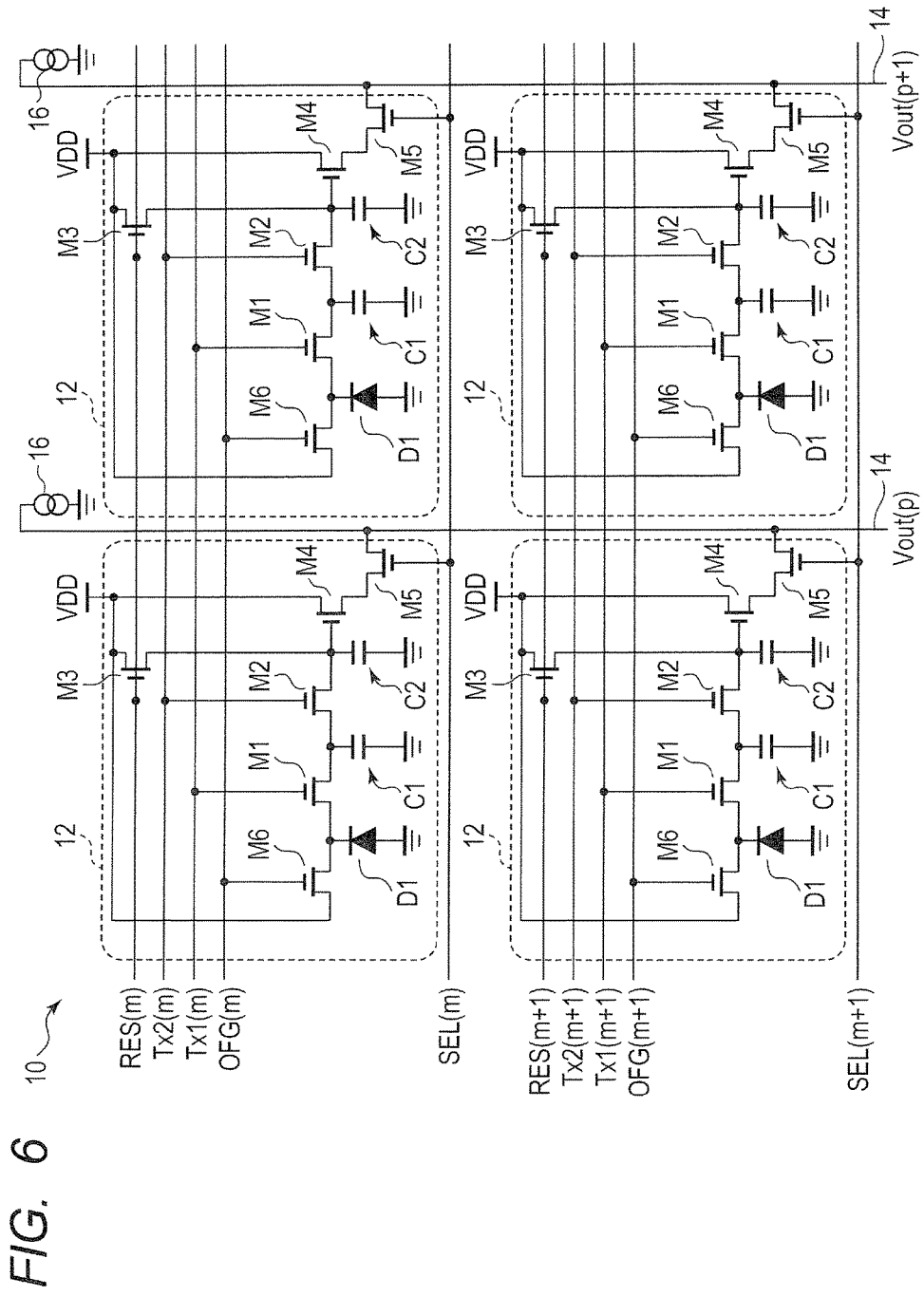
FIG. 6 is a diagram illustrating an example of configuration of a pixel circuit of an imaging device according to a second embodiment of the present invention.
Figure 7:
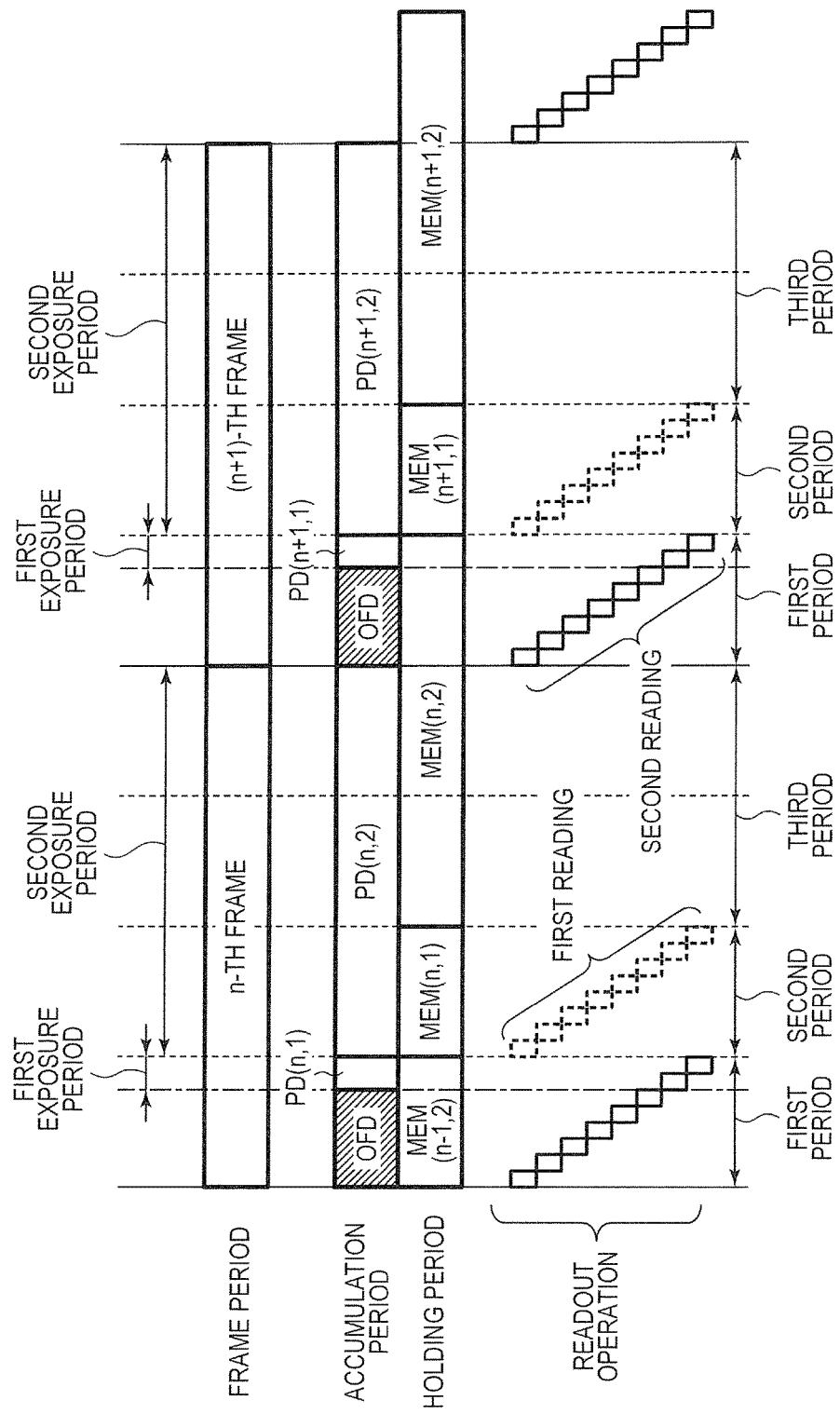
FIG. 7 is a schematic diagram illustrating an operation of the imaging device according to the second embodiment of the present invention.
Figure 8:
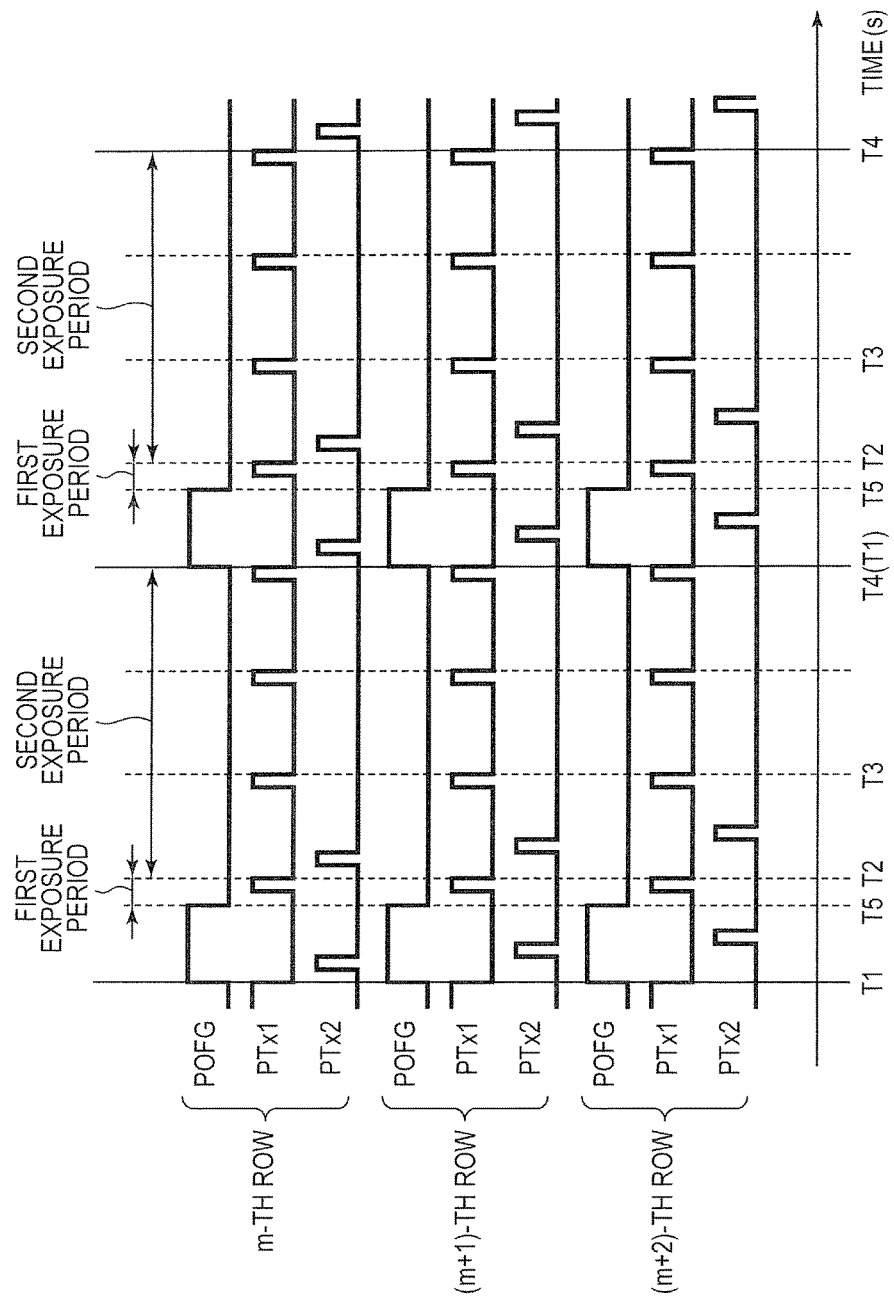
FIG. 8 is a timing chart illustrating the operation of the imaging device according to the second embodiment of the present invention.

An imaging device according to a second embodiment of the present invention will be described with reference to FIGS. 6 to 8. The same reference signs are provided to the same constituent elements as in the imaging device according to the first embodiment illustrated in FIGS. 1 to 5B, and the description will be omitted or simplified. FIG. 6 is a circuit diagram illustrating an example of configuration of a pixel circuit of the imaging device according to the present embodiment. FIG. 7 is a schematic diagram illustrating an operation of the imaging device according to the present embodiment. FIG. 8 is a timing chart illustrating an operation of the imaging device according to the present embodiment.

First, a configuration of the imaging device 100 according to the present embodiment will be described with reference to FIG. 6.

The imaging device 100 according to the present embodiment is the same as the imaging device 100 according to the first embodiment, except that the circuit configuration of the pixels 12 is different. As illustrated in FIG. 6, the pixel 12 of the imaging device 100 according to the present embodiment further includes an overflow transistor M6 in addition to the photoelectric conversion unit D1, the transfer transistors M1 and M2, the reset transistor M3, the amplifier transistor M4 and the select transistor M5.

A source of the overflow transistor M6 is connected to a connection node of the cathode of the photodiode forming the photoelectric conversion unit D1 and the source of the transfer transistor M1. A drain of the overflow transistor M6 is connected to the power supply voltage line (VDD). A control line OFG is further arranged on each row of the pixel array of the pixel array unit 10. Each of the control lines OFG is connected to gates of the overflow transistors M6 of the pixels 12 lined up in the row direction and forms a signal line common to the pixels 12. The control line OFG is connected to the vertical scanning circuit 20. The vertical scanning circuit 20 outputs, to the control line OFG, a control signal POFG for controlling the overflow transistors M6. In a typical example, the overflow transistors M6 are turned on when the control signal POFG in the high level is output from the vertical scanning circuit 20, and the overflow transistors M6 are turned off when the control signal POFG in the low level is output from the vertical scanning circuit 20.

The overflow transistors M6 have a function of discharging the charge of the photoelectric conversion units D1 to power supply nodes.

In the first embodiment, the transfer transistors M1 are controlled to start the accumulation of the charge by the photoelectric conversion units D1. In the present embodiment, the overflow transistors M6 can also be controlled to start the accumulation of the charge by the photoelectric conversion units D1. Specifically, the overflow transistors M6 can be controlled to turn off to start the accumulation of the charge by the photoelectric conversion units D1. As a result, a degree of freedom of setting the exposure time can be improved.

Next, a method of driving the imaging device according to the present embodiment will be described with reference to FIGS. 7 and 8. The method of driving the imaging device according to the present embodiment is different from the method of driving the imaging device according to the first embodiment in that the overflow transistors M6 control the start time of the first exposure period. The difference from the driving method of the first embodiment will be mainly described here, and the description of the same part will be omitted or simplified.

FIG. 7 is a schematic diagram illustrating a transition in the operation state of the imaging device 100 with time, and the direction from left to right in FIG. 7 corresponds to the time axis. FIG. 7 illustrates an imaging operation in the n-th frame and the (n+1)-th frame.

As illustrated in FIG. 7, one frame period in the method of driving the imaging device according to the present embodiment includes the first exposure period, the second exposure period, the accumulation periods PD (n, 1) and PD (n,2) and a discharge period OFD. One frame period also includes the holding periods MEM (n−1, 2), MEM (n, 1) and MEM (n, 2) and two readout periods.

The first exposure period corresponds to a period from time T5 to the time T2 between the time T1 and the time T2 and is a relatively short exposure period. The second exposure period corresponds to the period of the sum of the second period and the third period and is a relatively long exposure period compared to the first exposure period. The second exposure period starts after the first exposure period. The accumulation period PD (n, 1) is a period in which the photoelectric conversion units D1 generate or accumulate the charge in the first exposure period. The holding period MEM (n, 1) is a period in which the holding units C1 hold the charge generated by the photoelectric conversion units D1 in the first exposure period. The accumulation period PD (n, 2) is a period in which the photoelectric conversion units D1 generate or accumulate the charge in the second exposure period. The holding period MEM (n, 2) is a period in which the holding units C1 hold the charge generated by the photoelectric conversion units D1 in the second exposure period. The discharge period OFD is a period in which the overflow transistors M6 are on-state. The charge generated by the photoelectric conversion unit D1 or the charge held by the photoelectric conversion unit D1 in the discharge period OFD is discharged via the overflow transistor M6, and the charge is not accumulated in the photoelectric conversion unit D1.

In the method of driving the imaging device according to the present embodiment, the start time and the end time of the first exposure period are set such that the first exposure period is a period from the time T5 to the time T2 between the time T1 and the time T2. In this case, the start time of the first exposure period can be controlled by the timing of the control signal POFG. The end time of the first exposure period can be controlled by the timing of the control signal PTx1 as in the first embodiment.

More specifically, the start time of the first exposure period can be set by the timing that the control signal POFG is first shifted from the high level to the low level after the start of the frame period. The control signal POFG is switched to the low level, and the overflow transistors M6 are turned off. In this way, the charge generated by the photoelectric conversion units D1 is not discharged via the overflow transistors M6, and the charge is accumulated in the photoelectric conversion units D1.

The end time of the first exposure period can be set by the timing that the control signal POFG is in the low level, and the control signal PTx1 is shifted from the high level to the low level. The first exposure period ends by transferring the charge generated by the photoelectric conversion units D1 to the holding units C1. When the overflow transistor M6 is turned on, the photoelectric conversion unit D1 is reset. Therefore, the end time of the exposure period is the timing that the transfer transistor M1 is turned off before the timing that the overflow transistor M6 becomes on-state. The overflow transistor M6 is kept off-state from the start time to the end time of the exposure period.

The imaging operation in the second exposure period is the same as in the first embodiment, except that the control signal POFG is shifted to the low level to keep the overflow transistors M6 in off-state in the period.

FIG. 8 schematically illustrates an example of drive pulses used in the method of driving the imaging device according to the present embodiment. FIG. 8 illustrates the control signals PTx1 supplied to the control lines Tx1, the control signals PTx2 supplied to the control lines Tx2, and the control signals POFG supplied to the control lines OFG of the pixels 12 of the m-th to (m+2)-th rows. When the control signal is in the high level, the corresponding transistors are on-state. When the control signal is in the low level, the corresponding transistors are off-state. The drive timings of the control signals PTx1 and PTx2 are the same as in the method of driving the imaging device according to the first embodiment.

Although the frame period starts at the time T1, the control signal POFG is in the high level, and the overflow transistors M6 are on-state. Therefore, the charge generated by the photoelectric conversion units D1 is not accumulated. The first exposure period is started at the timing that the control signal POFG is shifted from the high level to the low level, that is, the time T5 at which the overflow transistors M6 are turned off. While the overflow transistor M6 is off-state, the charge generated by the photoelectric conversion unit D1 is accumulated in the photoelectric conversion unit D1. The overflow transistors M6 are turned off at the same time for the pixels 12 to be read out, and the global electronic shutter operation can be performed.

The time T5 at which the overflow transistors M6 are controlled to turn off is a period in which the signals of the previous frame are read out as illustrated in FIG. 7. That is, the first exposure period is started in the period that the signals of the previous frames are reading out. In this way, the period without information can be reduced, and the image quality can be improved.

In the period that the overflow transistors M6 are off-state, the control signal PTx1 is switched to the high level to turn on the transfer transistors M1, and the charge generated by the photoelectric conversion units D1 is transferred to the holding units C1. In the example of the present embodiment, the transfer transistors M1 are intermittently turned on four times while the overflow transistors M6 are off-state, as illustrated in FIG. 8. The reason that the transfer transistors M1 are intermittently driven is the same as in the first embodiment.

The end time of the first exposure period can be set by the timing that the transfer transistors M1 are turned off in the state that the overflow transistors M6 are off-state. In the example of FIG. 8, the timing of a fall of the control signals PTx1 in the first intermittent drive of the transfer transistors M1, that is, the time T2, is the end time of the first exposure period. In this case, the transfer transistors M1 are turned off at the same time for the pixels 12 to be read out, and the global electronic shutter operation can be performed. Therefore, according to the drive of FIG. 8, the first exposure period corresponding to the short accumulation period is a period from the time T5 to the time T2.

The signals based on the charge transferred to the holding units C1 until the time T2 are sequentially read out (first reading) after the time T2, in a period (second period) before the second intermittent drive of the transfer transistors M1.

The time T2 that is the end time of the first exposure period is also the start time of the second exposure period. In the example of FIG. 8, the end time of the second exposure period is the timing of a fall of the control signals PTx1 in the fourth intermittent drive of the transfer transistors M1, that is, the time T4. The operation of accumulating the charge in the second exposure period and reading out (second reading) the signals based on the charge generated in the second exposure period is the same as in the first embodiment. The overflow transistors M6 are controlled to turn on after the time T4 that is the end time of the second exposure period.

Although the overflow transistors M6 are controlled to turn off in the second readout period of the previous frame in the example illustrated above, the timing of controlling the overflow transistors M6 to turn off is not limited to this. More specifically, the overflow transistors M6 may be controlled to turn off at the same time as the completion of the second readout operation of the previous frame or may be controlled to turn off after the completion of the second readout operation of the previous frame. In these cases, the holding units C1 do not have the charge of the previous frame when the overflow transistors M6 are turned off, and the transfer transistors M1 can be controlled to turn on. Therefore, even if intense light instantaneously enters the photoelectric conversion units D1, and charge exceeding the saturation charge amount of the photoelectric conversion units D1 is generated, the pixels 12 can be used without saturation, up to the saturation charge amount equivalent to the sum of the saturation charge amount of the photoelectric conversion units D1 and the saturation charge amount of the holding units C1. Thus, according to the present embodiment, the driving method can be changed according to the brightness of the subject.

When the length of the first exposure period corresponding to the low-sensitivity signals is reduced as in FIG. 8, the length of the second exposure period corresponding to the high-sensitivity signals can be reduced. As a result, a blur of the subject can be reduced when, for example, the subject moves fast.

In this way, according to the present embodiment, the global electronic shutter operation can be performed while suppressing the saturation of the pixels. An image with an extended dynamic range can also be obtained. The degree of freedom of setting the exposure period can be improved by using the overflow transistors. As a result, a significantly short first exposure period corresponding to the low-sensitivity signals can be set for the high-luminance subject. In this way, the signals can be handled without saturation of the pixels, and a high-quality image with fewer blown out highlights can be obtained.

Third Embodiment

Figure 9:
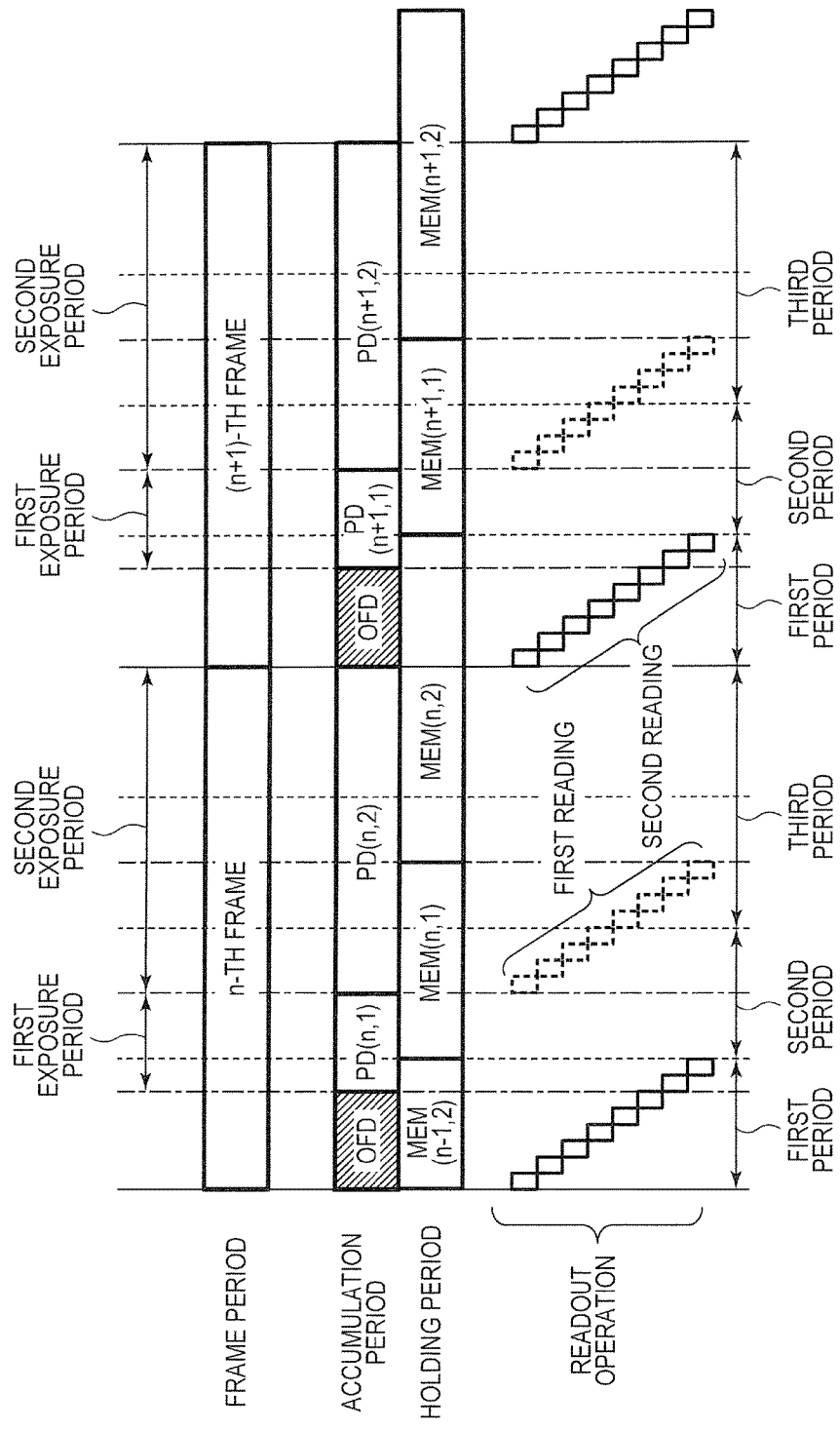
FIG. 9 is a schematic diagram illustrating an operation of an imaging device according to a third embodiment of the present invention.
Figure 10:
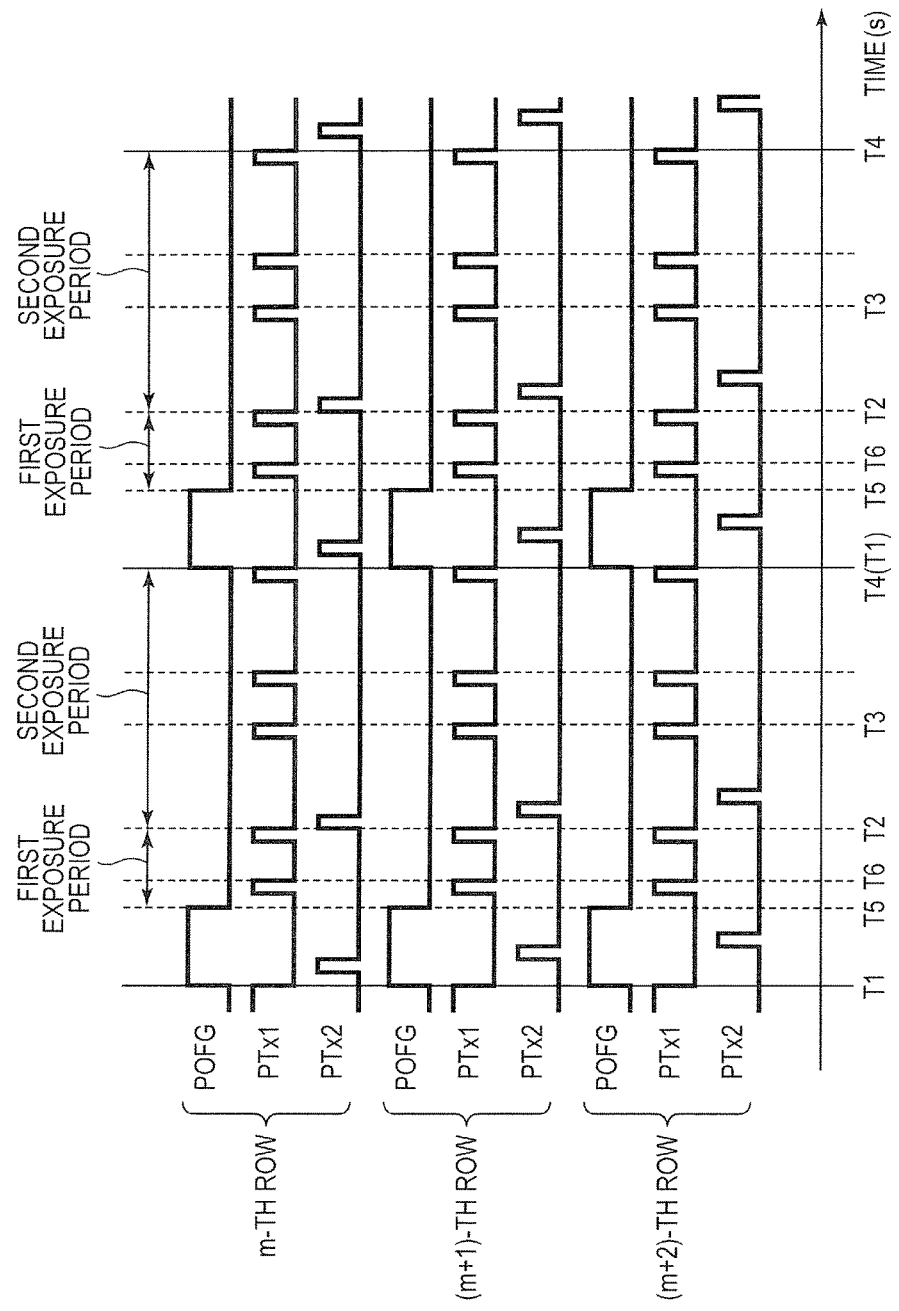
FIG. 10 is a timing chart illustrating the operation of the imaging device according to the third embodiment of the present invention.

An imaging device according to a third embodiment of the present invention will be described with reference to FIGS. 9 and 10. The same reference signs are provided to the same constituent elements as in the imaging device according to the first and second embodiments illustrated in FIGS. 1 to 8, and the description will be omitted or simplified. FIG. 9 is a schematic diagram illustrating an operation of the imaging device according to the present embodiment. FIG. 10 is a timing chart illustrating the operation of the imaging device according to the present embodiment.

The present embodiment describes another method of driving the imaging device 100 according to the second embodiment including the pixels 12 with the circuit configuration illustrated in FIG. 6. The method of driving the imaging device 100 according to the present embodiment is different from the method of driving the imaging device 100 according to the second embodiment in that a period of holding the charge generated in the first exposure period includes a period of holding the charge in the photoelectric conversion units D1 and a period of holding the charge in the holding units C1. The difference from the driving methods of the first and second embodiments will be mainly described, and the description of the same part will be omitted or simplified.

FIG. 9 is a schematic diagram illustrating a transition in the operation state of the imaging device 100 with time, and the direction from left to right in FIG. 9 corresponds to the time axis. FIG. 9 illustrates an imaging operation in the n-th frame and the (n+1)-th frame.

The driving method according to the present embodiment is the same as in the first and second embodiments in that the signals of the previous frame are read out in the first period including the first exposure period. The driving method according to the present embodiment is different from the first and second embodiments in that the charge is transferred from the photoelectric conversion units D1 to the holding units C1 in the middle of the first exposure period. More specifically, the transfer transistors M1 are controlled to turn off in the first period in the driving method according to the present embodiment. In the schematic diagram of FIG. 9, the first exposure period includes a period in which the accumulation period PD (n, 1) and the holding period MEM (n, 1) overlap.

FIG. 10 schematically illustrates an example of drive pulses used in the method of driving the imaging device according to the present embodiment. FIG. 10 illustrates the control signals PTx1 supplied to the control lines Tx1, the control signals PTx2 supplied to the control lines Tx2, and the control signals POFG supplied to the control lines OFG of the pixels 12 of the m-th to (m+2)-th rows. When the control signal is in the high level, the corresponding transistors are on-state. When the control signal is in the low level, the corresponding transistors are off-state. The drive timing of the control signal POFG is the same as in the method of driving the imaging device according to the second embodiment.

Although the frame period is started at the time T1, the control signal POFG is in the high level, and the overflow transistors M6 are on-state. Therefore, the charge generated by the photoelectric conversion units D1 is not accumulated. The first exposure period is started at the timing that the control signal POFG is shifted from the high level to the low level, that is, the time T5 at which the overflow transistors M6 are turned off.

In the period that the overflow transistors M6 are off-state, the control signals PTx1 are switched to the high level to turn on the transfer transistors M1, and the charge generated by the photoelectric conversion units D1 is transferred to the holding units C1. In the example of the present embodiment, the transfer transistors M1 are intermittently turned on twice between the completion of the second readout operation of the previous frame and the time T2 that is the end time of the first exposure period, as illustrated in FIG. 10. The reason that the transfer transistors M1 are intermittently driven is the same as in the first embodiment.

Assuming that the timing of controlling the transfer transistors M1 to turn off in the first intermittent drive is time T6, the charge generated by the photoelectric conversion units D1 from the time T5 to the time T6 is transferred to the holding units C1 by the first intermittent drive. The charge generated by the photoelectric conversion units D1 from the time T6 to the time T2 is transferred to the holding units C1 by the second intermittent drive.

In this way, even if intense light instantaneously enters the photoelectric conversion units D1 from the time T5 to the time T2, and charge exceeding the saturation charge amount of the photoelectric conversion units D1 is generated, the pixels 12 can be used without saturation, up to the saturation charge amount equivalent to the sum of the photoelectric conversion units D1 and the holding units C1.

The transfer transistors M1 do not have to be intermittently driven in the first exposure period. After the completion of the second reading of the previous frame, the transfer transistors M1 may be kept on-state in the period before the time T2.

The signals based on the charge transferred to the holding units C1 in the first exposure period, that is, from the time T5 to the time T2, are sequentially read out (first reading) in the following second period. In this way, reading of short-second accumulated signals is completed.

The time T2 that is the end time of the first exposure period is also the start time of the second exposure period. In the second exposure period, the control signals PTx1 are switched to the high level to turn on the transfer transistors M1, and the charge generated by the photoelectric conversion units D1 is transferred to the holding units C1. In the example of the present embodiment, the transfer transistors M1 are intermittently turned on three times between the completion of the first readout operation of the frame and the time T4, as illustrated in FIG. 10. The timing of a fall of the control signals PTx1 in the third intermittent drive of the transfer transistors M1 is the time T4 that is the end time of the second exposure period. The reason that the transfer transistors M1 are intermittently driven is the same as in the first embodiment.

In the second exposure period, the transfer transistors M1 do not have to be intermittently driven. After the completion of the first reading of the frame, the transfer transistors M1 may be kept in on-state in the period until the time T4.

The operation of accumulating the charge in the second exposure period and reading out (second reading) the signals based on the charge generated in the second exposure period is the same as in the first embodiment. The overflow transistors M6 are controlled to turn on after the time T4 that is the end time of the second exposure period.

In this way, according to the present embodiment, the global electronic shutter operation can be performed while suppressing the saturation of pixels. An image with an extended dynamic range can also be obtained. The degree of freedom of setting the exposure period can be improved by using the overflow transistors. The amount of accumulated charge in the first exposure period can also be increased. As a result, signals of a high-luminance subject can be handled without saturation of pixels, and a high-quality image with fewer blown out highlights can be obtained.

Fourth Embodiment

Figure 11:
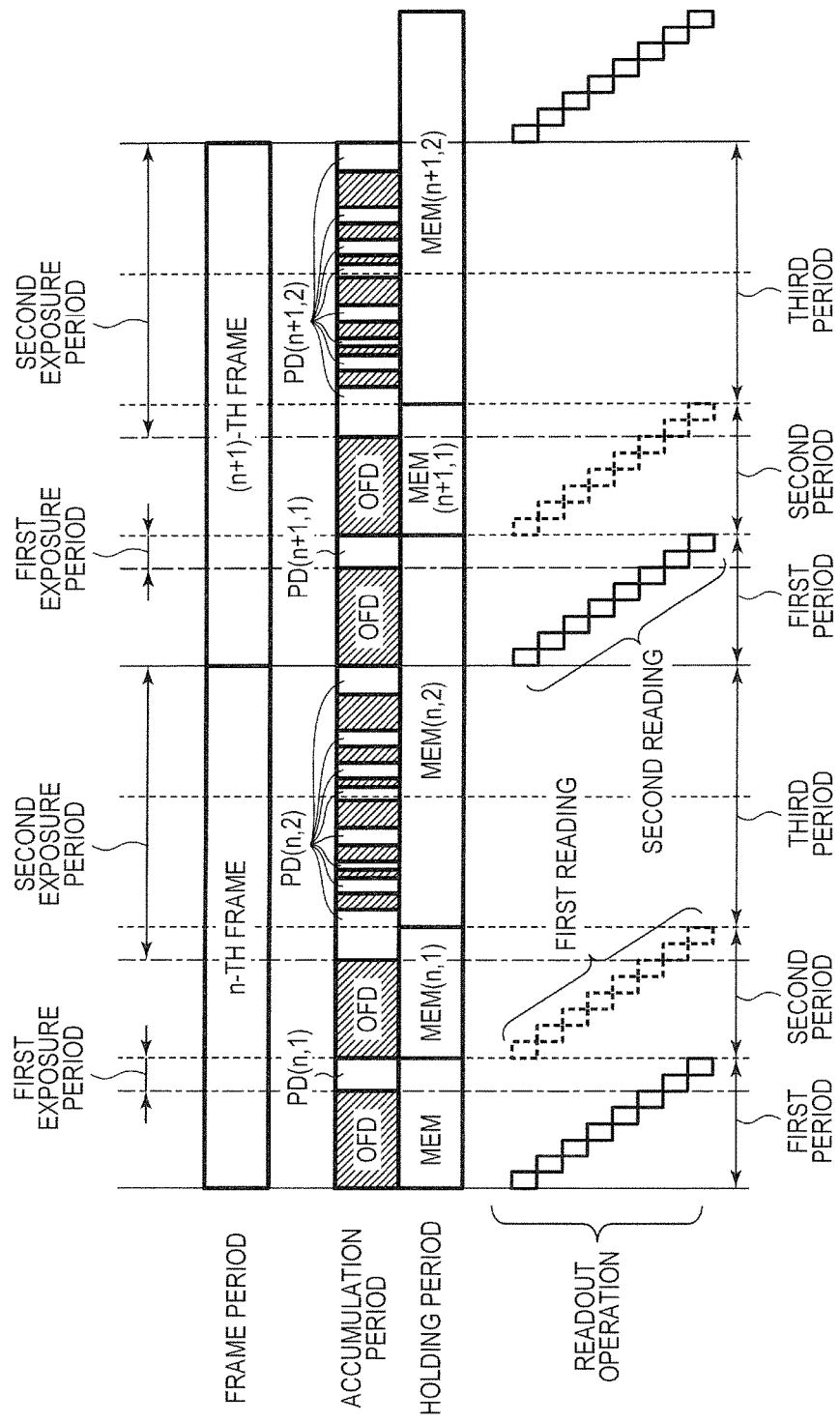
FIG. 11 is a schematic diagram illustrating an operation of an imaging device according to a fourth embodiment of the present invention.
Figure 12:
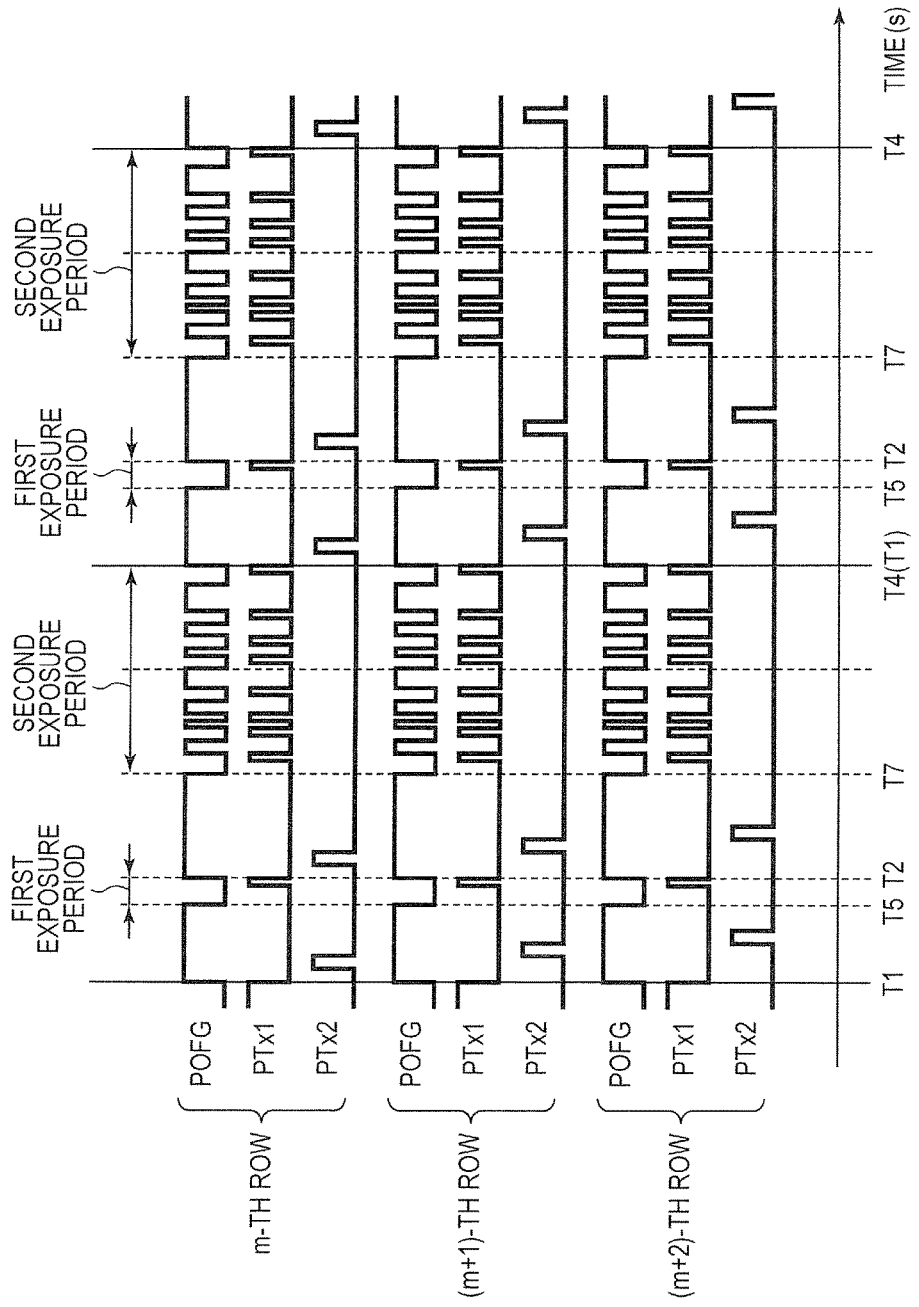
FIG. 12 is a timing chart illustrating the operation of the imaging device according to the fourth embodiment of the present invention.

An imaging device according to a fourth embodiment of the present invention will be described with reference to FIGS. 11 and 12. The same reference signs are provided to the same constituent elements as in the imaging devices according to the first to third embodiments illustrated in FIGS. 1 to 10, and the description will be omitted or simplified. FIG. 11 is a schematic diagram illustrating an operation of the imaging device according to the present embodiment. FIG. 12 is a timing chart illustrating the operation of the imaging device according to the present embodiment.

Another method of driving the imaging device according to the second embodiment including the pixels 12 with the circuit configuration illustrated in FIG. 6 will be described in the present embodiment. The method of driving the imaging device according to the present embodiment is different from the first to third embodiments in that coded exposure is performed in the second exposure period corresponding to the long accumulation period. The difference from the driving method of the first to third embodiments will be mainly described here, and the description of the same part will be omitted or simplified.

When a long second exposure period corresponding to high-sensitivity signals is set to improve blocked up shadows of image, a motion blur of a subject moving fast is often generated. To solve this, a blur restoration process can be executed by an image processing system of a later stage. However, information is missed in a signal at a spatial frequency including an integral multiple with respect to a distance of the movement of the subject in the exposure period. When such an image is used to execute the blur restoration process, noise components included in the image are amplified. An artifact (false signal) is generated in the image, and the image quality is significantly deteriorated.

In the present embodiment, the exposure in the second exposure period corresponding to the high-sensitivity signals with a long exposure time is coded exposure. This prevents missing of a signal of specific spatial frequency component generated by normal exposure. A separately estimated PSF (point spread function) is used to apply a blur restoration process to the blurred image including the obtained high-sensitivity signals. This allows obtaining an image of high-sensitivity signals from which the blur is removed without amplifying the noise. Subsequently, the image is combined with an image of low-sensitivity signals with a short exposure time obtained in the same frame, and this allows obtaining a low-noise wide dynamic range image from which the blur is removed.

FIG. 11 is a schematic diagram illustrating a transition in the operation state of the imaging device 100 with time, and the direction from left to right in FIG. 11 corresponds to the time axis. FIG. 11 illustrates an imaging operation in the n-th frame and the (n+1)-th frame. The signals of the previous frame are read out in the first period including the exposure period of the short-second accumulated signals, and this is the same as in the first to third embodiments. In the present embodiment, the accumulation period PD (n, 2) is divided into a plurality of periods by intermittently operating the transfer transistors M1 and the overflow transistors M6 in the third period that is an exposure period of the long-second accumulated signals. More specifically, the exposure period is coded in the time axis direction. Periods between the plurality of divided accumulation periods PD (n, 2) are discharge periods OFD.

FIG. 12 schematically illustrates an example of drive pulses used in the method of driving the imaging device according to the present embodiment. FIG. 12 illustrates the control signals PTx1 supplied to the control lines Tx1, the control signals PTx2 supplied to the control lines Tx2, and the control signals POFG supplied to the control lines OFG of the pixels 12 of the m-th to (m+2)-th rows. When the control signal is in the high level, the corresponding transistors are on-state. When the control signal is in the low level, the corresponding transistors are off-state.

As described in the second embodiment, the start time of the accumulation period can be set by the timing of switching off the overflow transistors M6 in the case of the pixels 12 including the overflow transistors M6. The end time of the accumulation period can be set by the timing of switching off the transfer transistors M1. Therefore, in the driving method of the present embodiment, the start times of the accumulation periods PD (n, 1) and PD (n, 2) are set by the timing of switching off the overflow transistors M6. The end times of the accumulation periods PD (n, 1) and PD (n, 2) are set by the timing of switching off the transfer transistors M1.

Focusing on one accumulation period, the accumulation period is started by turning off the overflow transistors M6 from the discharge state in which the transfer transistors M1 are off-state and the overflow transistors M6 are on-state. The transfer transistors M1 are turned on at an arbitrary timing in the accumulation period, and the charge is transferred. Subsequently, the transfer transistors M1 are turned off, and the accumulation period ends. After the end of the accumulation period, the overflow transistors M6 are turned on, and the discharge state is restored in which the transfer transistors M1 are off-state and the overflow transistors M6 are on-state. The series of operation ends. The series of operation is performed in the accumulation period PD (n, 1) and each of the plurality of divided accumulation periods PD (n, 2).

The first period from the time T1 to the time T2 includes the first exposure period and the readout period of the high-sensitivity signals of the previous frame. The readout operation of the high-sensitivity signals of the previous frame is performed between the time T1 and the time T2. The first exposure period is performed between the time T5 and the time T2.

The series of operation in the accumulation period is performed between the time T5 and the time T2 to perform the accumulation period PD (n, 1). The overflow transistors M6 are turned off at the time T5 to start the accumulation period PD (n, 1). Therefore, the exposure period of the low-sensitivity signals (first exposure period) is started at the time T5.

The transfer transistors M1 are switched on at an arbitrary timing before the time T2, and then the transfer transistors M1 are switched off at the time T2 to end the accumulation period PD (n, 1). Therefore, the exposure period of the low-sensitivity signals is a period from the time T5 to the time T2.

The second and third periods from the time T2 to the time T4 include the second exposure period and the readout period (first reading) of the short-second accumulated signals of the frame. The readout operation of the low-sensitivity signals of the frame is performed between the time T2 and the time T3. The second exposure period is performed between the time T2 and the time T4.

The series of operation in the accumulation period is performed for a plurality of times between the time T2 and the time T4 to perform the plurality of divided accumulation periods PD (n, 2), that is, coded exposure. The overflow transistors M6 are turned off at time T7 to start the first accumulation period PD (n, 2). Therefore, the exposure period of the high-sensitivity signals (second exposure period) is started at the time T7. The transfer transistors M1 are turned off at the time T4 to end the last accumulation period PD (n, 2). Therefore, the exposure period of the high-sensitivity signals is a period from the time T7 to the time T4.

The series of operation is performed at once for three rows from the m-th to (m+2)-th rows. However, the operation is not limited to three rows, and the operation may be performed at once in a plurality of other pixels 12. In the third period, the charge obtained by the intermittent exposure is accumulated in the holding units C1 of the plurality of pixels 12.

Subsequently, the transfer transistors M1 of the plurality of pixels 12 are controlled to turn off at once at the time T4, and the exposure of the long-second accumulated signals is completed. The reading of the long-second accumulated signals (second reading) of the frame is performed in the first period of the next frame.

In this way, according to the present embodiment, the global electronic shutter operation can be performed while suppressing the saturation of pixels. An image with an extended dynamic range can also be obtained. A low-noise blur restoration process can be applied to the high-sensitivity signals with a long exposure time. This allows obtaining a high-quality wide dynamic range image without a subject blur.

Fifth Embodiment

Figure 13:
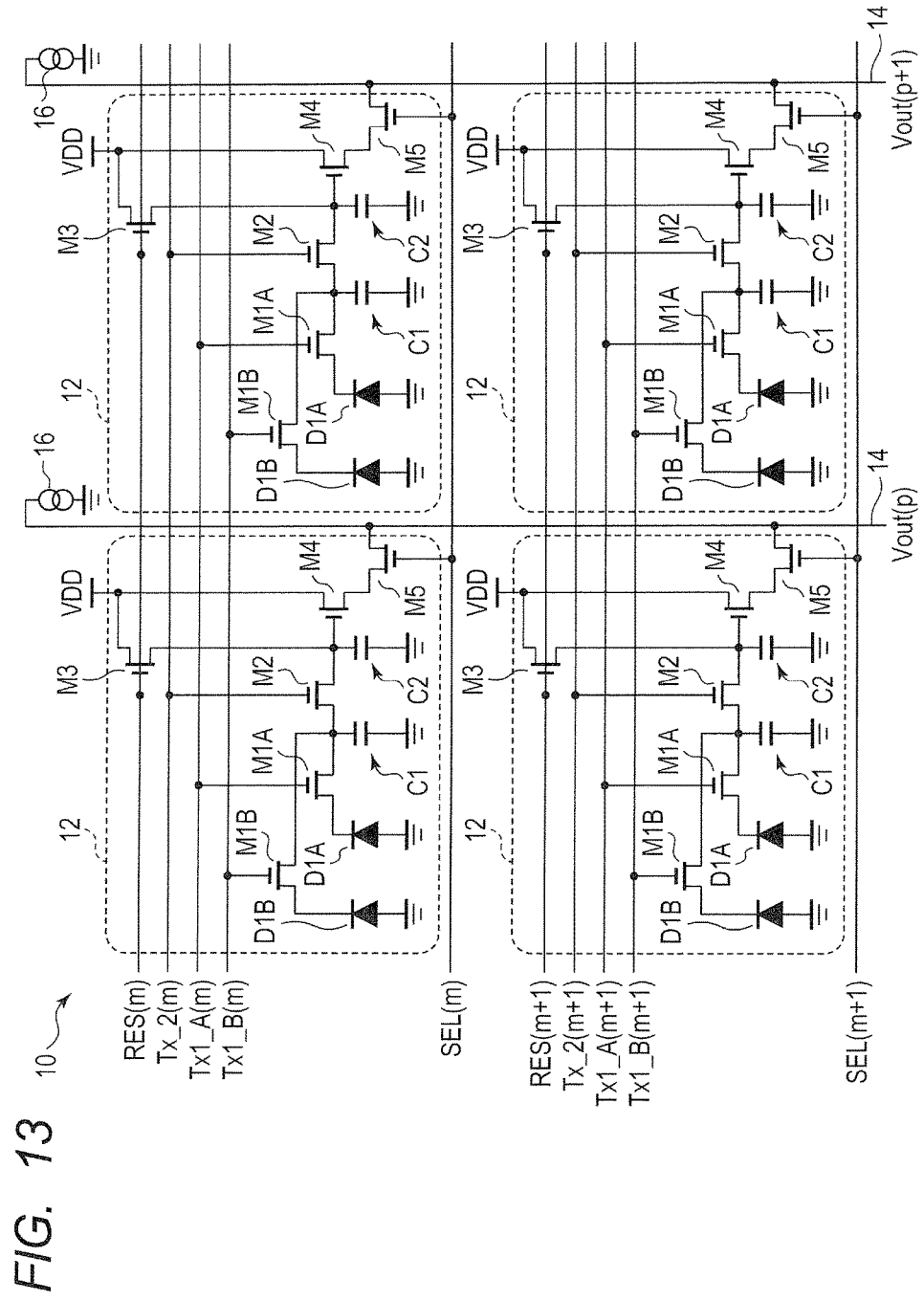
FIG. 13 is a diagram illustrating an example of configuration of a pixel circuit of an imaging device according to a fifth embodiment of the present invention.
Figure 14:
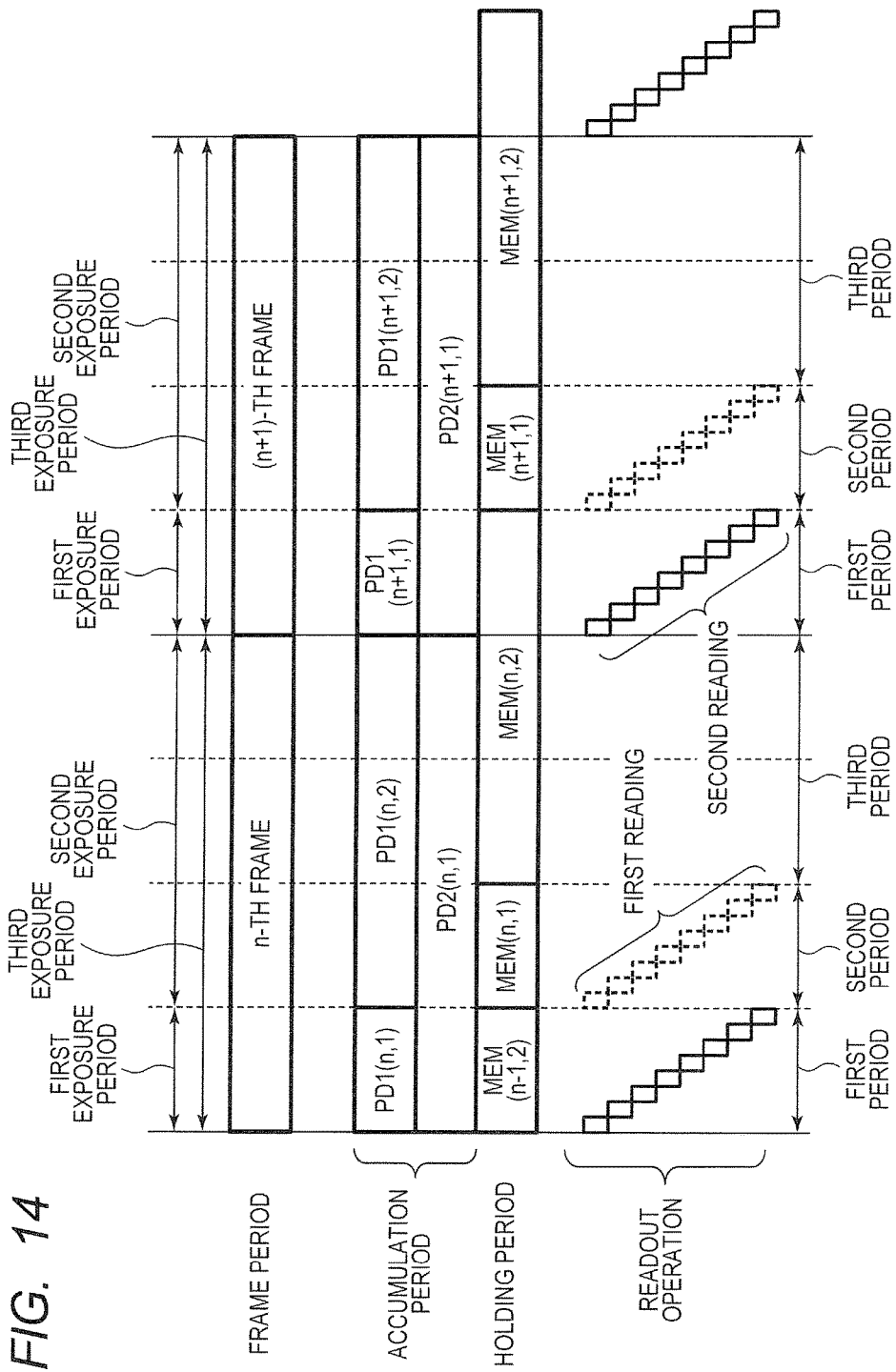
FIG. 14 is a schematic diagram illustrating an operation of the imaging device according to the fifth embodiment of the present invention.
Figure 15:
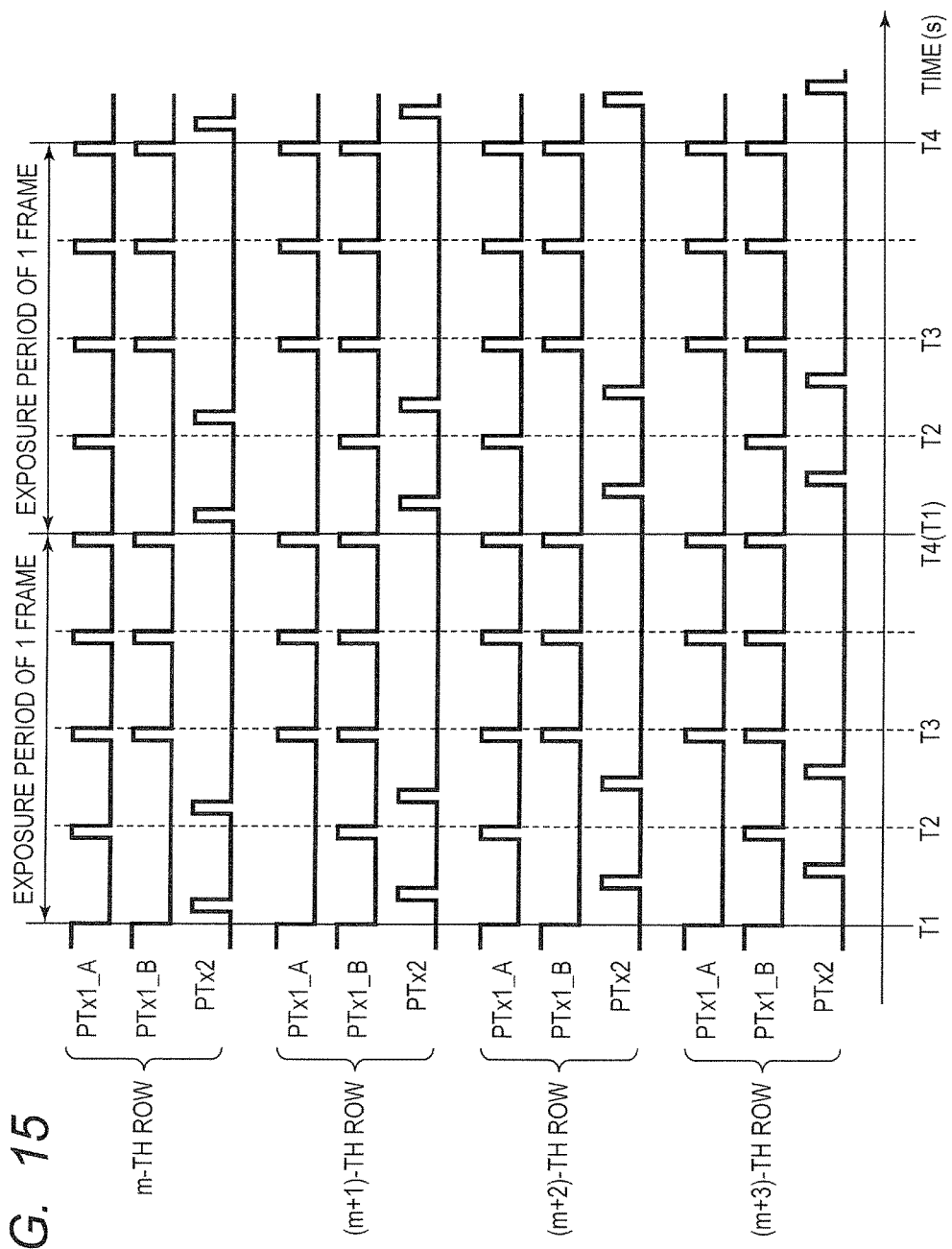
FIG. 15 is a timing chart illustrating the operation of the imaging device according to the fifth embodiment of the present invention.

An imaging device according to a fifth embodiment of the present invention will be described with reference to FIGS. 13 to 15. The same reference signs are provided to the same constituent elements as in the imaging devices according to the first to fourth embodiments illustrated in FIGS. 1 to 12, and the description will be omitted or simplified. FIG. 13 is a circuit diagram illustrating an example of configuration of a pixel circuit of the imaging device according to the present embodiment. FIG. 14 is a schematic diagram illustrating an operation of the imaging device according to the present embodiment. FIG. 15 is a timing chart illustrating the operation of the imaging device according to the present embodiment.

First, a configuration of the imaging device 100 according to the present embodiment will be described with reference to FIG. 13.

The imaging device 100 according to the present embodiment is the same as the imaging device 100 according to the first embodiment, except that the circuit configuration of the pixels 12 is different. As illustrated in FIG. 13, the pixel 12 of the imaging device 100 according to the present embodiment includes two photoelectric conversion units D1A and D1B. The pixel 12 also includes a transfer transistor M1A for transferring the charge from the photoelectric conversion unit D1A to the holding unit C1, and a transfer transistor M1B for transferring the charge from the photoelectric conversion unit D1B to the holding unit C1.

An anode of a photodiode forming the photoelectric conversion unit D1A is connected to the ground voltage line, and a cathode thereof is connected to a source of the transfer transistor M1A. An anode of a photodiode forming the photoelectric conversion unit D1B is connected to the ground voltage line, and a cathode thereof is connected to a source of the transfer transistor M1B. A drain of the transfer transistor M1A and a drain of the transfer transistor M1B are connected to the source of the transfer transistor M2. The other configuration of the pixel 12 is the same as the pixel 12 of the imaging device 100 according to the first embodiment.

A control line Tx1_A and a control line Tx1_B extending in the row direction are arranged on each row of the pixel array of the pixel array unit 10. Each of the control lines Tx1_A is connected to gates of the transfer transistors M1A of the pixels 12 lined up in the row direction and forms a signal line common to the pixels 12. Each of the control lines Tx1_B is connected to gates of the transfer transistors M1B of the pixels 12 lined up in the row direction and forms a signal line common to the pixels 12.

The control lines Tx1_A and the control lines Tx1_B are connected to the vertical scanning circuit 20. The vertical scanning circuit 20 outputs, to the control lines Tx1_A, a control signals PTx1_A that is a drive pulse for controlling the transfer transistors M1A. The vertical scanning circuit 20 outputs, to the control lines Tx1_B, a control signals PTx1_B that is a drive pulse for controlling the transfer transistors M1B. In a typical example, when the vertical scanning circuit 20 outputs a high-level control signal, the corresponding transistors are on-state. When the vertical scanning circuit 20 outputs a low-level control signal, the corresponding transistors are off-state.

The photoelectric conversion unit D1A and the photoelectric conversion unit D1B are arranged to be substantially conjugated to the pupil of the lens. The photoelectric conversion unit D1A and the photoelectric conversion unit D1B receive luminous fluxes transmitted through different positions of the pupil of the lens. As a result, the focus can be detected based on signal output from the photoelectric conversion unit D1A and signal output from the photoelectric conversion unit D1B. The signal output from the photoelectric conversion unit D1A and the signal output from the photoelectric conversion unit D1B can be added to acquire signal for image. Therefore, according to the pixel configuration illustrated in FIG. 13, the pixels can be used as pixels for focus detection and can be used as pixels for imaging.

Next, a method of driving the imaging device according to the present embodiment will be described with reference to FIGS. 14 and 15.

The driving method according to the present embodiment includes a case in which the same operation as the operation performed for the photoelectric conversion units D1 in the first embodiment is performed for one of the photoelectric conversion units D1A and the photoelectric conversion units D1B. The driving method also includes a case in which the exposure is performed for the other of the photoelectric conversion units D1A and the photoelectric conversion units D1B in all periods of each frame. More specifically, the operation of one of the photoelectric conversion units D1A and D1B includes two types of periods, a short exposure period and a long exposure period, in the exposure period of each frame. Signals generated in the periods are output at different timings. When the focus detection is not performed, the photoelectric conversion units D1A and the photoelectric conversion units D1B may be driven by operation of the same circuit.

FIG. 14 is a schematic diagram illustrating a transition in the operation state of the imaging device with time, and the direction from left to right in FIG. 14 corresponds to the time axis. FIG. 14 illustrates an imaging operation in the n-th frame and the (n+1)-th frame.

As illustrated in FIG. 14, the imaging operation in one frame period includes the first exposure period, the second exposure period and a third exposure period. The first exposure period corresponds to the first period. The second exposure period corresponds to the period of the sum of the second period and the third period. The third exposure period corresponds to a period of a sum of the first period, the second period and the third period. The first exposure period and the second exposure period are performed for one of the photoelectric conversion units D1A and the photoelectric conversion units D1B, and the third exposure period is performed for the other of the photoelectric conversion units D1A and the photoelectric conversion units D1B.

The imaging operation in one frame period includes accumulation periods PD1 (n, 1), PD1 (n, 2) and PD2 (n, 1). The accumulation period PD1 (n, 1) is a period in which the photoelectric conversion units D1 generate or accumulate the charge in the first exposure period. The accumulation period PD1 (n, 2) is a period in which the photoelectric conversion units D1 generate or accumulate the charge in the second exposure period. The accumulation period PD2 (n, 1) is a period in which the photoelectric conversion units D1 generate or accumulate the charge in the third exposure period. When the accumulation periods PD1 (n, 1) and PD1 (n, 2) are performed for the photoelectric conversion units D1A, the accumulation period PD2 (n, 1) is performed for the photoelectric conversion units D1B. When the accumulation period PD2 (n, 1) is performed for the photoelectric conversion units D1A, the accumulation periods PD1 (n, 1) and PD1 (n, 2) are performed for the photoelectric conversion units D1B.

The imaging operation in one frame period also includes part of the holding period MEM (n−1, 2), the holding period MEM (n, 1), and part of the holding period MEM (n, 2). The holding period MEM (n−1, 2) is a period in which the holding units C1 hold the charge generated by the photoelectric conversion units D1 in the second exposure period or the third exposure period of the previous frame ((n−1)-th frame not illustrated). The holding period MEM (n, 1) corresponds to the second period and is a period in which the holding units C1 hold the charge generated by the photoelectric conversion units D1 in the first exposure period of the frame (n-th frame). The holding period MEM (n, 2) is a period in which the holding units C1 hold the charge generated by the photoelectric conversion units D1 in the second exposure period or the third exposure period of the frame. The holding period MEM (n, 2) corresponds to a period from the third period of the frame to the first period of the next frame ((n+1)-th frame).

The imaging operation in one frame period also includes the first readout period and the second readout period. The first readout period is a period for carrying out the readout operation of the signals based on the charge accumulated in the first exposure period. The second readout period is a period for carrying out the readout operation of the signals based on the charge accumulated in the second exposure period and the signals based on the charge accumulated in the third exposure period. The first reading is performed in the second period of the frame, and the second reading is performed in the first period of the next frame.

FIG. 15 schematically illustrates an example of drive pulses used in the method of driving the imaging device according to the present embodiment. FIG. 15 illustrates the control signals PTx1_A supplied to the control lines Tx1_A, the control signals PTx1_B supplied to the control lines Tx1_B, and the control signals PTx2 supplied to the control lines Tx2 of the pixels 12 of m-th to (m+3)-th row. When the control signal is in the high level, the corresponding transistors are on-state. When the control signal is in the low level, the corresponding transistors are off-state.

The exposure of the previous frame (second and third exposure periods) is performed in the period until the time T1. The charge of the previous frame generated before the time T1 is held by the photoelectric conversion units D1A and D1B and the holding units C1. The control signals PTx1_A and PTx1_B are switched to the high level to turn on the transfer transistors M1A and M1B, and the charge generated in the exposure period of the previous frame is all transferred to the holding units C1. The control signals PTx1_A and PTx1_B are switched to the low level at the time T1 to turn off the transfer transistors M1 at the same time in all pixels 12, and the exposure period of the previous frame ends.

When the charge of the previous frame accumulated in the photoelectric conversion units D1A and D1B is all transferred to the holding units C1, the photoelectric conversion units D1A and D1B enter the initial state. More specifically, the photoelectric conversion units D1A and D1B of the pixels 12 of all rows newly start accumulating the charge at the same time at the time T1. The time T1 is a start time of the first exposure period and the third exposure period.

The signals of the previous frame based on the charge transferred to the holding units C1 until the time T1 is sequentially read out after the time T1 (second reading of the previous frame). More specifically, the control signal PTx2 is switched to the high level to turn on the transfer transistors M2, and the charge held by the holding units C1 is transferred to the holding units C2. As a result, the voltage of the input nodes of the amplifier units (gates of the amplifier transistors M4) changes according to the capacitance of the holding units C2 and the amount of transferred charge, and the signals based on the voltage of the input nodes are output to the output lines 14.

The transfer transistors M1A and M1B are kept in off-state from the time T1 to at least the end of the second reading of the previous frame.

After the end of the second reading of the previous frame, the control signals PTx1_A or the control signals PTx1_B are switched to the high level to turn on the transfer transistors M1A or the transfer transistors M1B. In this way, the charge generated by the photoelectric conversion units D1A or the photoelectric conversion units D1B after the time T1 is transferred to the holding units C1. In an example here, the pixels 12 for driving the transfer transistors M1A and the pixels 12 for driving the transfer transistors M1B are selected row by row. For example, as illustrated in FIG. 15, the transfer transistors M1A are driven for the pixels 12 of the m-th and (m+2)-th rows, and the transfer transistors M1B are driven for the pixels 12 of the (m+1)-th and (m+3)-th rows. As a result, the charge generated by the photoelectric conversion units D1A in the first exposure period is transferred to the holding units C1 in the pixels 12 of the m-th and (m+2)-th rows. The charge generated by the photoelectric conversion units D1B in the first exposure period is transferred to the holding units C1 in the first exposure period in the pixels 12 of the (m+1)-th and (m+3)-th rows.

At the time T2, the control signals PTx1_A and PTx1_B of the high level are switched to the low level to turn off the transfer transistors M1A and M1B at the same time, and the first exposure period ends. The time T2 is the end time of the first exposure period. The photoelectric conversion units D1A and D1B enter the initial state after the held charge is transferred to the holding units C1. More specifically, the photoelectric conversion units D1A of the pixels 12 of the m-th and (m+2)-th rows and the photoelectric conversion units D1B of the pixels 12 of the (m+1)-th and (m+3)-th rows newly start accumulating the charge at the same time at the time T2. The time T2 is the start time of the second exposure period. The charge generated in the pixels 12 in the first exposure period is held by the holding units C1 after the time T2 (holding period MEM (n, 1)). The charge generated after the time T2 is accumulated in the photoelectric conversion units D1A and D1B, and the holding units C1 can hold the charge generated in the first exposure period when the transfer transistors M1A and M1B are off-state.

The photoelectric conversion units D1B of the pixels 12 of the m-th and (m+2)-th rows and the photoelectric conversion units D1A of the pixels 12 of the (m+1)-th and (m+3)-th rows still hold the charge generated in the first period.

The signals based on the charge transferred to the holding units C1 until the time T2 are sequentially read out (first reading) after the time T2.

In this way, the signals based on the charge accumulated in the photoelectric conversion units D1A and the signals based on the charge accumulated in the photoelectric conversion units D1B in the first period can be output as signals for focus detection.

The transfer transistors M1A and M1B are kept in off-state from the time T2 until at least the end of the first reading. The charge generated by the photoelectric conversion units D1A and D1B in the period after the time T2 and before the transfer transistors M1A and M1B are first turned on is accumulated in the photoelectric conversion units D1A and D1B.

After the end of the first reading, the control signals PTx1_A and PTx1_B are switched to the high level to turn on the transfer transistors M1A and M1B, and the charge held by the photoelectric conversion units D1A and D1B is transferred to the holding units C1. In the example of the present embodiment, the transfer transistors M1A and M1B are intermittently turned on three times after the end of the first reading as illustrated in FIG. 15. The timing of falls of the control signals PTx1_A and PTx1_B in the first intermittent drive is the time T3, and the timing of falls of the control signals PTx1_A and PTx1_B in the third intermittent drive is the time T4.

In this case, the charge generated in the first period is held in the photoelectric conversion units D1B of the pixels 12 of the m-th and (m+2)-th rows. Therefore, in the pixels 12 of the m-th and (m+2)-th rows, the charge accumulated in the photoelectric conversion units D1B in the first period and the charge accumulated in the photoelectric conversion units D1A and D1B in the second period are transferred to the holding units C1 in the first intermittent drive. The charge is similarly transferred from the photoelectric conversion units D1A and D1B to the holding units C1 in the subsequent intermittent drives. At the time T4 after the third intermittent drive, the charge generated by the photoelectric conversion units D1B in the first period and the charge generated by the photoelectric conversion units D1A and D1B in the second period and the third period are transferred to the holding units C1.

The charge generated in the first period is held in the photoelectric conversion units D1A of the pixels 12 of the (m+1)-th and (m+3)-th rows. Therefore, in the pixels 12 of the (m+1)-th and (m+3)-th rows, the charge accumulated in the photoelectric conversion units D1A in the first period and the charge accumulated in the photoelectric conversion units D1A and D1B in the second period are transferred to the holding units C1 in the first intermittent drive. The charge is similarly transferred from the photoelectric conversion units D1A and D1B to the holding units C1 in the subsequent intermittent drives. At the time T4 after the third intermittent drive, the charge generated by the photoelectric conversion units D1A in the first period and the charge generated by the photoelectric conversion units D1A and D1B in the second period and the third period are transferred to the holding units C1.

The reason that the transfer transistors M1A and M1B are intermittently driven is the same as in the first embodiment. The number of times that the transfer transistors M1A and M1B are intermittently driven in the second period and the third period is not particularly limited, and the transfer transistors M1A and M1B may be kept in on-state in the second period and the third period.

At the time T4, the control signals PTx1_A and PTx1_B of all rows are switched from the high level to the low level to control the transfer transistors M1A and M1B of the pixels 12 of all rows to turn off at the same time. As a result, the exposure period of one frame ends.

In the first period of the next (n+1)-th frame, the signals based on the charge generated until the third period of the n-th frame are read out in the same way as the second reading of the (n−1)-th frame.

In this case, the signals read out from the pixels 12 of the m-th and (m+2)-th rows are signals based on total charge equivalent to a sum of the charge generated by the photoelectric conversion units D1A in the second exposure period and the charge generated by the photoelectric conversion units D1B in the third exposure period. When the driving method of FIG. 5B without the execution of the reset operation between the first reading and the second reading is used, the signals are based on total charge generated by the photoelectric conversion units D1A and D1B in the third exposure period.

The signals read out from the pixels 12 of the (m+1)-th and (m+3)-th rows are signals based on total charge equivalent to a sum of the charge generated by the photoelectric conversion units D1B in the second exposure period and the charge generated by the photoelectric conversion units D1A in the third exposure period. When the driving method of FIG. 5B without the execution of the reset operation between the first reading and the second reading is used, the signals are based on total charge generated by the photoelectric conversion units D1A and D1B in the third exposure period.

In this way, the signals based on the charge accumulated in the photoelectric conversion units D1A and D1B between the first period and the third period can be output as signals for image.

In the example of FIG. 15, the drive timings of the transfer transistors M1A and M1B of the m-th and (m+2)-th rows coincide. The drive timings of the transfer transistors M1A and M1B of the (m+1)-th and (m+3)-th rows also coincide. However, the drive timings of the transfer transistors M1A and M1B of each row can be appropriately selected as long as the photoelectric conversion units D1A and the photoelectric conversion units D1B output the signals for focus detection.

The control lines Tx1_A and Tx1_B can be arranged in an arbitrary combination with respect to the transfer transistors M1A and M1B. More specifically, the pixels 12 provided with the transfer transistors M1A connected to the control line Tx1_A and the pixels 12 provided with the transfer transistors M1B connected to the control line Tx1_A may be included in the same row. The pixels 12 provided with the transfer transistors M1A connected to the control line Tx1_B and the pixels 12 provided with the transfer transistors M1B connected to the control line Tx1_B may be included in the same row.

In the focus detection and imaging, the drive may not be performed in all pixels 12 as long as the pixel array unit 10 includes a plurality of pixels 12 in which the drive illustrated in FIG. 15 is performed. In this case, the drive according to any one of the first to fourth embodiments or drive in another format may be performed for the pixels 12 in which the drive described in FIG. 15 is not performed.

In the method of driving the imaging device according to the present embodiment, the signals for focus detection can be acquired at a timing different from the signals for image, prior to the signals for image. As a result, high-speed focus detection operation can be performed.

In this way, according to the present embodiment, the global electronic shutter operation can be performed while suppressing the saturation of pixels. The signals for focus detection can be acquired at a timing different from the signals for image, prior to the signals for image. As a result, the focus detection can be speeded up.

Sixth Embodiment

A sixth embodiment of the present invention will be described with reference to FIGS. 1 and 16 to 18. FIG. 1 is a block diagram illustrating a schematic configuration of an imaging device according to the present embodiment. The imaging device includes the pixel array unit 10, the vertical scanning circuit 20, the column amplifier circuit 30, the horizontal scanning circuit 40, the output circuit 60 and the control circuit 50. The pixel array unit 10 includes the plurality of pixels 12 arranged in a matrix of X and Y. The vertical scanning circuit 20 supplies control signals for controlling transistors of the pixels 12 in on-state (conductive state) or off-state (non-conductive state). A logic circuit, such as a shift register and an address decoder, can be used as the vertical scanning circuit 20. The column signal line (also written as "output line" in the present specification) 14 is provided on each column of the pixels 12, and signals from the pixels 12 are read out to the column signal line 14 in each column. The column amplifier circuit 30 amplifies pixel signals output to the column signal lines 14 and executes a correlated dual sampling process based on signals at reset and signals at photoelectric conversion. The horizontal scanning circuit supplies a control signal for controlling a switch connected to an amplifier of the column amplifier circuit 30 in on-state or off-state. The output circuit 60 includes a buffer amplifier, a differential amplifier and the like and outputs pixel signals from the column amplifier circuit 30 to a signal processing unit outside of the imaging device. An AD conversion unit may be provided on the imaging device to output digital image signals.

Figure 16:
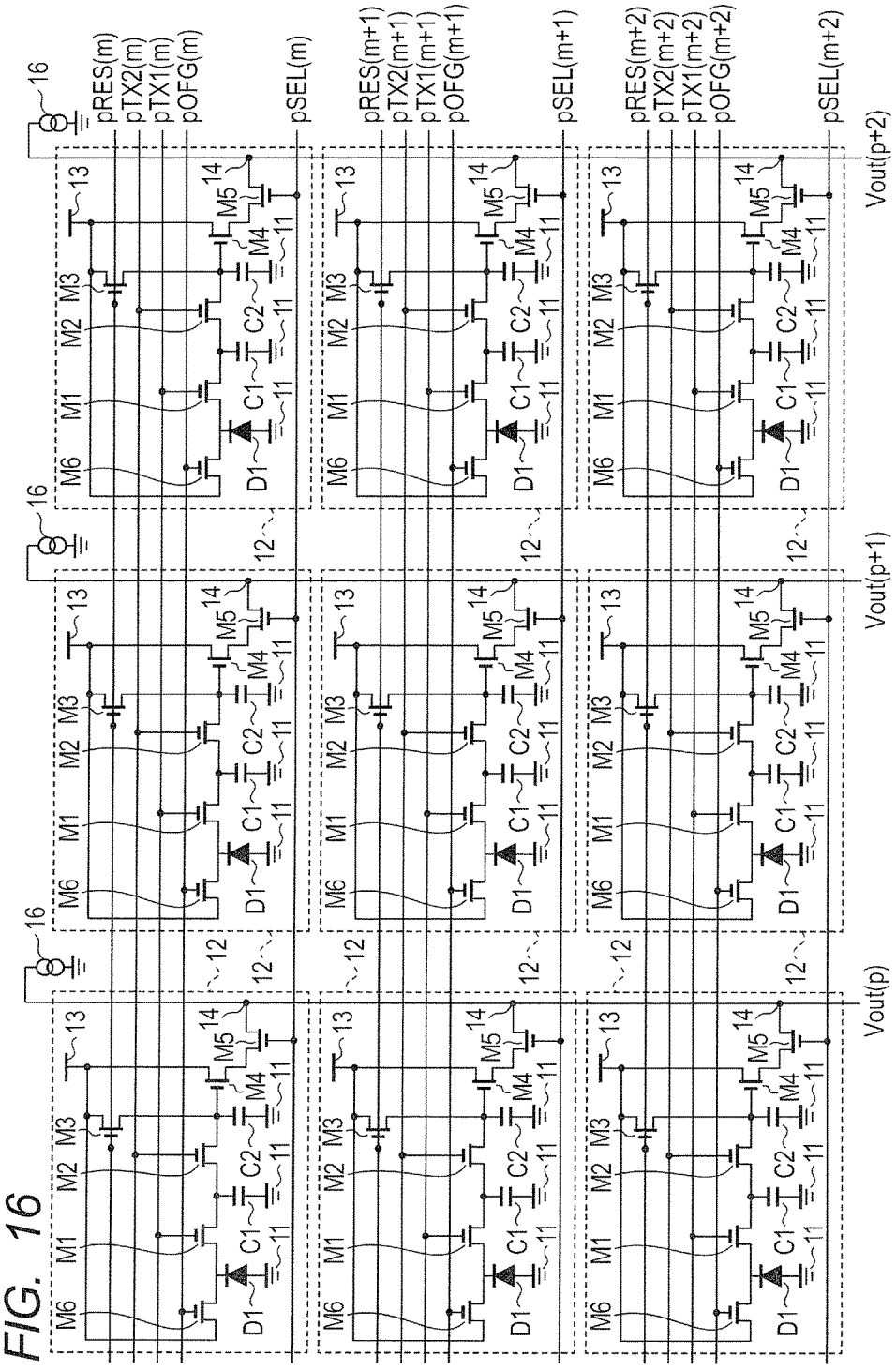
FIG. 16 is a diagram illustrating an equivalent circuit of pixels included in an imaging device according to a sixth embodiment of the present invention.

FIG. 16 illustrates an equivalent circuit of the pixels 12 in the imaging device according to the present embodiment. Although FIG. 16 illustrates nine pixels 12 of three rows and three columns among the plurality of pixels 12 two-dimensionally arranged in the row direction and the column direction, the imaging device includes more pixels 12.

Each of the plurality of pixels 12 includes the photoelectric conversion unit D1, the holding unit C1, the first transfer transistor M1, the second transfer transistor M2, the overflow transistor M6, the select transistor M5, the reset transistor M3 and the amplifier transistor M4.

The photoelectric conversion unit D1 photoelectrically converts incident light and accumulates photoelectrically converted charge. The first transfer transistor M1 is turned on to transfer the charge of the photoelectric conversion unit D1 to the holding unit C1. The holding unit C1 holds the charge transferred from the photoelectric conversion unit D1. In the circuit diagram, the holding unit C1 is expressed as a capacitor in which one of the nodes is connected to a ground terminal 11.

The second transfer transistor M2 is turned on to transfer the charge of the holding unit C1 to the floating diffusion (also written as "holding unit" in the present specification) C2 that is an input node (gate node) of the amplifier transistor M4. The amplifier transistor M4 forms a source follower and outputs a signal based on the voltage of the floating diffusion C2 to the column signal line 14 via the select transistor M5. The current source 16 is connected to the column signal line 14. The reset transistor M3 is turned on to reset the voltage of the floating diffusion C2 by the voltage of a power supply terminal 13. The voltage output to the column signal 14 of a p-th column will be called Vout (p). The overflow transistor M6 is turned on to discharge the charge generated by the photoelectric conversion unit D1 to a node (overflow drain) having the voltage of the power supply terminal 13.

The vertical scanning circuit 20 supplies common control signals to the pixels 12 of the same row. More specifically, control signals pTX1 (m), pTX2 (m), pSEL (m) and pRES (m) are supplied to the first transfer transistors M1, the second transfer transistors M2, the select transistors M5 and the reset transistors M3, respectively, of the pixels 12 of the m-th row. A control signal pOFG (m) is supplied to the overflow transistors M6. The transistors are on-state when the control signal is in a high level and are off-state when the control signal is in a low level. The transistors can be, for example, MOS transistors.

The configuration allows performing an imaging operation, that is, a global electronic shutter operation, in which periods of the photoelectric conversion by the plurality of pixels 12 coincide. The overflow transistor M6 is connected to the photoelectric conversion unit D1, and the charge generated by the photoelectric conversion unit D1 while the holding unit C1 hold the charge can be accumulated in the photoelectric conversion unit D1. Alternatively, the charge generated by the photoelectric conversion unit D1 can be discharged via the overflow transistors M6 without accumulating the charge in the photoelectric conversion unit D1. As a result, the exposure time can be controlled.

The imaging device of the present embodiment can be used for photographing of moving images. To photograph moving images, the imaging device acquires, in each predetermined period (frame period), a plurality of images included in the moving images.

The exposure denotes that the charge generated by the photoelectric conversion by the photoelectric conversion unit D1 is accumulated or held as signal. The exposure period denotes a period from the start to the end of the exposure in each frame period. The exposure time denotes a length of the exposure period.

Figure 17:
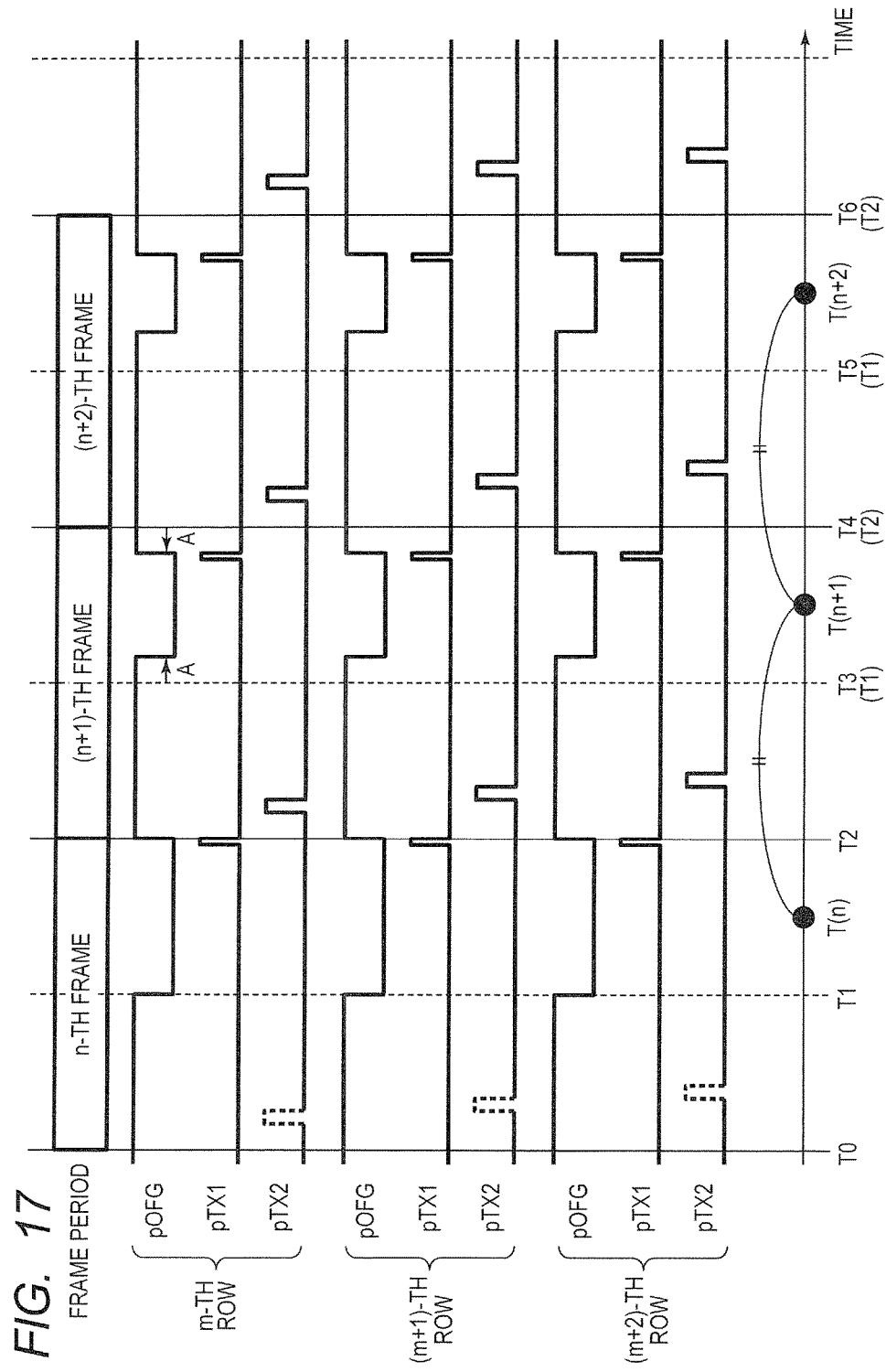
FIG. 17 is a timing diagram illustrating an operation timing of the imaging device according to the sixth embodiment of the present invention.
Figure 18:
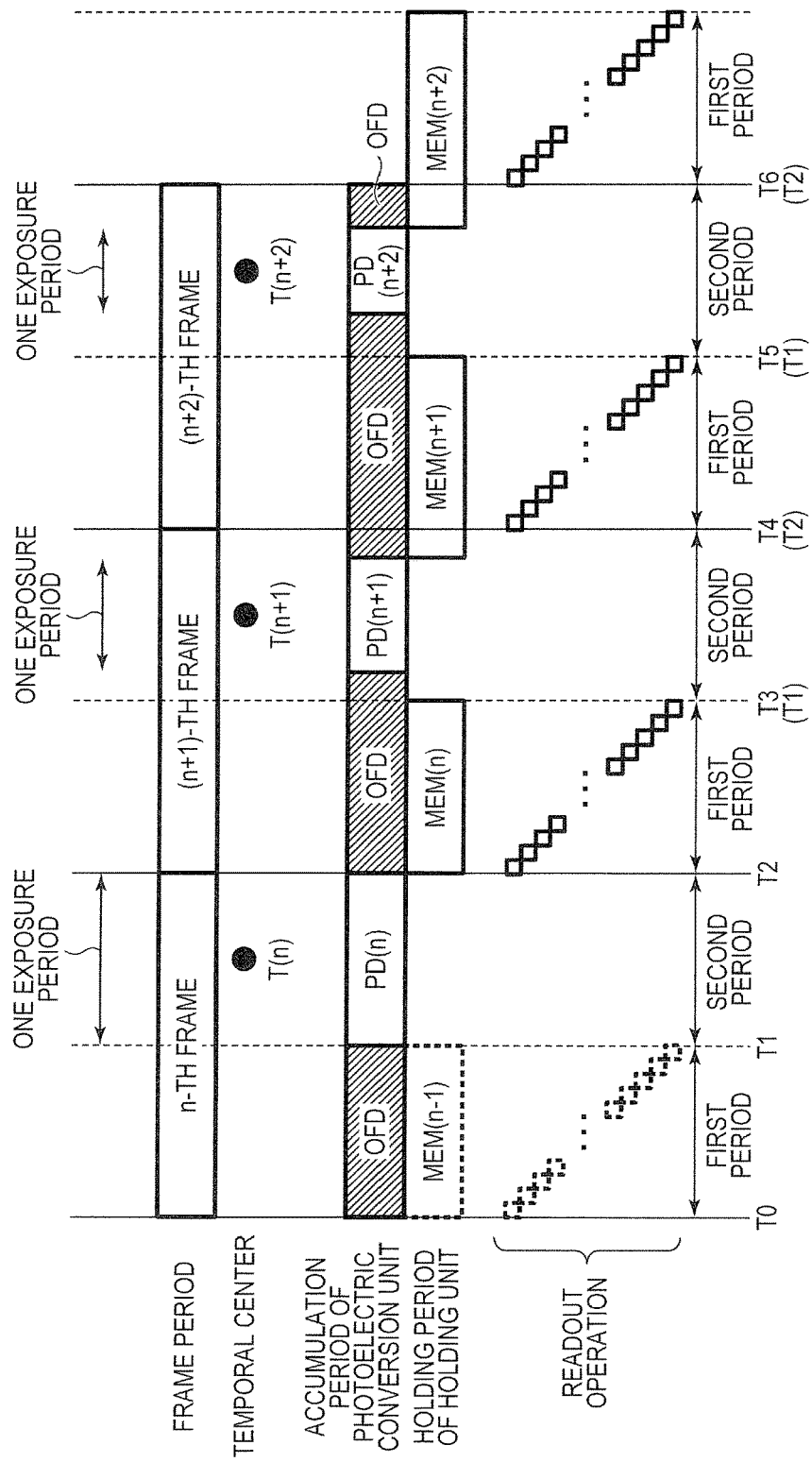
FIG. 18 is a schematic diagram illustrating a readout operation in each frame according to the sixth embodiment of the present invention.

Next, a method of driving the imaging device of the sixth embodiment will be described with reference to FIGS. 17 and 18. FIG. 17 is a timing diagram illustrating an operation timing of the imaging device according to the sixth embodiment. FIG. 18 is a schematic diagram illustrating a readout operation in each frame according to the sixth embodiment. FIGS. 17 and 18 illustrate an imaging operation from the n-th frame to the (n+2)-th frame with different exposure times among the periods (frame periods) for photographing each of the plurality of still images included in the moving images.

As illustrated in FIG. 18, the exposure time of the (n+1)-th frame is shorter than the exposure time of the n-th frame, and the exposure time of the (n+2)-th frame is shorter than the exposure time of the (n+1)-th frame. FIG. 17 illustrates the control signals pTX1, pTX2 and pOFG supplied from the vertical scanning circuit 20, for the pixels of the m-th to (m+2)-th rows.

In a period before the time T1, the control signals pTX2 of the rows are sequentially switched to the high level. As a result, the charge accumulated in the period of the frame before the n-th frame ((n−1)-th frame not illustrated) is sequentially transferred from the holding units C1 to the floating diffusions C2, and the signals are read out. The time T1 is a time at which the reading is completed. In FIGS. 17 and 18, the operation of the frame before the n-th frame is illustrated by dotted lines.

The exposure of the n-th frame in the present embodiment is performed in part or all of the periods between the time T1 and the time T2. The control signals pTX1 are in the low level at the start time (time T1 in the n-th frame) of the exposure period, and the first transfer transistors M1 are kept in off-state. At the same moment, the control signal pOFG is switched from the high level to the low level at the same time in all rows, and the overflow transistors M6 are turned off at the same time in all pixels. As the overflow transistors M6 are turned off, the accumulation of the charge in the photoelectric conversion units D1 is started.

In the present specification, the "same time" is not limited to exactly the same moment, but includes a case in which the operation of the imaging device is substantially at the same time. For example, the "same time" also includes a case with an operation time difference due to a delay time of a control signal and a case provided with a slight operation time difference due to the design without substantially causing a problem in the operation. Even when the timing diagrams and the like illustrate that a plurality of signals change at the same moment, the change is not limited to a change at exactly the same moment as described above, and it is not intended to exclude a case in which there is a time difference in the signals.

Subsequently, the control signals pTX1 are switched from the low level to the high level at the same time in all rows, and the first transfer transistors M1 are turned on at the same time in all pixels. As a result, the charge accumulated in the photoelectric conversion units D1 is transferred to the holding units C1. Subsequently, the control signal pTX1 is switched to the low level at the same time in all rows. The time is the end time of the exposure period (time T2 in the n-th frame).

After the control signals pTX1 are switched to the low level at the same time in all rows, the control signals pOFG are switched from the low level to the high level at the same time in all rows, and the overflow transistors M6 are turned on at the same time in all pixels. Hereafter, the charge generated by the photoelectric conversion units D1 is discharged to the overflow drains via the overflow transistors M6. From the time T2, the control signals pTX2 of the rows are sequentially switched to the high level. As a result, the charge accumulated in the exposure period of the n-th frame is sequentially transferred from the holding units C1 to the floating diffusions C2, and the signals are read out.

In a period from the time T2 to the time T3 after the first period, the first transfer transistors M1 are kept in off-state. In the present embodiment, the first transfer transistors M1 of all pixels 12 are kept in off-state. However, the first transfer transistors M1 may be kept in off-state from the time T2 to the time T3 in at least one pixel.

In the period from the time T2 to the time T3 after the first period (first period in the (n+1)-th frame), the control signal pOFG is in the high level, and the overflow transistors M6 are kept in on-state. In the present embodiment, the overflow transistors M6 of all pixels 12 are kept in on-state in the first period. However, the overflow transistors M6 may be kept in on-state from the time T2 to the time T3 in at least one pixel. The charge generated in the first period is discharged to the overflow drains via the overflow transistors M6.

Meanwhile, in the first period of the (n+1)-th frame, the holding units C1 hold the charge generated in the n-th frame. In the period, the charge held by the holding units C1 is sequentially transferred to the floating diffusions C2. The voltage of the floating diffusions C2 changes according to the capacitance of the floating diffusions C2 and the amount of transferred charge. The amplifier transistors M4 sequentially output the signals based on the voltage of the floating diffusions C2 to the column signal lines 14. The readout operation is performed in each pixel from the pixels of the first row to the pixels of the last row. The time T3 is a time corresponding to the time T1 of the previous frame and is a time of the completion of the operation of sequentially reading out, to the floating diffusions C2, the charge transferred to the holding units C1 in the n-th frame.

As described, the exposure period of the n-th frame is a period from the time T1 to the time T2. A temporal center T(n) in the exposure period of the n-th frame is provided by the following Expression (1).

$$T(n)=(T1+T2)/2 \quad (1)$$

Next, the (n+1)-th frame with a shorter exposure period than the n-th frame will be described. At time (T3+A) that is a time period A after the time T3, the control signals pOFG are switched to the low level, and the overflow transistors M6 are turned off at the same time in all pixels. As a result, the accumulation of the charge in the photoelectric conversion units D1 is started. Therefore, the time (T3+A) is the exposure start time of the (n+1)-th frame.

Subsequently, the control signals pTX1 are switched to the high level to turn on the first transfer transistors M1 at the same time in all pixels, and the transfer of the charge from the photoelectric conversion units D1 to the holding units C1 is started. Subsequently, at time (T4−A) that is the time period A before the time T4, the control signals pTX1 are switched to the low level, and the first transfer transistors M1 are turned off at the same time in all pixels. The time (T4−A) is the exposure end time of the (n+1)-th frame. Subsequently, the control signals pOFG are switched to the high level at the same time in all pixels, and the overflow transistors M6 are turned on at the same time in all pixels.

As described, the exposure period of the (n+1)-th frame is a period from the time (T3+A) to the time (T4−A). A temporal center T(n+1) in the exposure period of the (n+1)-th frame is provided by the following Expression (2).

$$T(n+1)=\{(T3+A)+(T4-A)\}/2=(T3+T4)/2 \quad (2)$$

The time T3 is a time one frame period after the time T1, and the time T4 is a time one frame period after the time T2. Therefore, a time interval between the temporal center T(n+1) in the exposure period of the (n+1)-th frame and the temporal center T(n) in the exposure period of the n-th frame is equivalent to the length of one frame period. Thus, positions of the temporal centers of the exposure periods in the n-th frame and the (n+1)-th frame are even with respect to the frame periods that the temporal centers belong. Note that the length of one frame period can be defined as, for example, an interval between the temporal center of the n-th frame and the temporal center of the (n+1)-th frame. The length of the frame period can also be defined as a length of a period from the start time T2 to the end time T4 of the (n+1)-th frame.

In other words, this can be described as follows. The exposure period of the first frame period will be referred to as a first exposure period, and the exposure period of the second frame will be referred to as a second exposure period. The first frame period corresponds to the n-th frame of the present embodiment, and the second frame period corresponds to the (n+1)-th frame of the present embodiment. In this case, the interval between the temporal center of the first exposure period and the temporal center of the second exposure period is equivalent to the length of one frame period (for example, interval between the temporal center of the first frame period and the temporal center of the second frame period). The relationship is the same when it is interpreted that the first frame period corresponds to the (n+1)-th frame of the present embodiment and that the second frame period corresponds to the (n+2)-th frame of the present embodiment. In this way, when the relationship is sequentially applied to arbitrary n, the intervals between the temporal centers of the exposure periods between adjacent frames all correspond to the length of one frame period and are a constant value. From another point of view, the accumulation operation of accumulating the charge generated in a predetermined exposure period is performed for a plurality of times. The plurality of times of accumulation operation includes an accumulation operation with different exposure periods, such as the exposure period of the n-th frame and the exposure period of the (n+1)-th frame of FIG. 18. The temporal centers of the exposure periods are at constant intervals in the plurality of times of accumulation operation. The constant interval is typically equal to the length of the frame period. For example, the constant interval is 1/60 seconds in photographing of moving images at 60 fps.

An effect of the present embodiment will be described with reference to FIG. 18.

FIG. 18 illustrates exposure periods in the frames, periods that the photoelectric conversion units D1 accumulate the charge (accumulation periods of the photoelectric conversion units), and periods that the holding units C1 hold the charge (holding periods of the holding units). The section "ACCUMULATION PERIOD OF PHOTOELECTRIC CONVERSION UNIT" indicates "PD(n)" and the like for the periods that the photoelectric conversion units D1 generate and accumulate the charge. The periods that the charge is discharged from the photoelectric conversion units D1 to the overflow drains via the overflow transistors M6 are indicated by "OFD", and the frames are hatched. The section "HOLDING PERIOD OF HOLDING UNIT" indicates "MEM(n)" and the like for the periods that the charge is transferred from the photoelectric conversion units D1 to the holding units C1 and that the holding units C1 hold the charge. As illustrated in FIG. 18, the readout operation of a plurality of pixels is sequentially performed in the first period. The readout operation is an operation including the transfer of the charge from the holding units C1 to the floating diffusions C2 by the second transfer transistors M2 and the output of the signals from the amplifier transistors M4.

In the present embodiment, the exposure periods are different from each other in three frame periods from the n-th frame to the (n+2)-th frame. However, the imaging device can be operated at the operation timing as illustrated in FIG. 17 to make the positions of the temporal centers of the exposure periods in the frames even relative to the frame periods. In other words, the intervals of the temporal centers of the exposure periods between adjacent frames are constant. As a result, an image quality degradation called jerkiness with unnatural motion of a moving subject is unlikely to occur in the photographing of moving images. Therefore, the imaging device with a function of global electronic shutter can photograph moving images with excellent quality even when the exposure times vary between the frames.

Seventh Embodiment

A seventh embodiment of the present invention will be described with reference to FIGS. 19 to 22. In the present embodiment, the driving method of the first transfer transistors M1 is different from the sixth embodiment. The circuit configuration of the imaging device and the operation of the other transistors are the same as in the sixth embodiment, and the description of the common part will be omitted or simplified.

Figure 19:
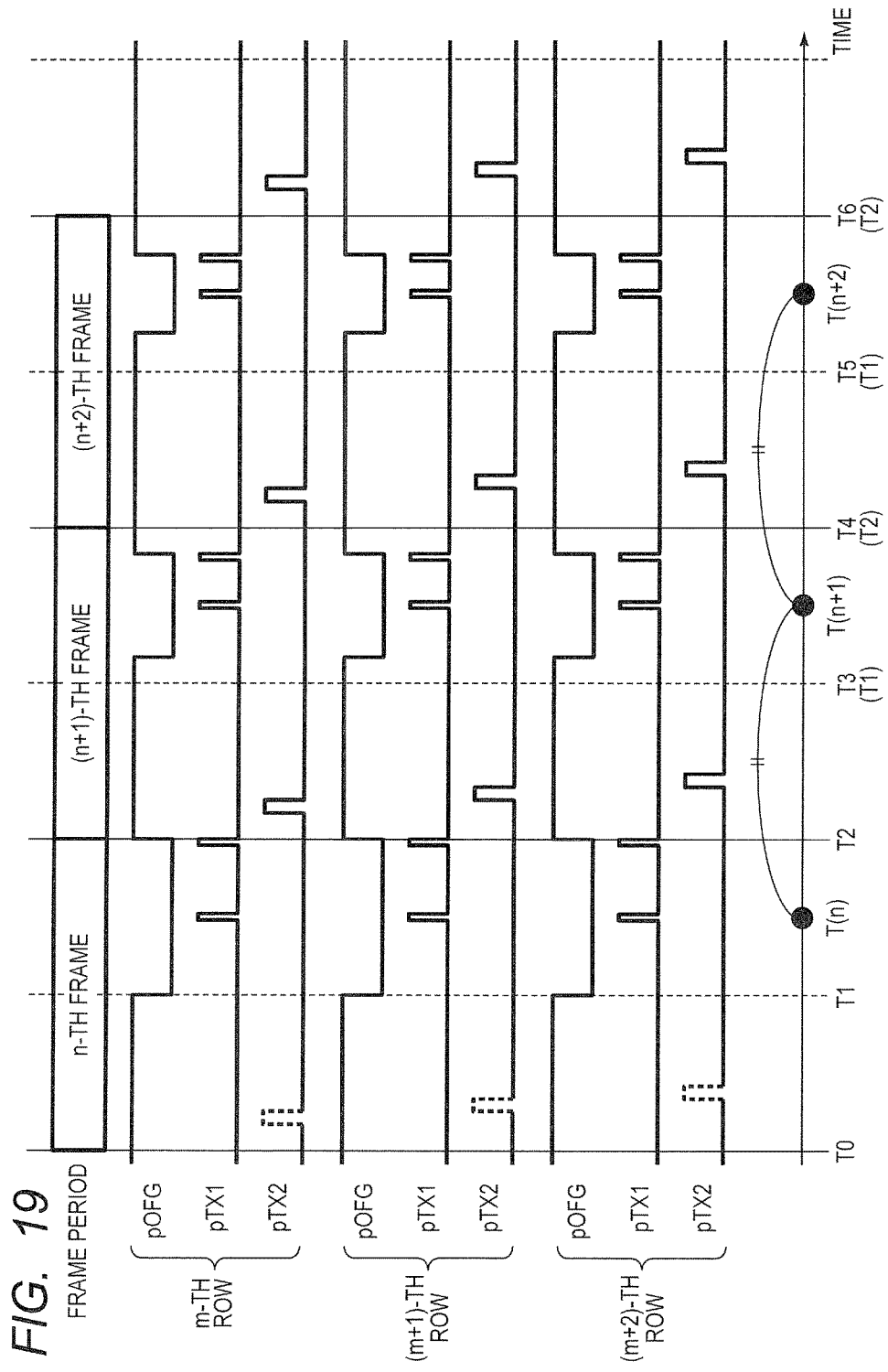
FIG. 19 is a timing diagram illustrating an operation timing of an imaging device according to a seventh embodiment of the present invention.
Figure 20:
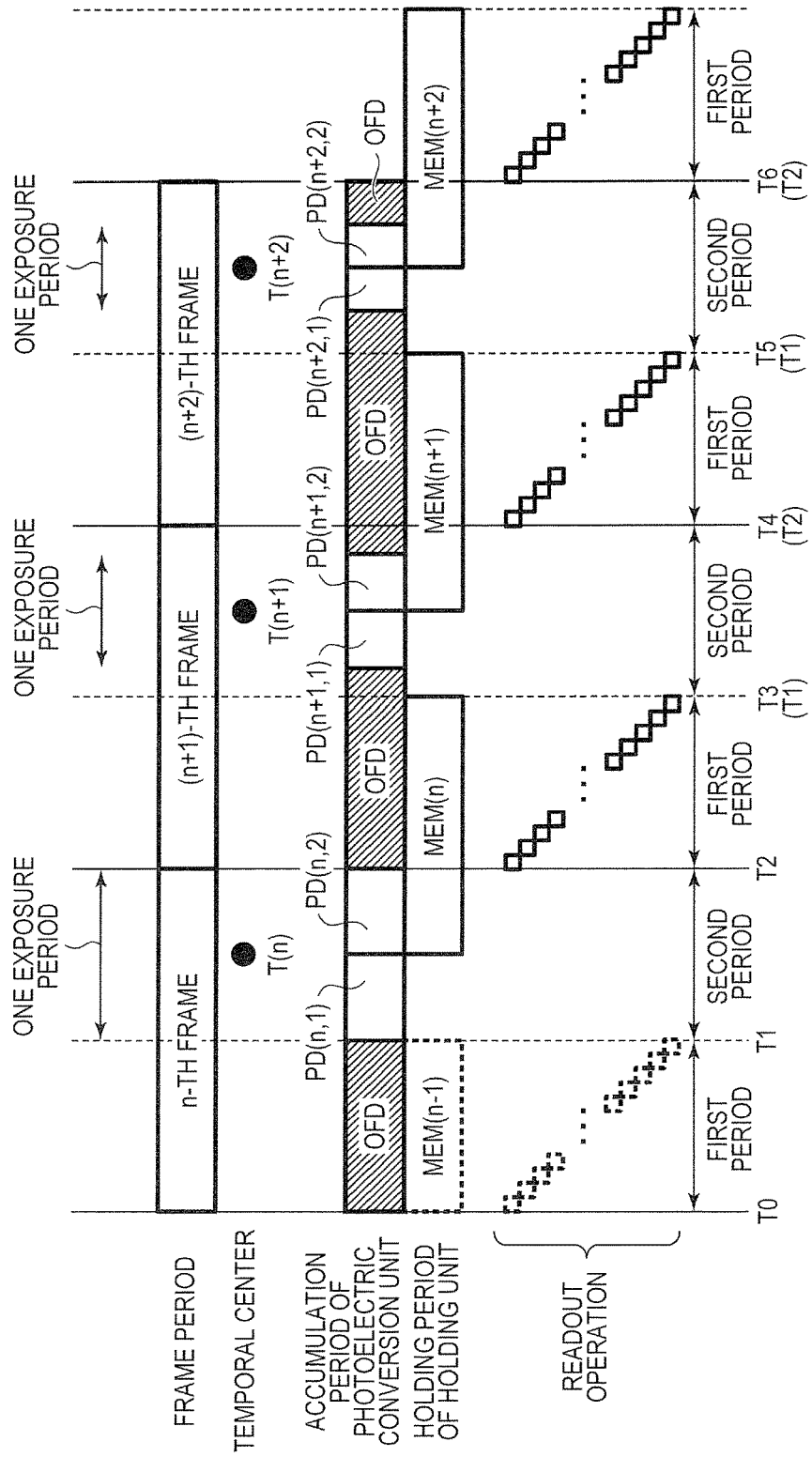
FIG. 20 is a schematic diagram illustrating a readout operation in each frame according to the seventh embodiment of the present invention.

A method of driving the imaging device of the seventh embodiment will be described with reference to FIGS. 19 and 20. FIG. 19 is a timing diagram illustrating an operation timing of the imaging device according to the seventh embodiment. FIG. 20 is a schematic diagram illustrating a readout operation in each frame according to the seventh embodiment.

In the present embodiment, at a time near a middle point of the exposure period from the time T1 to the time T2, the control signals pTX1 are once temporarily switched to the high level at the same time in all rows, and the plurality of first transfer transistors M1 is temporarily turned on at the same time. As a result, all of the charge accumulated in the photoelectric conversion units D1 in the period from the time T1 to the switch of the control signals pTX1 to the high level is transferred to the holding units C1. Subsequently, the control signals pTX1 are switched again to the low level. The plurality of first transfer transistors M1 are turned off at the same time, and the charge is accumulated again in the photoelectric conversion units D1. Therefore, the present embodiment is different from the sixth embodiment in that the charge of the photoelectric conversion units D1 is transferred to the holding units C1 twice in one exposure period, at the time near the middle point of the exposure period and at the end time of the exposure.

An effect of the present embodiment will be described. In the driving method of the present embodiment, the number of times that the charge is transferred from the photoelectric conversion units D1 to the holding units C1 in the exposure period of each frame is different from the sixth embodiment. More specifically, the charge generated by the photoelectric conversion units D1 in one exposure period is transferred to the holding units C1 in two parts in the present embodiment. Therefore, the amount of charge that can be accumulated in one exposure period can be twice the saturation charge amount of the photoelectric conversion units D1, and the saturation charge amount of the pixels 12 can be substantially increased. This can obtain an effect of improving the dynamic range.

Figure 21:
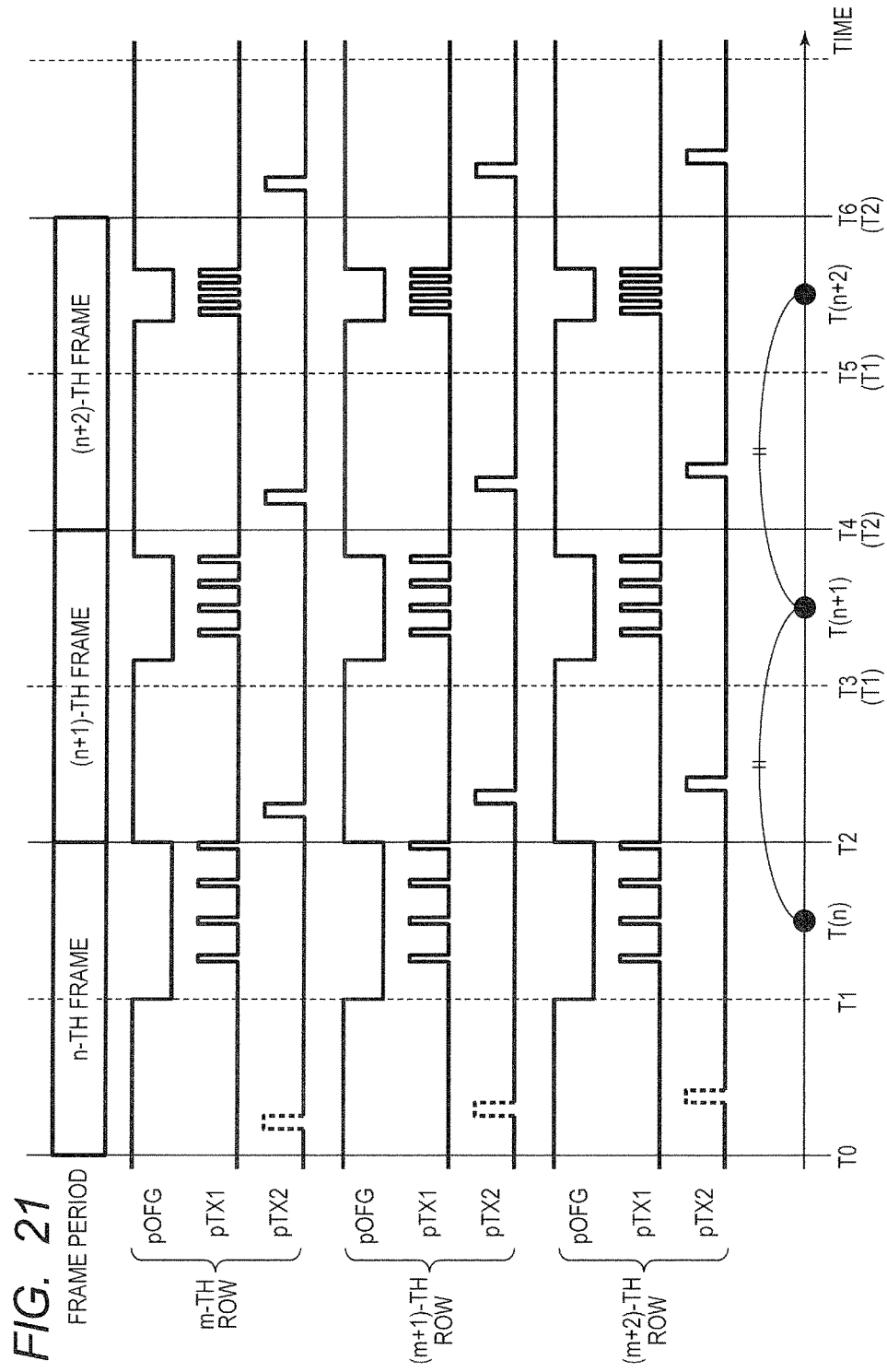
FIG. 21 is a timing diagram illustrating an operation timing of an imaging device according to a modified example of the seventh embodiment of the present invention.
Figure 22:
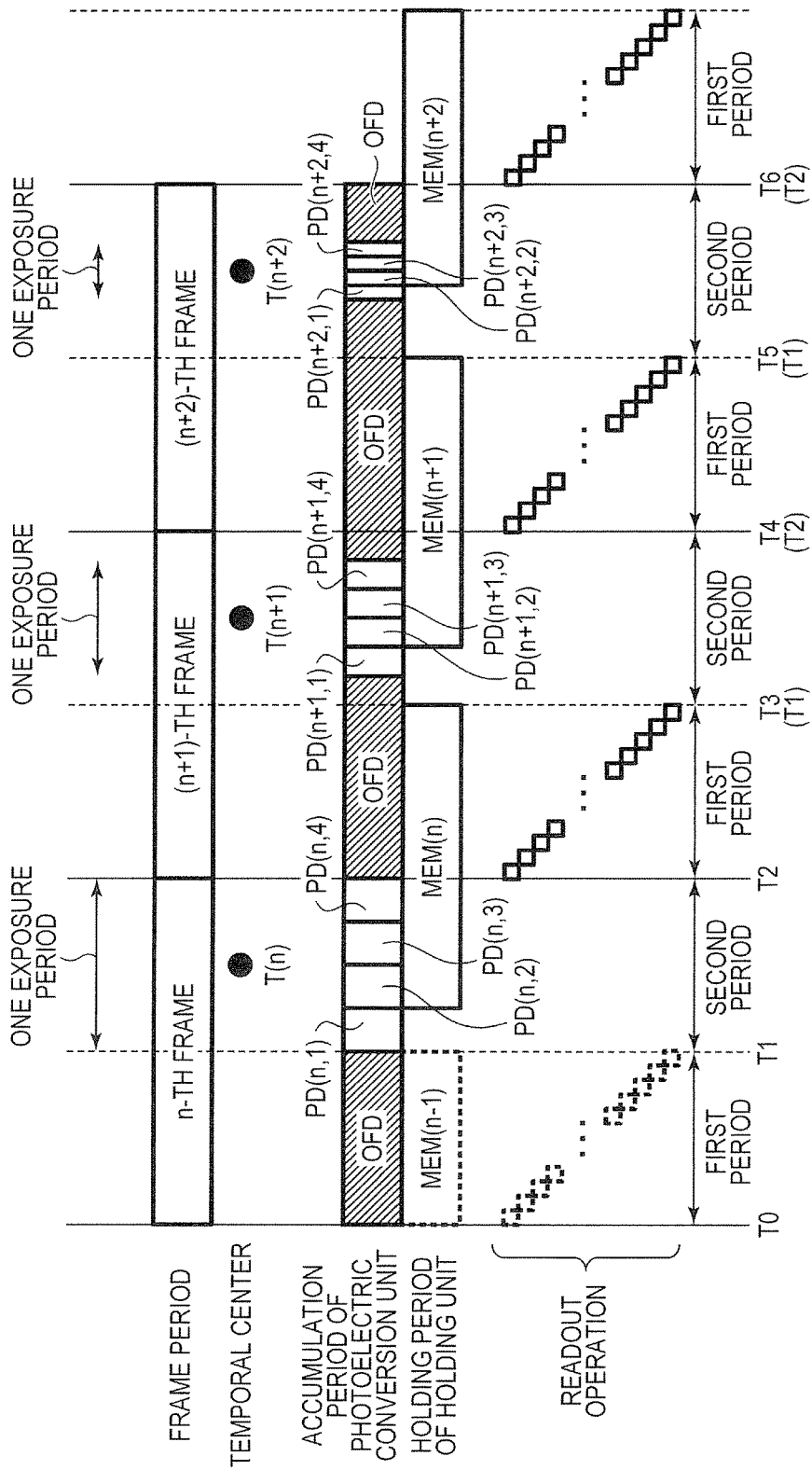
FIG. 22 is a schematic diagram illustrating a readout operation in each frame according to the modified example of the seventh embodiment of the present invention.

Next, a modified example of the present embodiment will be described. FIG. 21 is a timing diagram illustrating an operation timing of the imaging device according to the modified example of the seventh embodiment. FIG. 22 is a schematic diagram illustrating a readout operation in each frame according to the modified example of the seventh embodiment. In the present modified example, the charge of the photoelectric conversion units D1 generated in one exposure period is transferred in four parts. In this case, the amount of charge that can be accumulated in one exposure period can be four times the saturation charge amount of the photoelectric conversion units D1, and the saturation charge amount of the pixels 12 can be substantially increased. Therefore, the number of times of transfer is not limited to two, and the number of times of transfer can be a plurality of times, that is, an arbitrary number of times equal to or greater than two. In this way, the plurality of first transfer transistors M1 is turned on at the same time, and the operation of turning off the first transfer transistors M1 again at the same time is repeated for a plurality of times in the present embodiment. When the number of times of transfer is a plurality of number of times, the time that the first transfer transistors M1 are lastly turned off in the plurality of times of operation of the first transfer transistors M1 is the end time of the exposure period.

In addition to the effect described in the sixth embodiment, the dynamic range in the photographing of moving images can be improved by transferring the charge generated by the photoelectric conversion units D1 in one exposure period to the holding units C1 in a plurality of parts in the present embodiment.

The timing that the control signals pTX1 are switched to the high level to turn on the first transfer transistors M1, or the timing that the control signals pTX1 are switched to the low level to turn off the first transfer transistor M1 can be constant intervals. This is because the saturation charge amount of the photoelectric conversion units D1 can be utilized to the fullest, and the dynamic range can be further improved.

Eighth Embodiment

Figure 23:
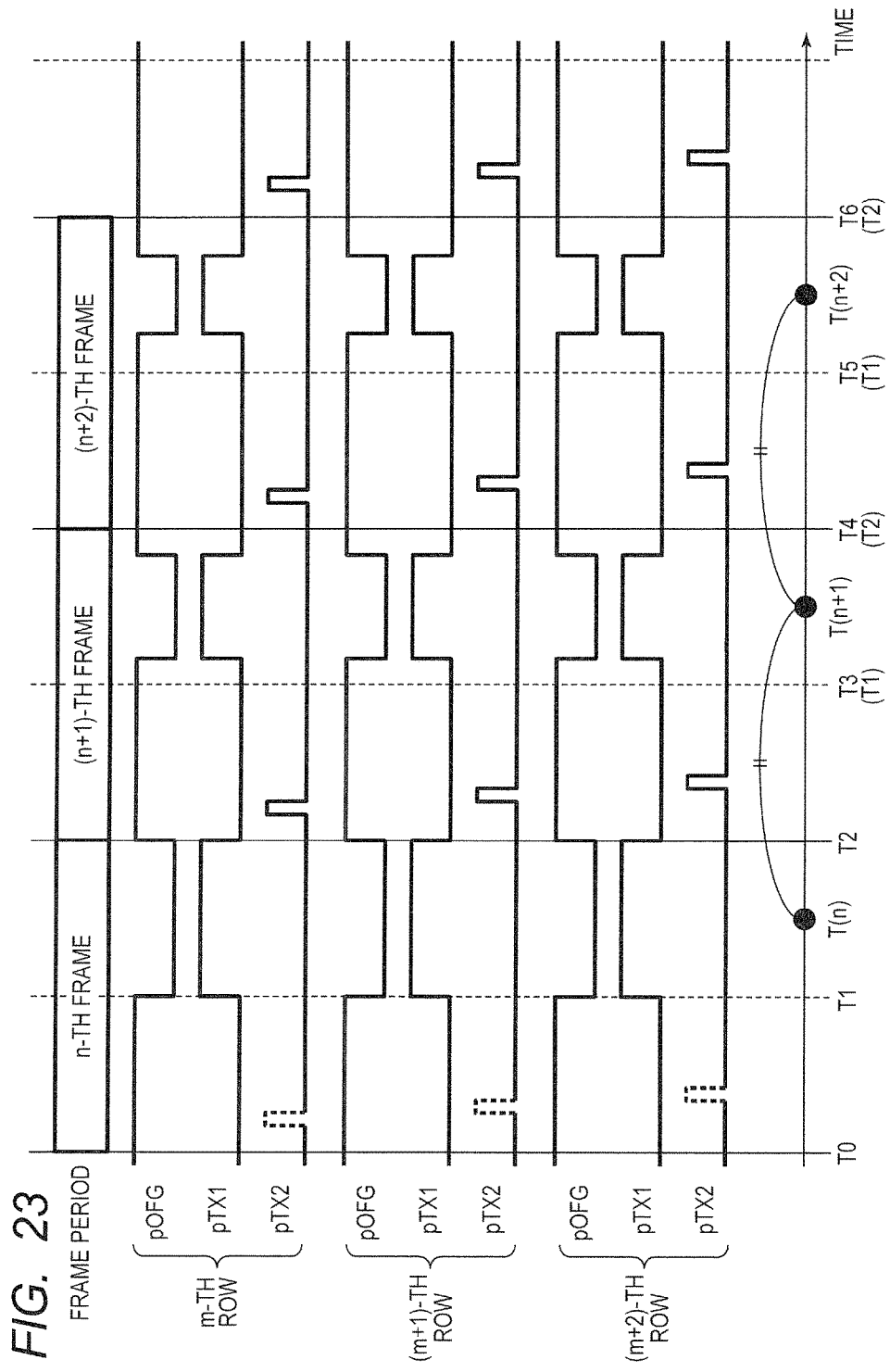
FIG. 23 is a timing diagram illustrating an operation timing of an imaging device according to an eighth embodiment of the present invention.
Figure 24:
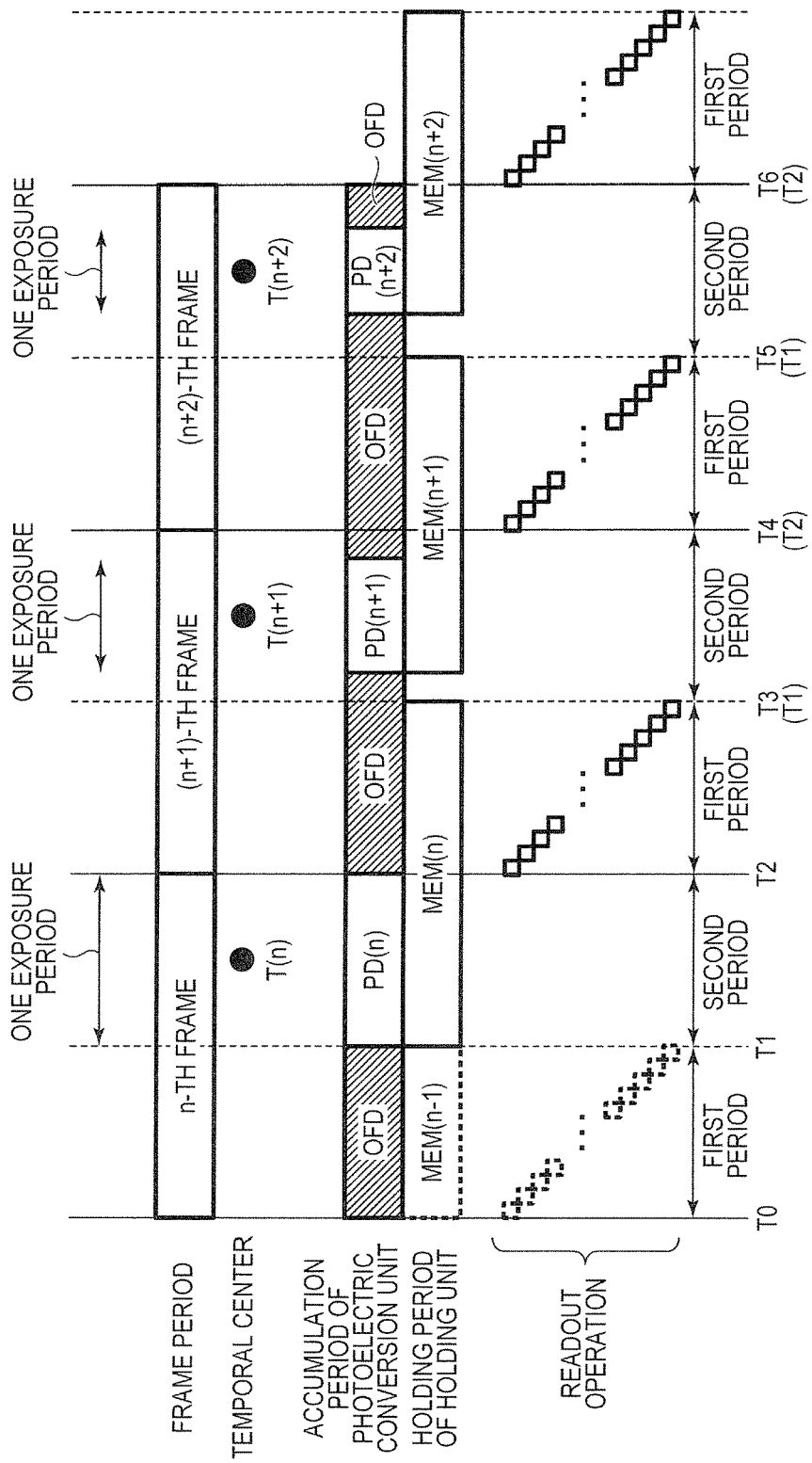
FIG. 24 is a schematic diagram illustrating a readout operation in each frame according to the eighth embodiment of the present invention.

An eighth embodiment of the present invention will be described with reference to FIGS. 23 and 24. In the present embodiment, the driving method of the first transfer transistors M1 is different from the sixth embodiment. The circuit configuration of the imaging device and the operation of the other transistors are the same as in the sixth embodiment, and the description of the common part will be omitted or simplified. FIG. 23 is a timing diagram illustrating an operation timing of the imaging device according to the eighth embodiment. FIG. 24 is a schematic diagram illustrating a readout operation in each frame according to the eighth embodiment.

The present embodiment is different from the sixth embodiment in that the control signals pTX1 are switched to the high level to turn on the first transfer transistors M1 at the start time of the exposure (time at which the control signals pOFG are switched to the low level). Subsequently, the first transfer transistors M1 are kept in on-state until the first transfer transistors M1 are turned off to end the exposure. The operation is performed at the same time for all pixels. As a result, the charge generated by the photoelectric conversion units D1 from just after the start of the exposure period is transferred to the holding units C1 just after the generation.

An effect of the present embodiment will be described. In the driving method of the present embodiment, the period that the holding units C1 hold the charge in each frame is different from the sixth embodiment. In the present embodiment, the charge generated by the photoelectric conversion units D1 from just after the start of the exposure period is transferred to the holding units C1 just after the generation. As a result, the saturation charge amount of the photoelectric conversion units D1 can be considered to be substantially sufficiently large, and an effect of improving the dynamic range can be obtained.

In addition to the effect described in the sixth embodiment, the dynamic range can be improved in the photographing of moving images by immediately transferring, to the holding units C1, the charge generated by the photoelectric conversion units D1 from just after the start of the exposure period in the present embodiment.

Ninth Embodiment

Figure 25:
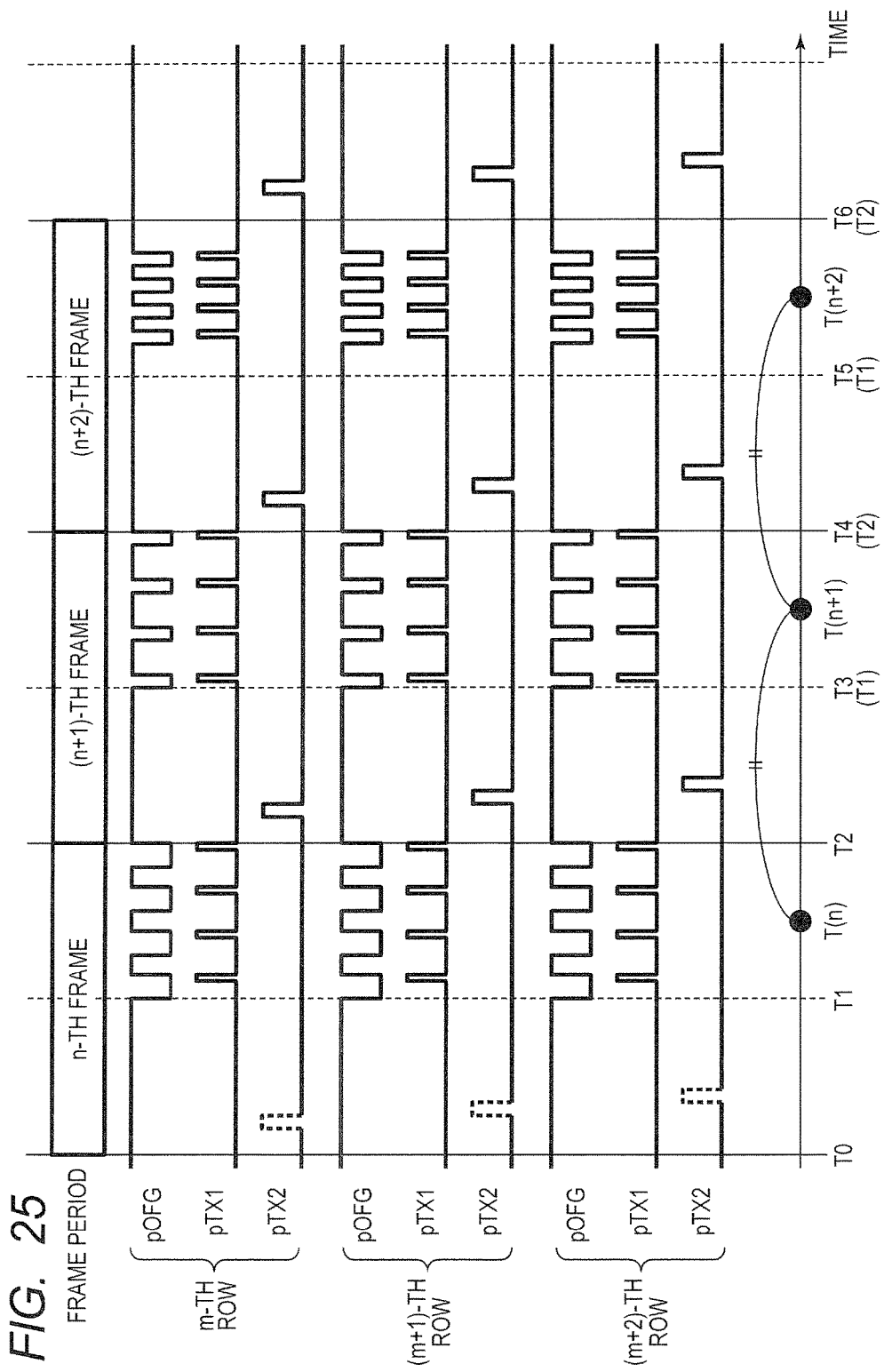
FIG. 25 is a timing diagram illustrating an operation timing of an imaging device according to a ninth embodiment of the present invention.
Figure 26:
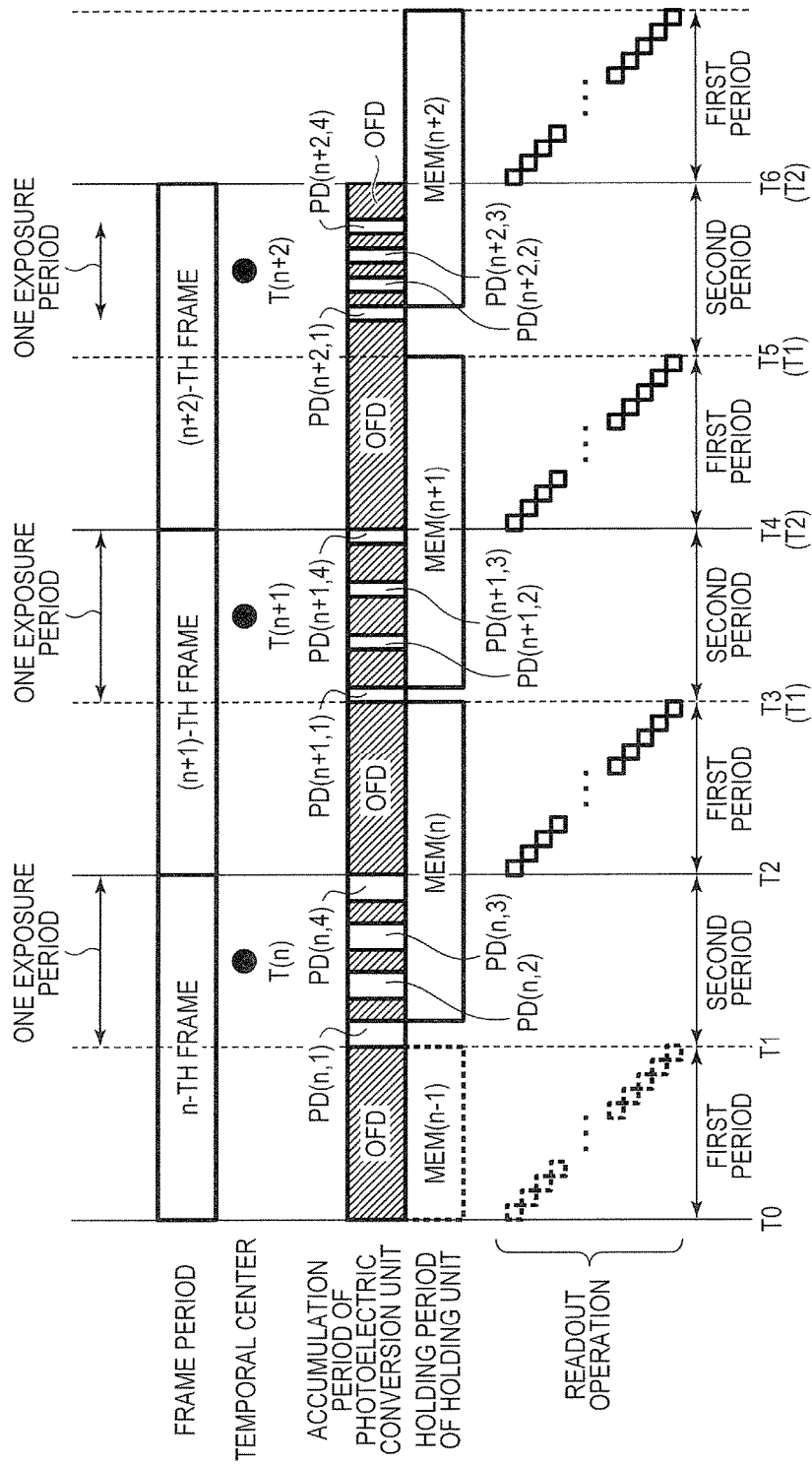
FIG. 26 is a schematic diagram illustrating a readout operation in each frame according to the ninth embodiment of the present invention.

A ninth embodiment of the present invention will be described with reference to FIGS. 25 and 26. In the present embodiment, the driving method of the first transfer transistors M1 and the overflow transistors M6 is different from the sixth embodiment. The circuit configuration of the imaging device and the operation of the other transistors are the same as in the sixth embodiment, and the description of the common part will be omitted or simplified. FIG. 25 is a timing diagram illustrating an operation timing of the imaging device according to the ninth embodiment. FIG. 26 is a schematic diagram illustrating a readout operation in each frame according to the ninth embodiment.

The ninth embodiment will be described with reference to the exposure period of the n-th frame. In the present embodiment, the operation from the exposure start operation to the exposure end operation as in the sixth embodiment is intermittently performed four times in the exposure period from the time T1 to the time T2. In other words, one exposure period is divided into a plurality of parts. This is the difference from the sixth embodiment in the present embodiment. More specifically, in the exposure period from the time T1 to the time T2, only the charge generated in the time period between the exposure start operation and the exposure end operation is transferred to the holding units C1, and the charge of the other periods is discharged to the overflow drains via the overflow transistors M6. The transfer and the discharge are intermittently repeated. In this way, the exposure is intermittently performed for a plurality of times in the present embodiment. Therefore, of the charge generated by the photoelectric conversion by the photoelectric conversion units D1, the charge contributing to the output signals is only the charge generated in part of the exposure period (will be called photoelectric conversion time).

In the present embodiment, the start time of the exposure is a time at which the control signals pOFG are first switched to the low level in a frame period, and the overflow transistors M6 are turned off at the same time in all pixels. The end time of the exposure is a time at which the control signals pTX1 are lastly switched to the low level, and the first transfer transistors M1 are turned off at the same time in all pixels.

Next, a method of reducing the photoelectric conversion time will be described with reference to the exposure period of the (n+1)-th frame. In the (n+1)-th frame, the period that the control signals pOFG are in the low level is shorter and the period that the control signals pOFG are in the high level is longer than in the exposure of the n-th frame. As a result, the time that the charge is discharged is long, and the photoelectric conversion time is short. Even in this case, the position of the temporal center T(n+1) with respect to the frame period coincides with the temporal center T(n). Therefore, as in the sixth embodiment, the intervals between the temporal centers of the exposure periods between adjacent frames all correspond to the length of one frame period and are constant values.

Next, another method of reducing the photoelectric conversion time will be described with reference to the exposure period of the (n+2)-th frame. In the (n+2)-th frame, both of the period that the control signals pOFG are in the low level and the period that the control signals pOFG are in the high level are shorter than in the exposure of the n-th frame. As a result, the exposure period is short. In this case, the position of the temporal center T(n+2) with respect to the frame period also coincides with the temporal center T(n).

An effect of the present embodiment will be described. When moving images including a high-luminance subject with a flickering phenomenon (flicker) are photographed, the image quality may be degraded in some frames due to a loss of signal charge. Examples of such a subject include a display using a cathode ray tube and a fluorescent lamp. A similar degradation may occur in a subject that emits light at a high luminance in a significantly short time, such as flash light. When the exposure period is reduced, the degradation of the image quality due to a loss of signal charge may be more prominent. In the driving method of the present embodiment, the accumulation and the transfer of the charge contributing to the output signals are intermittently performed. Therefore, the occurrence of the loss of signal charge in one frame can be reduced.

In addition to the effect described in the sixth embodiment, the accumulation and the transfer of the charge contributing to the output signals are intermittently performed, and the degradation in the image quality due to a loss of signal charge in the photographing of moving images can be reduced in the present embodiment.

Tenth Embodiment

Figure 27:
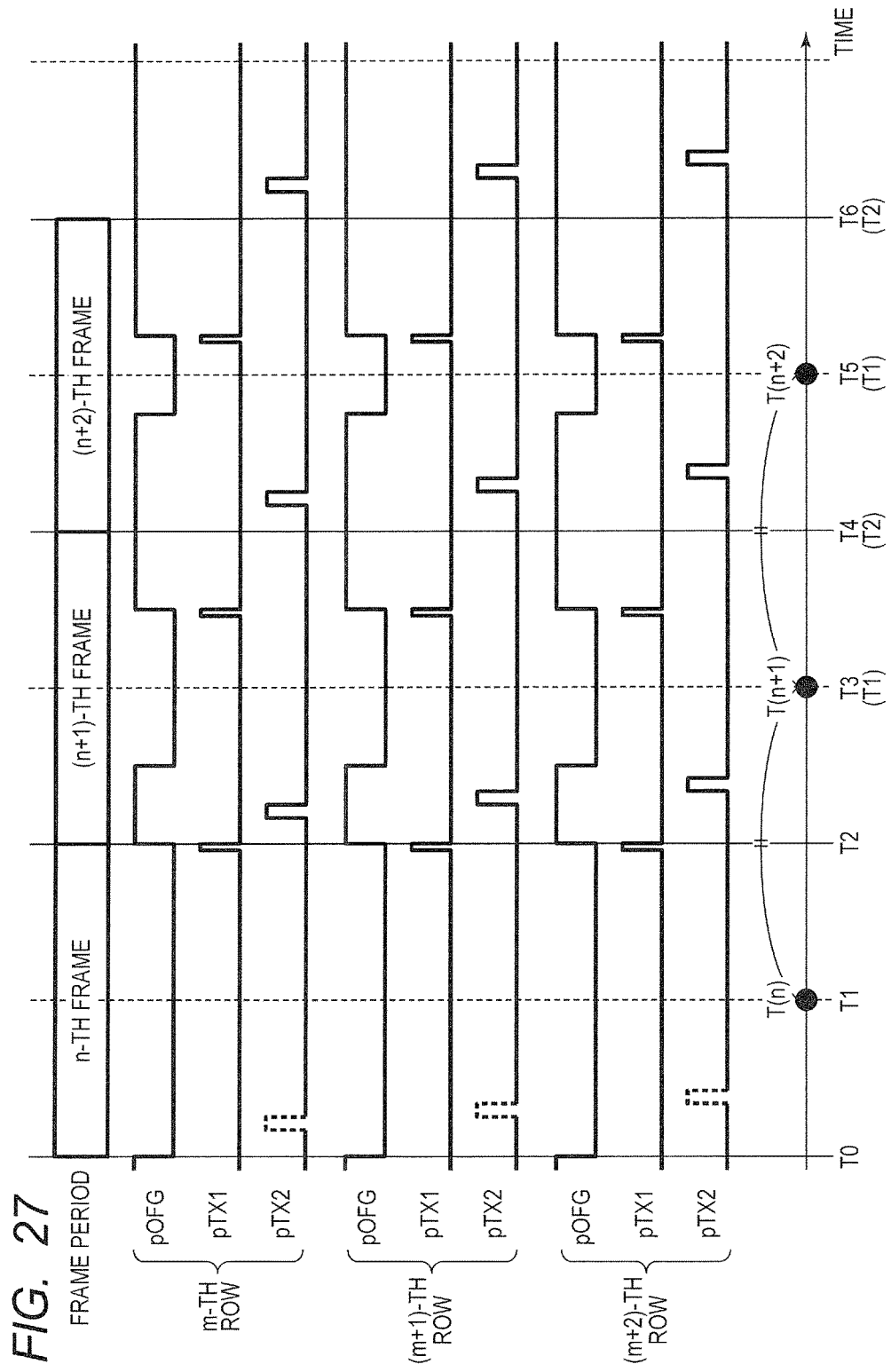
FIG. 27 is a timing diagram illustrating an operation timing of an imaging device according to a tenth embodiment of the present invention.
Figure 28:
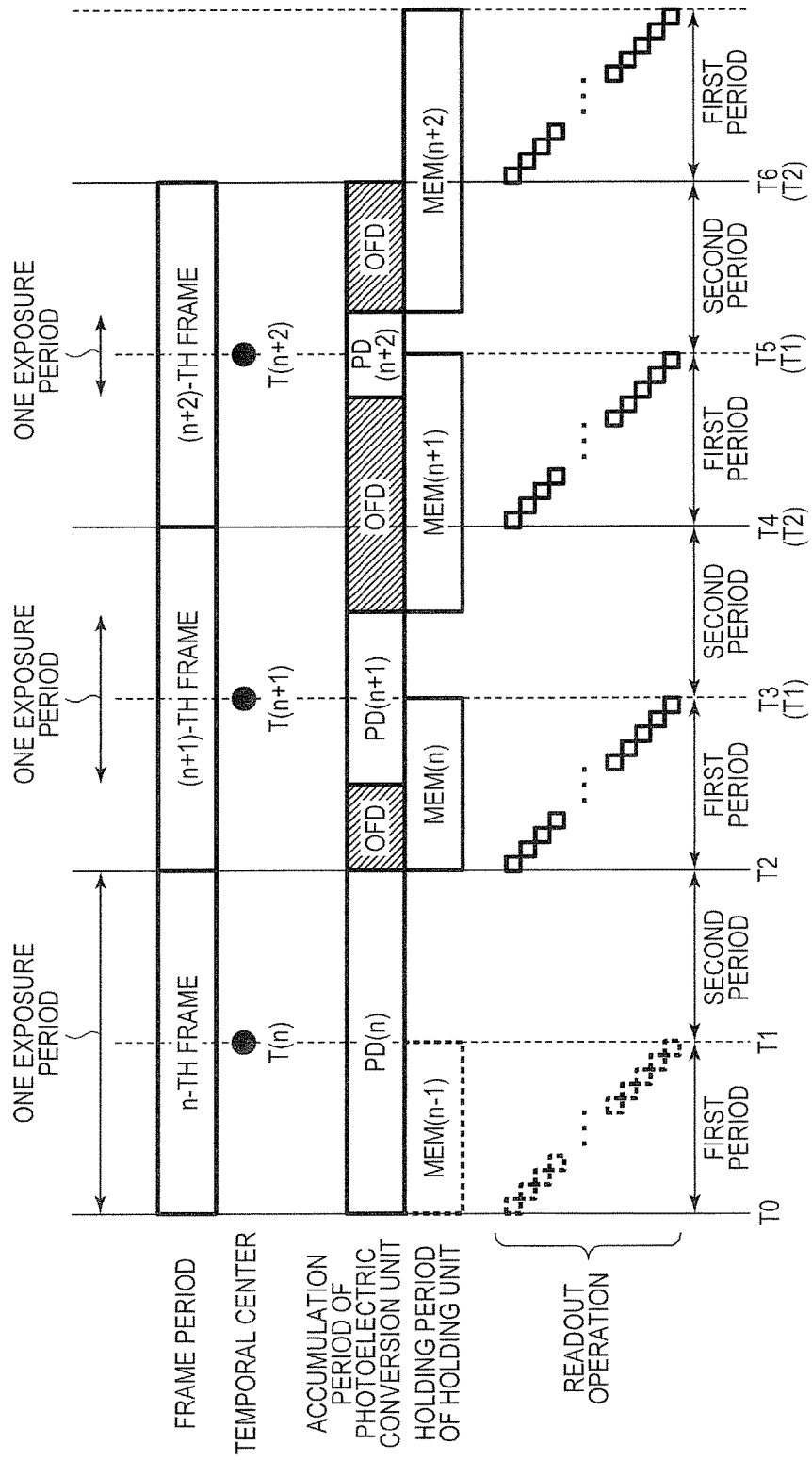
FIG. 28 is a schematic diagram illustrating a readout operation in each frame according to the tenth embodiment of the present invention.

A tenth embodiment of the present invention will be described with reference to FIGS. 27 and 28. In the present embodiment, the driving method of the first transfer transistors M1 and the overflow transistors M6 is different from the sixth embodiment. The circuit configuration of the imaging device and the operation of the other transistors are the same as in the sixth embodiment, and the description of the common part will be omitted or simplified. FIG. 27 is a timing diagram illustrating an operation timing of the imaging device according to the tenth embodiment. FIG. 28 is a schematic diagram illustrating a readout operation in each frame according to the tenth embodiment.

In the driving method of the sixth embodiment, the exposure period does not include the first period for reading out the charge by transferring the charge held by the holding units C1 in the previous frame to the floating diffusions C2. However, in a driving method of the present embodiment, the exposure period of the frame is started before the time T1 at which the operation of sequentially reading out the charge held by the holding units C1 in the previous frame is completed.

In a first period from time T0 to the time T1 of the n-th frame, the control signals pTX2 of the rows are sequentially switched to the high level. As a result, the charge accumulated in the previous frame ((n−1)-th frame not illustrated) of the n-th frame is sequentially transferred from the holding units C1 to the floating diffusions C2, and the signals are read out. In parallel with this, the control signals pOFG of the rows are switched to the low level at the time T0, and the overflow transistors M6 are turned off. The exposure period of the n-th frame is started as a result of the operation. The driving method can extend one exposure period to one frame period at most.

The (n+1)-th frame with an exposure period shorter than the n-th frame is set such that the positions of the temporal centers of the exposure periods are even with respect to the frame periods as in the sixth embodiment. More specifically, the temporal center T(n+1) in the exposure period of the (n+1)-th frame is set to a time one frame period after the temporal center T(n) in the exposure period of the n-th frame. As a result, the same effect as in the sixth embodiment can be obtained.

In addition to the effect described in the sixth embodiment, the exposure period of the frame is started before the time of the completion of the operation of sequentially reading out the charge held by the holding units C1 in the previous frame, and the exposure period can be longer in the present embodiment.

Eleventh Embodiment

An eleventh embodiment of the present invention will be described with reference to FIGS. 29 to 32. In the present embodiment, the driving method of the first transfer transistors M1 and the overflow transistors M6 is different from the sixth embodiment. The circuit configuration of the imaging device and the operation of the other transistors are the same as in the sixth embodiment, and the description of the common part will be omitted or simplified.

Figure 29:
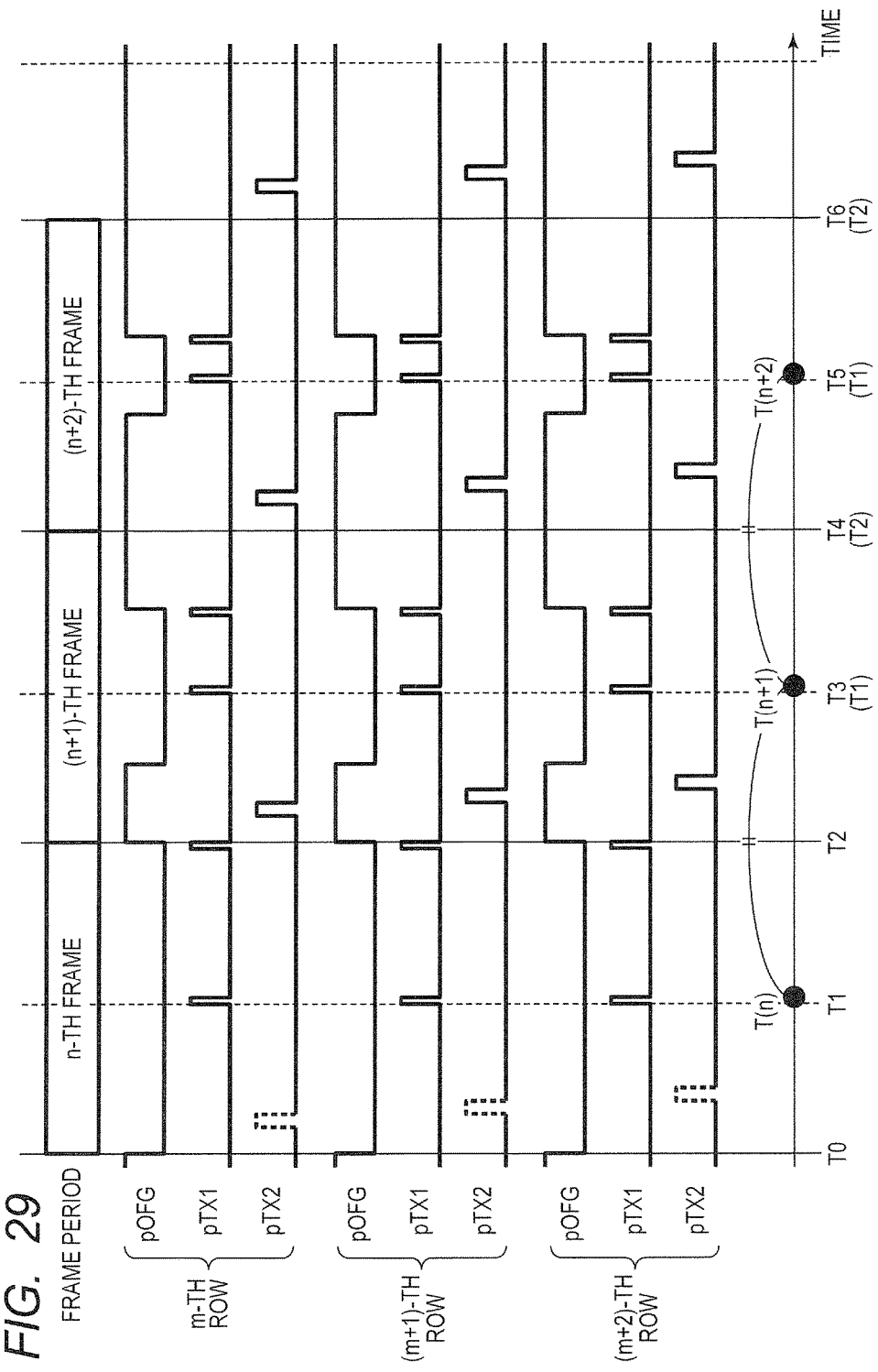
FIG. 29 is a timing diagram illustrating an operation timing of an imaging device according to an eleventh embodiment of the present invention.
Figure 30:
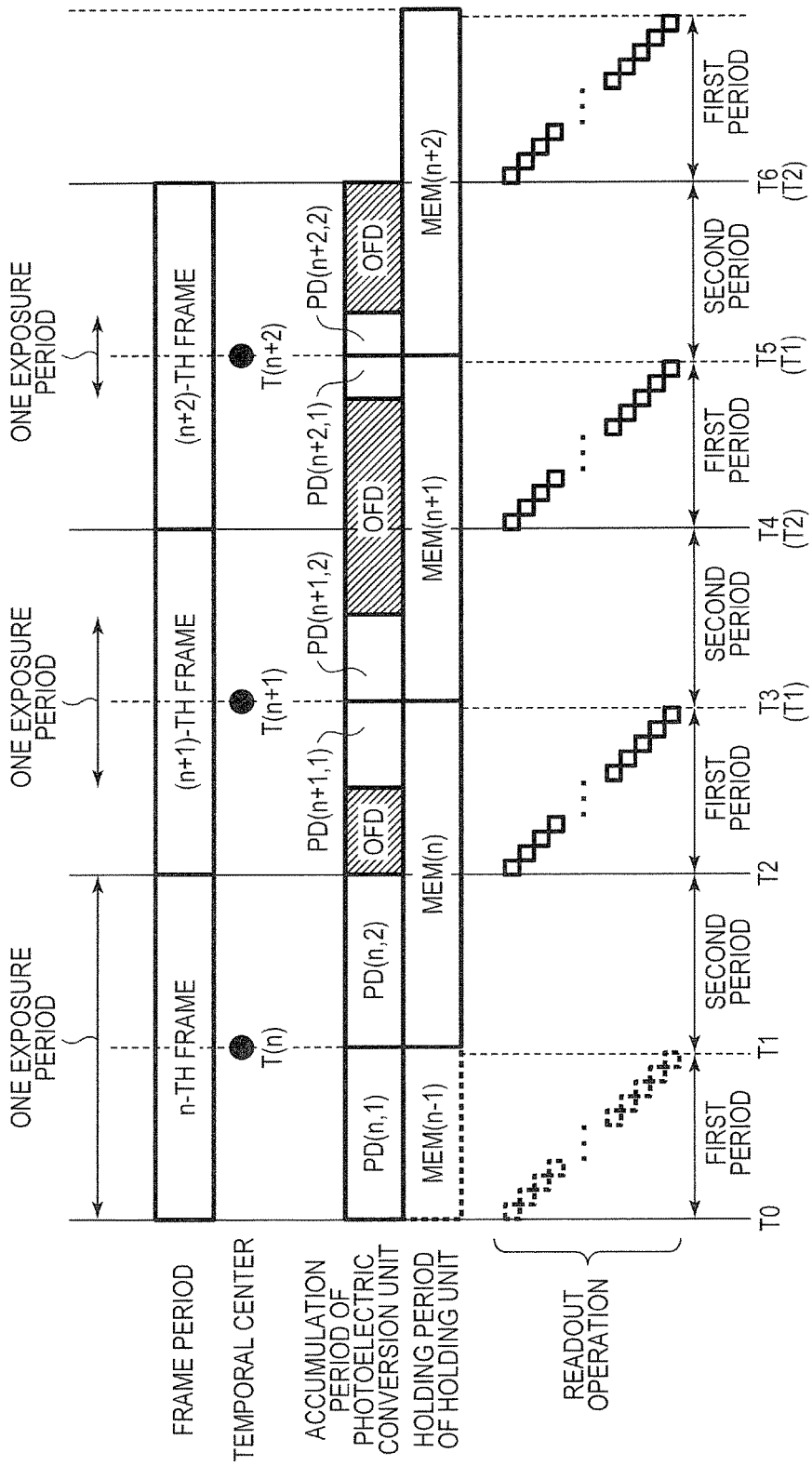
FIG. 30 is a schematic diagram illustrating a readout operation in each frame according to the eleventh embodiment of the present invention.

A driving method of the imaging device of the eleventh embodiment will be described with reference to FIGS. 29 and 30. FIG. 29 is a timing diagram illustrating an operation timing of the imaging device according to the eleventh embodiment. FIG. 30 is a schematic diagram illustrating a readout operation in each frame according to the eleventh embodiment.

In the present embodiment, the control signals pTX1 are once temporarily switched to the high level at a time near a middle point of the exposure period from the time T0 to the time T2, and the first transfer transistors M1 are temporarily turned on. As a result, all of the charge accumulated in the photoelectric conversion units D1 in the period from the time T0 until the control signals pTX1 are switched to the high level is transferred to the holding units C1. Subsequently, the control signals pTX1 are again switched to the low level to turn off the first transfer transistors M1, and the charge is accumulated again in the photoelectric conversion units D1. Therefore, in the present embodiment, the charge of the photoelectric conversion units D1 is transferred to the holding units C1 twice, at the time near the middle point of the exposure period and at the end time of the exposure, in one exposure period as in the seventh embodiment. In the present embodiment, the transfer from the photoelectric conversion units D1 to the holding units C1 at the time near the middle point of the exposure period is carried out after the time T1 at which the sequential reading of the charge held by the holding units C1 in the previous frame is completed.

An effect of the present embodiment will be described. In the present embodiment, the charge generated by the photoelectric conversion units D1 in one exposure period is transferred to the holding units C1 in two parts as in the seventh embodiment. Therefore, the amount of charge that can be accumulated in one exposure period can be twice the saturation charge amount of the photoelectric conversion units D1, and the saturation charge amount of the pixels 12 can be substantially increased. As a result, an effect of improving the dynamic range can be obtained. As in the tenth embodiment, the exposure period of the frame is started before the time of the completion of the operation of sequentially reading out the charge held by the holding units C1 in the previous frame, and the exposure period can be longer.

Figure 31:
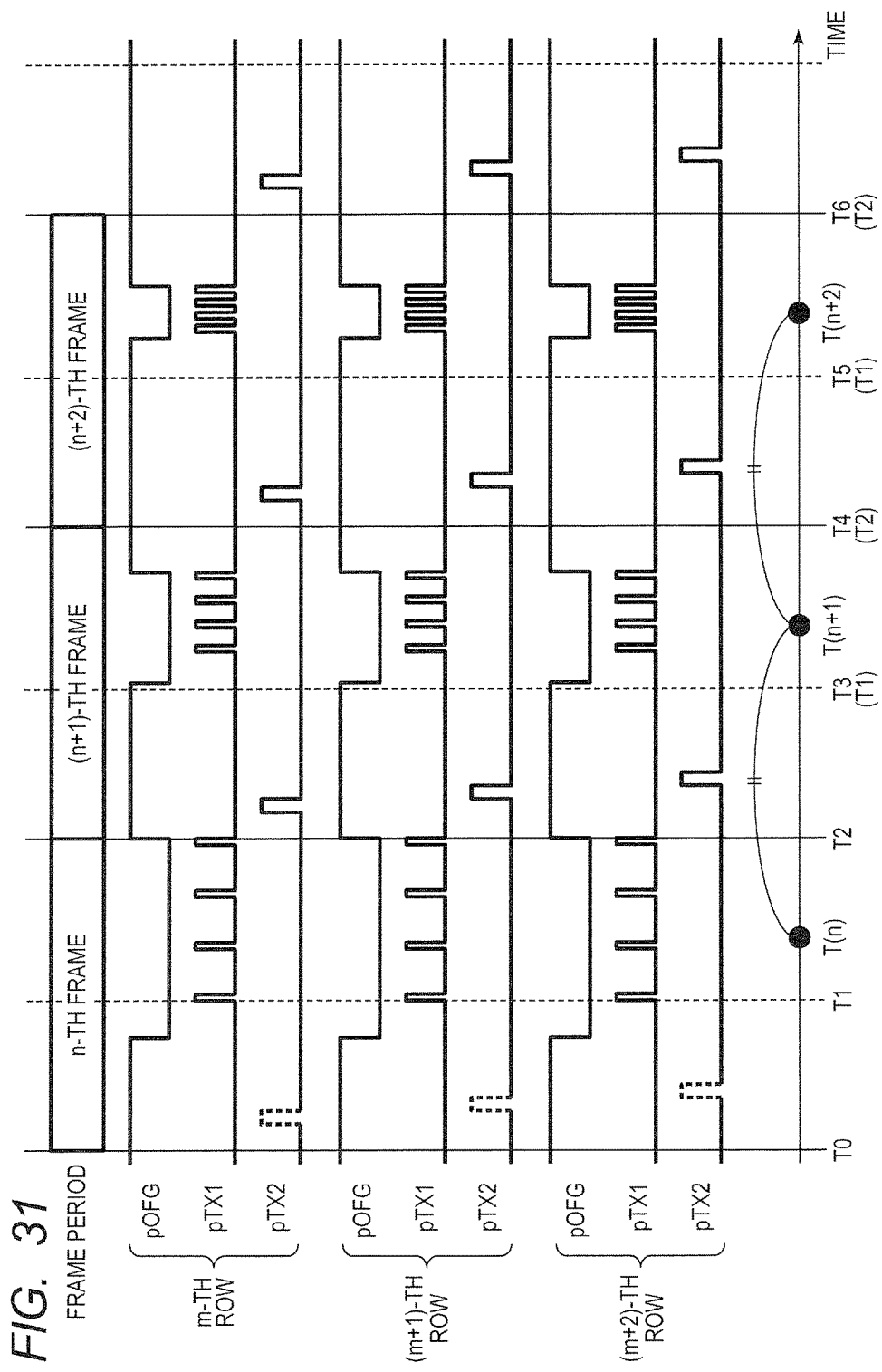
FIG. 31 is a timing diagram illustrating an operation timing of an imaging device according to a modified example of the eleventh embodiment of the present invention.
Figure 32:
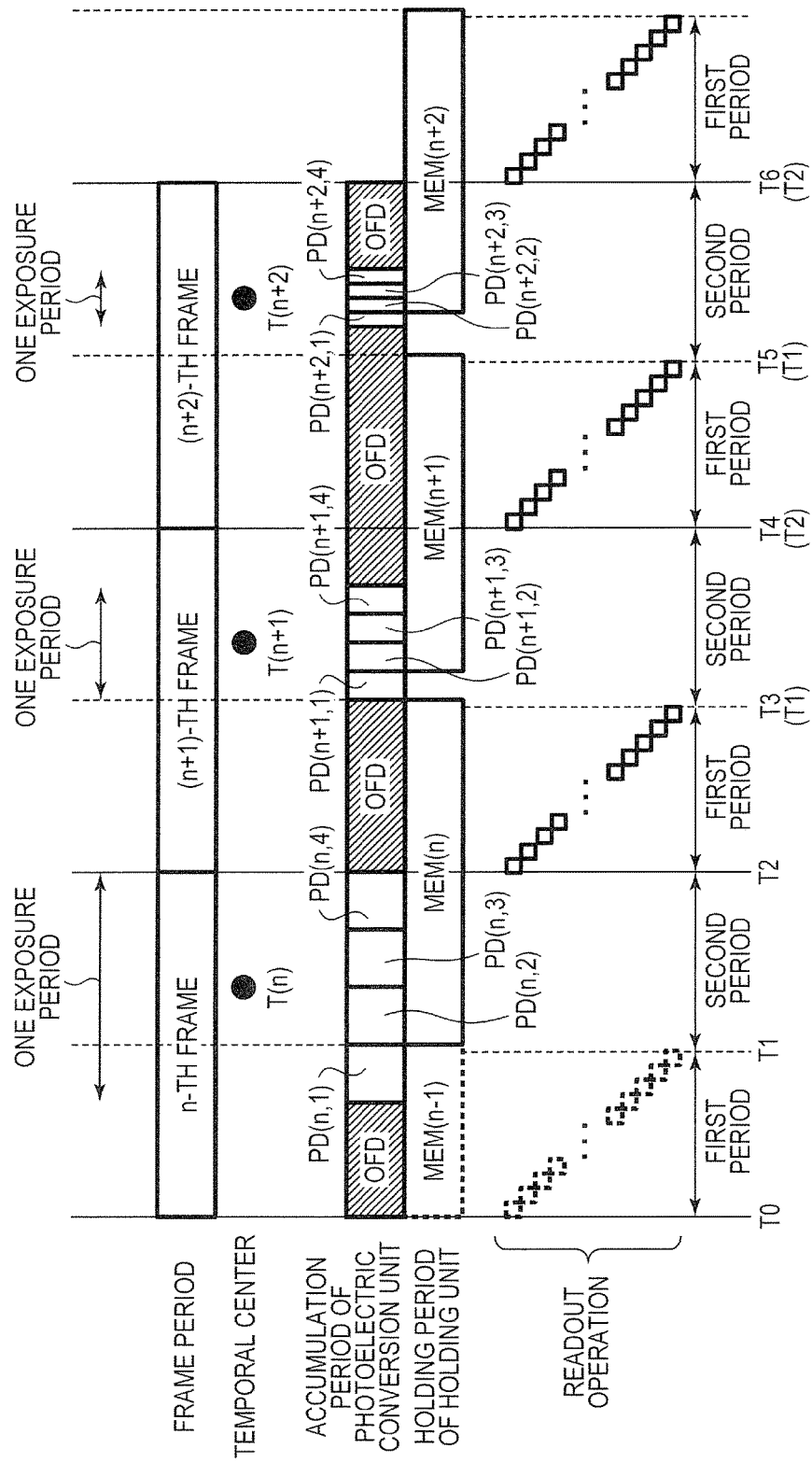
FIG. 32 is a schematic diagram illustrating a readout operation in each frame according to the modified example of the eleventh embodiment of the present invention.

Next, a modified example of the present embodiment will be described. FIG. 31 is a timing diagram illustrating an operation timing of the imaging device according to the modified example of the eleventh embodiment. FIG. 32 is a schematic diagram illustrating a readout operation in each frame according to the modified example of the eleventh embodiment. In the present modified example, the charge of the photoelectric conversion units D1 generated in one exposure period is transferred in four parts. In this case, the amount of charge that can be accumulated in one exposure period can be four times the saturation charge amount of the photoelectric conversion units D1, and the saturation charge amount of the pixels 12 can be substantially increased. In this way, the number of times of transfer is not limited to two in the present embodiment, and the number of times of transfer can be an arbitrary number equal to or greater than two. In the present modified example, the exposure of the frame is performed in parallel with the reading of the charge of the previous frame for the first transfer of the four times of transfer, as in the tenth embodiment. Therefore, the exposure period can be longer.

In addition to the effect described in the sixth embodiment, the charge generated in the photoelectric conversion units D1 in one exposure period is transferred to the holding units C1 in a plurality of parts, and the dynamic range can be improved in the photographing of moving images in the present embodiment. In the present embodiment, the exposure period of the frame is started before the time of the completion of the operation of sequentially reading out the charge held by the holding units C1 in the previous frame, and the exposure period can be longer.

Twelfth Embodiment

Figure 33:
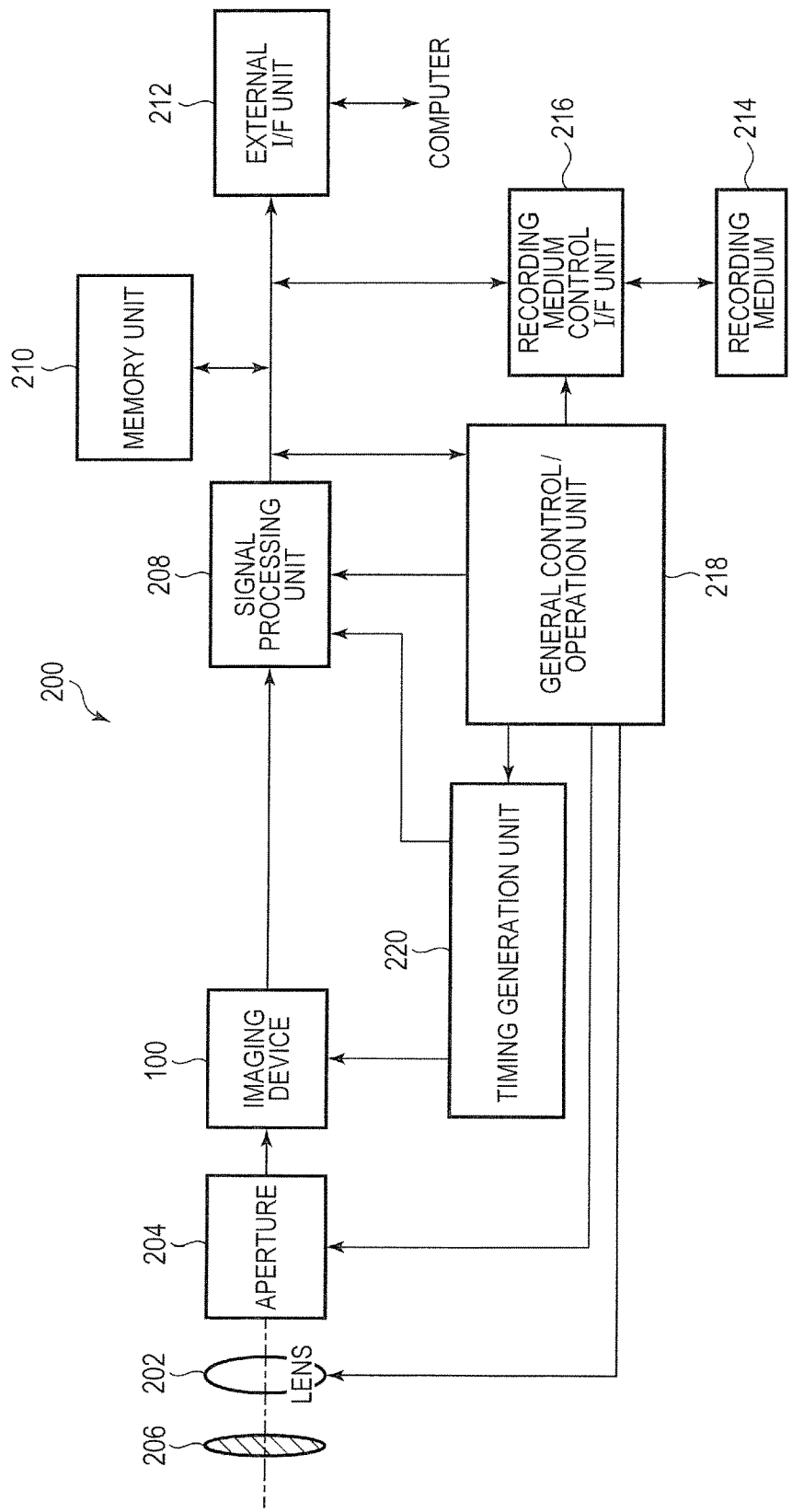
FIG. 33 is a block diagram illustrating a configuration of an imaging system according to a twelfth embodiment of the present invention.

An imaging system according to a twelfth embodiment of the present invention will be described with reference to FIG. 33. The same reference signs are provided to the same constituent elements as in the imaging devices according to the first to eleventh embodiments illustrated in FIGS. 1 to 32, and the description will be omitted or simplified. FIG. 33 is a block diagram illustrating a configuration of the imaging system according to the present embodiment.

The imaging device 100 described in the first to eleventh embodiments can be applied to various imaging systems. Examples of the imaging systems that can be applied include a digital still camera, a digital camcorder, a surveillance camera, a copier, a facsimile, a mobile phone, an on-vehicle camera and an observation satellite. A camera module provided with an optical system, such as a lens, and an imaging device is also included in the imaging systems. FIG. 33 illustrates a block diagram of a digital still camera as one of the examples.

An imaging system 200 illustrated in FIG. 33 includes the imaging device 100, a lens 202 for causing the imaging device 100 to form an optical image of a subject, an aperture 204 for changing the amount of light passing through the lens 202, and a barrier 206 for protecting the lens 202. The lens 202 and the aperture 204 are optical systems that concentrate the light on the imaging device 100. The imaging device 100 is the imaging device 100 described in the first to eleventh embodiments and is configured to convert the optical image formed by the lens 202 to image data.

The imaging system 200 further includes a signal processing unit 208 that processes an output signal output by the imaging device 100. The signal processing unit 208 performs AD conversion for converting an analog signal output by the imaging device 100 to a digital signal. The signal processing unit 208 also performs an operation of performing various corrections and compressions as necessary to output image data. An AD conversion unit as part of the signal processing unit 208 may be formed on a semiconductor substrate provided with the imaging device 100 or may be formed on a semiconductor substrate separate from the imaging device 100. The imaging device 100 and the signal processing unit 208 may be formed on the same semiconductor substrate.

The imaging system 200 further includes a memory unit 210 that temporarily stores image data, and an external interface unit (external I/F unit) 212 that communicates with an external computer and the like. The imaging system 200 further includes a recording medium 214, such as a semiconductor memory, that records or reads out imaging data, and a recording medium control interface unit (recording medium control I/F unit) 216 that records or reads out data from the recording medium 214. The recording medium 214 may be embedded in the imaging system 200 or may be removable.

The imaging system 200 further includes a general control/operation unit 218 that controls various operations and the entire digital still camera, and a timing generation unit 220 that outputs various timing signals to the imaging device 100 and the signal processing unit 208. The timing signal and the like may be input from the outside, and the imaging system 200 may include at least the imaging device 100 and the signal processing unit 208 that processes an output signal output from the imaging device 100.

The imaging device 100 outputs a signal for image to the signal processing unit 208. The signal processing unit 208 applies predetermined signal processing to the signal for image output from the imaging device 100 and outputs image data. The imaging device 100 of the fifth embodiment also outputs a signal for focus detection to the signal processing unit 208 in addition to the signal for image. The signal processing unit 208 uses the signal for focus detection to detect whether the subject is focused. The signal processing unit 208 uses the signal for image to generate an image. If the signal processing unit 208 detects that the subject is not focused, the general control/operation unit 218 drives the optical system in a direction for focusing the subject. The signal processing unit 208 again uses the signal for focus detection output from the imaging device 100 to detect whether the subject is focused. The imaging device 100, the digital processing unit 208 and the general control/operation unit 218 repeat the operation until the subject is focused.

To acquire a wide dynamic range image, the general control/operation unit 218 executes a process of combining image data based on short-second accumulated signals and image data based on long-second accumulated signals.

The imaging device 100 according to the first to fifth embodiments can be applied to realize an imaging system that can acquire a wide dynamic range image with a little offset of subject and without blocked up shadows or blown out highlights. An imaging system capable of high-speed focus detection operation can also be realized. The imaging device 100 according to the sixth to eleventh embodiments can be applied to realize an imaging system capable of photographing moving images with excellent image quality even when the exposure time is changed for each frame in imaging using a global electronic shutter.

Other Embodiments

Various modifications can be made for the present invention regardless of the above-described embodiments. For example, an embodiment adding the configuration of part of one of the embodiments to another embodiment or an embodiment replacing the configuration of part of another embodiment should also be understood as embodiments in which the present invention can be applied.

Although the example of the imaging device using the photoelectric conversion units D1 that generate electrons as signal charge is described in the embodiments, an imaging device using the photoelectric conversion units D1 that generate holes as signal charge can be similarly applied. In this case, the conductivity type of the transistors included in the pixels 12 is a reverse conductivity type. The sources and the drains of the transistors described in the embodiments may be called differently according to the conductivity type of the transistors or the focused function, and all or part of the sources and the drains may be called by opposite names.

In the second and third embodiments, the start time of the first exposure period is controlled by the drive timing of the overflow transistors M6. However, the start time of the first exposure period does not have to be controlled by the drive timing of the overflow transistors M6 in photographing of still images, for example. The accumulated charge of the previous frame does not have to be held by the holding units C1 in the photographing of still images, and the reset transistors M3 can initialize the photoelectric conversion units D1 through the holding units C1 and C2.

Although the signal for focus detection is acquired prior to the acquisition of the imaging signal in the fifth embodiment, the signal for focus detection does not have to be acquired prior to the acquisition of the imaging signal.

Although the pixel 12 includes two photoelectric conversion units D1A and D1B in the description of the fifth embodiment, the number of photoelectric conversion units D1 included in one pixel 12 may be two or more. One pixel 12 does not have to be provided with a plurality of photoelectric conversion units D1, and a light shielding film covering the photoelectric conversion unit D1 may receive light of a pupil area that varies between the pixels 12.

The overflow transistors described in the second to fourth embodiments may be added to the pixels 12 of the imaging device of the fifth embodiment.

The imaging system illustrated in the twelfth embodiment is an example of the imaging system that can apply the imaging device of the present invention, and the imaging system that can apply the imaging device of the present invention is not limited to the configuration illustrated in FIG. 33.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-179224, filed Sep. 11, 2015, and Japanese Patent Application No. 2015-179221, filed Sep. 11, 2015, which are hereby incorporated by reference herein in their entirety.

What is claimed is:

1. An imaging device comprising:
a plurality of pixels, each of the plurality of pixels including
a photoelectric conversion unit that generates a charge by photoelectric conversion;
a holding unit that holds the charge transferred from the photoelectric conversion unit to the holding unit; and
an amplifier unit that outputs a signal based on the charge transferred from the holding unit to the amplifier unit,
wherein:
the plurality of pixels is configured to output a first signal based on a charge generated in a first exposure period and a second signal based on a charge generated in a second exposure period with a length different from the first exposure period,
in the first exposure period, the photoelectric conversion unit accumulates the generated charge, and the charge held by the holding unit is transferred from the holding unit to the amplifier unit to read out the second signal,
the second exposure period includes a period of accumulating the generated charge only in the photoelectric conversion unit and a period of holding the generated charge in the photoelectric conversion unit and the holding unit, and
in the period of accumulating the generated charge only in the photoelectric conversion unit in the second exposure period, the charge held by the holding unit is transferred from the holding unit to the amplifier unit to read out the first signal.

2. The imaging device according to claim 1, wherein the charge generated in the second exposure period is intermittently transferred from the photoelectric conversion unit to the holding unit.

3. The imaging device according to claim 1, wherein the second exposure period is longer than the first exposure period.

4. The imaging device according to claim 1, wherein the first exposure period and the second exposure period coincide in the plurality of pixels.

5. The imaging device according to claim 1, wherein a start time of one frame period and a start time of the first exposure period are different.

6. The imaging device according to claim 1, wherein a wide dynamic range image is acquired from a first image based on the first signal and a second image based on the second signal.

7. An imaging system comprising:
an imaging device; and
a signal processing unit that processes a signal output from the imaging device,
wherein the imaging device includes a plurality of pixels, each of the plurality of pixels including:
a photoelectric conversion unit that generates a charge by photoelectric conversion;
a holding unit that holds the charge transferred from the photoelectric conversion unit to the holding unit; and
an amplifier unit that outputs a signal based on the charge transferred from the holding unit to the amplifier unit,
wherein:
the plurality of pixels is configured to output a first signal based on a charge generated in a first exposure period and a second signal based on a charge generated in a second exposure period with a length different from the first exposure period, in the first exposure period, the photoelectric conversion unit accumulates the generated charge, and the charge held by the holding unit is transferred from the holding unit to the amplifier unit to read out the second signal, the second exposure period includes a period of accumulating the generated charge only in the photoelectric conversion unit and a period of holding the generated charge in the photoelectric conversion unit and the holding unit, and in the period of accumulating the generated charge only in the photoelectric conversion unit in the second exposure period, the charge held by the holding unit is transferred from the holding unit to the amplifier unit to read out the first signal.

8. The imaging system according to claim 7, wherein the signal processing unit acquires a wide dynamic range image from a first image based on the first signal and a second image based on the second signal.

9. The imaging system according to claim 7, wherein the signal processing unit generates a signal for focus detection based on the first signal and generates a signal for image based on the second signal.

\* \* \* \* \*